US012775762B2

(12) United States Patent
Oriordan et al.

(10) Patent No.: US 12,775,762 B2
(45) Date of Patent: Oct. 27, 2026

(54) INTERACTIVE COMPACTION TOOL FOR ELECTRONIC DESIGN AUTOMATION

(71) Applicant: D2S, Inc., San Jose, CA (US)

(72) Inventors: Donald Oriordan, Sunnyvale, CA (US); Akira Fujimura, Saratoga, CA (US); George Janac, Saratoga, CA (US)

(73) Assignee: D2S, INC., San Jose, CA (US)

( * ) Notice: Subject to any disclaimer, the term of this patent is extended or adjusted under 35 U.S.C. 154(b) by 649 days.

(21) Appl. No.: 17/992,876

(22) Filed: Nov. 22, 2022

(65) Prior Publication Data

US 2023/0169246 A1 Jun. 1, 2023

Related U.S. Application Data

(60) Provisional application No. 63/576,439, filed on Nov. 8, 2022, provisional application No. 63/283,520, filed on Nov. 28, 2021.

(51) Int. Cl.

| | |
|---|---|
| ***G06F 30/31*** | (2020.01) |
| ***G06F 30/392*** | (2020.01) |
| ***G06F 30/398*** | (2020.01) |
| ***G06N 3/08*** | (2023.01) |

(52) U.S. Cl.

CPC ............ *G06F 30/31* (2020.01); *G06F 30/392* (2020.01); *G06F 30/398* (2020.01); *G06N 3/08* (2013.01)

(58) Field of Classification Search

CPC ....................................................... G06F 30/31
USPC .......................................................... 716/139
See application file for complete search history.

(56) References Cited

U.S. PATENT DOCUMENTS

| | | | |
|---|---|---|---|
| 5,079,717 | A | 1/1992 | Miwa |
| 6,510,730 | B1 | 1/2003 | Phan et al. |
| 7,269,817 | B2 | 9/2007 | Heng et al. |
| 7,313,769 | B1 | 12/2007 | Lukanc et al. |
| 7,526,748 | B2 | 4/2009 | Kotani et al. |
| 7,754,401 | B2 | 7/2010 | Fujimura et al. |

(Continued)

FOREIGN PATENT DOCUMENTS

| | | | |
|---|---|---|---|
| CN | 107438842 | A | 12/2017 |
| CN | 111758072 | A | 10/2020 |

(Continued)

OTHER PUBLICATIONS

Jhaveri, Tejas K., et al., "Maximization of layout printability/manufacturability by extreme layout regularity," Journal of Micro/Nanolithography, MEMS, and MOEMS, Jul. 1, 2007, 3 pages, vol. 6, Issue 3, SPIE.

(Continued)

*Primary Examiner* — Eric D Lee
(74) *Attorney, Agent, or Firm* — ADELI LLP

(57) ABSTRACT

A method for manufacturing-aware editing of circuit layouts driven by predictions regarding predicted manufactured wafer contours generated by a machine-trained network. The method allows for fast edit loops in interactive editing timeframes, in which the predicted manufactured wafer contours corresponding to design edits are presented within seconds of the edits themselves. In some embodiments, the wafer contours take mask OPC/ILT and lithography effects into account, as determined by the machine trained network.

20 Claims, 53 Drawing Sheets

(56) References Cited

U.S. PATENT DOCUMENTS

| | | | | |
|---|---|---|---|---|
| 8,286,119 | B2 | 10/2012 | Hsu et al. | |
| 8,473,875 | B2 | 6/2013 | Fujimura et al. | |
| 8,510,699 | B1 | 8/2013 | Acar et al. | |
| 8,818,072 | B2 | 8/2014 | Ong et al. | |
| 9,754,878 | B2 | 9/2017 | Kornachuk et al. | |
| 9,922,161 | B2 | 3/2018 | Kahng et al. | |
| 10,012,900 | B2 | 7/2018 | Kim et al. | |
| 10,310,371 | B2 | 6/2019 | Ye et al. | |
| 10,346,740 | B2 | 7/2019 | Zhang et al. | |
| 10,444,629 | B2 | 10/2019 | Zable | |
| 10,520,830 | B2 | 12/2019 | Kicken et al. | |
| 10,534,257 | B2 | 1/2020 | Tetiker et al. | |
| 10,670,973 | B2 | 6/2020 | Zou et al. | |
| 10,678,142 | B2 | 6/2020 | Jheng et al. | |
| 10,796,068 | B2 | 10/2020 | Kwon et al. | |
| 10,923,318 | B2 | 2/2021 | Gledhill et al. | |
| 10,949,595 | B2 | 3/2021 | Tsutsui et al. | |
| 11,043,359 | B2 | 6/2021 | Nakamura et al. | |
| 11,204,897 | B2 | 12/2021 | Tien et al. | |
| 2002/0002697 | A1 | 1/2002 | Kotani et al. | |
| 2004/0015794 | A1 | 1/2004 | Kotani et al. | |
| 2004/0210863 | A1 | 10/2004 | Culp et al. | |
| 2005/0132306 | A1 | 6/2005 | Smith et al. | |
| 2005/0251771 | A1 | 11/2005 | Robles | |
| 2006/0190911 | A1 | 8/2006 | Stivers | |
| 2007/0143234 | A1 | 6/2007 | Huang et al. | |
| 2008/0109766 | A1 | 5/2008 | Song et al. | |
| 2008/0127027 | A1 | 5/2008 | Gallatin et al. | |
| 2008/0134109 | A1* | 6/2008 | Hammouda | G06F 30/36 716/113 |
| 2009/0193369 | A1 | 7/2009 | Chan et al. | |
| 2009/0202139 | A1* | 8/2009 | Toyoda | G06T 7/001 382/145 |
| 2010/0035168 | A1 | 2/2010 | Nakajima et al. | |
| 2011/0049635 | A1 | 3/2011 | Carlson | |
| 2011/0089345 | A1 | 4/2011 | Komagata et al. | |
| 2012/0094219 | A1 | 4/2012 | Fujimura et al. | |
| 2012/0151422 | A1 | 6/2012 | White et al. | |
| 2013/0022929 | A1 | 1/2013 | Komagata et al. | |
| 2013/0074024 | A1 | 3/2013 | Chase et al. | |
| 2013/0159943 | A1 | 6/2013 | Agarwal et al. | |
| 2013/0283216 | A1 | 10/2013 | Pearman et al. | |
| 2013/0283218 | A1 | 10/2013 | Fujimura et al. | |
| 2015/0067618 | A1 | 3/2015 | Robles | |
| 2016/0125120 | A1 | 5/2016 | Yu et al. | |
| 2016/0239601 | A1 | 8/2016 | Morisaki et al. | |
| 2017/0194126 | A1 | 7/2017 | Bhaskar et al. | |
| 2017/0357911 | A1 | 12/2017 | Liu et al. | |
| 2018/0067900 | A1 | 3/2018 | Mos et al. | |
| 2018/0314783 | A1 | 11/2018 | Moroz | |
| 2018/0322234 | A1 | 11/2018 | Cao et al. | |
| 2019/0072846 | A1 | 3/2019 | Lin et al. | |
| 2019/0146355 | A1 | 5/2019 | Jheng et al. | |
| 2019/0147134 | A1 | 5/2019 | Wang et al. | |
| 2019/0188356 | A1 | 6/2019 | Zhang et al. | |
| 2019/0197213 | A1 | 6/2019 | Ungar | |
| 2019/0206041 | A1 | 7/2019 | Fang et al. | |
| 2019/0377849 | A1 | 12/2019 | Sha et al. | |
| 2019/0385300 | A1 | 12/2019 | Baidya et al. | |
| 2020/0006102 | A1 | 1/2020 | Lin et al. | |
| 2020/0026819 | A1 | 1/2020 | Leu et al. | |
| 2020/0051781 | A1 | 2/2020 | Fujimura et al. | |
| 2020/0065453 | A1 | 2/2020 | Kim et al. | |
| 2020/0133117 | A1 | 4/2020 | Chu et al. | |
| 2020/0134131 | A1 | 4/2020 | Tien et al. | |
| 2020/0184137 | A1 | 6/2020 | Tsutsui et al. | |
| 2020/0364394 | A1 | 11/2020 | Yu et al. | |
| 2020/0380089 | A1 | 12/2020 | Gheith et al. | |
| 2020/0380362 | A1 | 12/2020 | Cao et al. | |
| 2020/0387660 | A1 | 12/2020 | Cecil | |
| 2021/0048741 | A1 | 2/2021 | Lugg et al. | |
| 2021/0181620 | A1 | 6/2021 | Poonawala et al. | |
| 2021/0216697 | A1 | 7/2021 | Brink et al. | |
| 2021/0279878 | A1 | 9/2021 | Adler et al. | |
| 2021/0397172 | A1 | 12/2021 | Slachter et al. | |
| 2022/0035237 | A1 | 2/2022 | Lee et al. | |
| 2022/0050381 | A1 | 2/2022 | Biswas et al. | |
| 2022/0128899 | A1 | 4/2022 | Fujimura et al. | |
| 2022/0187713 | A1 | 6/2022 | Middlebrooks et al. | |
| 2022/0299881 | A1 | 9/2022 | Zheng et al. | |
| 2023/0024684 | A1 | 1/2023 | Fujimura et al. | |
| 2023/0027655 | A1 | 1/2023 | Fujimura et al. | |
| 2023/0032510 | A1 | 2/2023 | Fujimura et al. | |
| 2023/0092665 | A1 | 3/2023 | Fujimura et al. | |
| 2023/0107556 | A1 | 4/2023 | Tao et al. | |
| 2023/0168660 | A1 | 6/2023 | Oriordan et al. | |
| 2023/0169245 | A1 | 6/2023 | Oriordan et al. | |
| 2023/0169247 | A1 | 6/2023 | Oriordan et al. | |
| 2023/0186009 | A1 | 6/2023 | Fujimura et al. | |
| 2023/0205972 | A1 | 6/2023 | Oriordan et al. | |
| 2023/0229836 | A1 | 7/2023 | Oriordan et al. | |
| 2023/0229840 | A1 | 7/2023 | Oriordan et al. | |
| 2023/0229844 | A1 | 7/2023 | Oriordan et al. | |
| 2023/0267265 | A1 | 8/2023 | Oriordan | |
| 2023/0274065 | A1 | 8/2023 | Fujimura | |
| 2023/0274066 | A1 | 8/2023 | Fujimura | |
| 2023/0274067 | A1 | 8/2023 | Fujimura | |
| 2023/0274068 | A1 | 8/2023 | Fujimura | |
| 2023/0274069 | A1 | 8/2023 | Fujimura | |
| 2023/0274070 | A1 | 8/2023 | Fujimura | |
| 2023/0274071 | A1 | 8/2023 | Fujimura | |
| 2023/0281374 | A1 | 9/2023 | Fujimura | |
| 2023/0282635 | A1 | 9/2023 | Fujimura | |
| 2023/0306177 | A1 | 9/2023 | Fujimura | |
| 2023/0351087 | A1 | 11/2023 | Oriordan et al. | |
| 2023/0351088 | A1 | 11/2023 | Oriordan et al. | |
| 2023/0351089 | A1 | 11/2023 | Oriordan et al. | |
| 2023/0359804 | A1 | 11/2023 | Oriordan | |
| 2024/0288764 | A1* | 8/2024 | Hamouda | G03F 7/70441 |

FOREIGN PATENT DOCUMENTS

| | | | |
|---|---|---|---|
| CN | 113168085 | A | 7/2021 |
| CN | 113168115 | A | 7/2021 |
| EP | 3951496 | A1 | 2/2022 |
| JP | 2007536581 | A | 12/2007 |
| JP | 2012181298 | A | 9/2012 |
| JP | 2019508789 | A | 3/2019 |
| JP | 2019114295 | A | 7/2019 |
| JP | 2020520096 | A | 7/2020 |
| JP | 2021509208 | A | 3/2021 |
| KR | 102170578 | B1 | 10/2020 |
| KR | 20210010897 | A | 1/2021 |
| KR | 102377411 | B1 | 3/2022 |
| KR | 20260035214 | A | 3/2026 |
| TW | I710763 | B | 11/2020 |
| TW | 202113501 | A | 4/2021 |
| TW | 202121050 | A | 6/2021 |
| WO | 2013043406 | A1 | 3/2013 |
| WO | 2017117568 | A1 | 7/2017 |
| WO | 2018125220 | A1 | 7/2018 |
| WO | 2020156777 | A1 | 8/2020 |
| WO | 2020193095 | A1 | 10/2020 |
| WO | 2021041963 | A1 | 3/2021 |
| WO | 2021043936 | A1 | 3/2021 |
| WO | 2022086825 | A1 | 4/2022 |
| WO | 2023097068 | A1 | 6/2023 |

OTHER PUBLICATIONS

Jhaveri, Tejas, et al., "Co-Optimization of Circuits, Layout and Lithography for Predictive Technology Scaling Beyond Gratings," IEEE Transactions on Computer-Aided Design of Integrated Circuits and Systems, Apr. 2010, 3 pages, vol. 29, No. 4, IEEE.

Ajayi, Tutu, et al., "OpenROAD: Toward a Self-Driving, Open-Source Digital Layout Implementation Tool Chain," Proceedings of Government Microcircuit Applications and Critical Technology Conference, Jan. 1, 2019, 6 pages, National Science Foundation, retrieved from https://vlsicad.ucsd.edu/Publications/Conferences/370/c370.pdf.

Author Unknown, "About The Project," KLayout, Jan. 2020, 3 pages.

(56) References Cited

OTHER PUBLICATIONS

Author Unknown, "Cadence Virtuoso Layout Suite for Electrically Aware Design," Cadence, Jun. 2013, 2 pages, Cadence Design Systems, Inc.
Author Unknown, "Custom Compiler: Best-in-Class Technology for Advanced-node Custom Design," Synopsys Datasheet, Oct. 18, 2018, 5 pages, Synopsys, Inc.
Author Unknown, "D2S Enables "Stitchless" Full-Chip Inverse Lithography Technology in a Single Day for the Multi-Beam Era," Press Release, Sep. 16, 2019, 3 pages, D2S, Inc., San Jose, California, USA.
Author Unknown, "D2S Unveils Industry's First Mask-Wafer Double Simulation Platform," Press Release, Sep. 20, 2011, 3 pages, D2S, Inc., San Jose, California, USA.
Author Unknown, "Deep reinforcement learning," Wikipedia, Sep. 21, 2020, 2 pages, Wikipedia.com.
Author Unknown, "Design rule checking," Wikipedia, May 27, 2020, 4 pages, Wikipedia.com.
Author Unknown, "Differential evolution," Wikipedia, Jun. 6, 2020, 4 pages, Wikipedia.com.
Author Unknown, "Marching squares," Wikipedia, Dec. 30, 2019, 9 pages, Wikipedia.com.
Author Unknown, "Multiple patterning," Wikipedia, Oct. 10, 2020, 22 pages, Wikipedia.com.
Author Unknown, "Optical proximity correction," Wikipedia, Apr. 28, 2019, 5 pages, Wikipedia.com.
Author Unknown, "Rasterisation," Wikipedia, Aug. 21, 2020, 4 pages, Wikipedia.com.
Author Unknown, "TrueMask® DS," Exact Date Unknown but Before May 2020, 3 pages, D2S, Inc., retrieved from https://design2silicon.com/products/truemask-ds/.
Author Unknown, "TrueMask® ILT Backgrounder Stitchless Full-Chip ILT in a Day," Backgrounder, Sep. 2019, 6 pages, D2S, Inc., San Jose, California, USA.
Author Unknown, "TrueMask® ILT," Exact Date Unknown but Before May 2020, 7 pages, D2S, Inc., retrieved from https://design2silicon.com/products/truemask-ilt/.
Cecil, Thomas, et al., "Establishing Fast, Practical, Full-Chip ILT Flows Using Machine Learning," SPIE Proceedings 11327, Optical Microlithography XXXIII, Mar. 23, 2020, 19 pages, vol. 1132706, SPIE, San Jose, California, USA.
Chen, Kun-Yuan, et al., "Full-Chip Application of Machine Learning SRAFs on DRAM Case Using Auto Pattern Selection," SPIE Proceedings 10961, Optical Microlithography XXXII, Oct. 10, 2019, 13 pages, vol. 1096108, SPIE, San Jose, California, USA.
Chen, Tai-Chen, "Multilevel Full-Chip Gridless Routing With Applications to Optical-Proximity Correction," Jun. 2007, 13 pages, IEEE, retrieved from http://cc.ee.ntu.edu.tw/~ywchang/Papers/tcad07-mgr.pdf.
Endres, Stefan, "shgo: Simplicial Homology Global Optimisation," Nov. 2020, 32 pages, GitHub, Inc., retrieved from https://stefan-endres.github.io/shgo/.
Ibtehaz, Nabil, et. al., "MultiResUNet: Rethinking the U-Net Architecture for Multimodal Biomedical Image Segmentation," Feb. 11, 2019, 25 pages, retrieved from https://arxiv.org/pdf/1902.04049.pdf.
Jia, Ningning, et al., "Machine Learning for Inverse Lithography: using stochastic gradient descent for robust photomask synthesis," Journal of Optics, Apr. 1, 2010, 9 pages, vol. 12, IOP Publishing, retrieved from https://www.eee.hku.hk/optima/pub/journal/1004_JO.pdf.
Kwan, Joe, et al., "Applying Machine Learning Techniques to Accelerate Advanced Process Yield Ramp," Jan. 5, 2021, 29 pages, Siemens Digital Industries Software, Munich, Germany.
Lin, Yibo, et al., "Machine Learning for Yield Learning and Optimization," 2018 IEEE International Test Conference (ITC), Oct. 29-Nov. 1, 2018, 10 pages, IEEE, Phoenix, AZ, USA.
Liu, Peng, "Mask Synthesis Using Machine Learning Software and Hardware Platforms," SPIE Proceedings 11327, Optical Microlithography XXXIII, Mar. 23, 2020, 17 pages, vol. 1132707, SPIE, San Jose, California, USA.
Pang, Linyong (Leo), et al., "Study of Mask and Wafer Co-design That Utilizes a New Extreme SIMD Approach to Computing in Memory Manufacturing: Full-Chip Curvilinear ILT in a Day," SPIE Proceedings 11148, Photomask Technology 2019, Oct. 3, 2019, 16 pages, vol. 111480U, SPIE, retrieved from https://design2silicon.com/wp-content/uploads/2019/11/2019-BACUS-Full-Chip-Curvilinear-ILT-091219s-003.pdf.
Pang, Linyong, "Inverse Lithography Technology: 30 years from concept to practical, full-chip reality," Journal of Micro/Nanopatterning, Materials, and Metrology, Aug. 31, 2021, 49 pages, vol. 20(3), SPIE, retrieved from https://www.spiedigitallibrary.org/journals/journal-of-micro-nanopatterning-materials-and-metrology/vol. 20/issue-03/030901/Inverse-lithography-technology--30-years-from-concept-to-practical/10.1117/1.JMM.20.3.030901.full.
Pang, Linyong, et al., "How GPU-Accelerated Simulation Enables Applied Deep Learning for Masks and Wafers," Photomask Japan 2019: XXVI Symposium on Photomask and Next-Generation Lithography Mask Technology, Apr. 16-18, 2019, 10 pages, SPIE, Yokohama, Japan.
Pang, Linyong, et al., "Making Digital Twins using the Deep Learning Kit (DLK)," Photomask Technology 2019, Sep. 15-19, 2019, 13 pages, SPIE, Monterey, California, USA.
PCT International Search Report and Written Opinion of Commonly Owned International Patent Application PCT/US2022/051028, mailing date Apr. 12, 2023, 20 pages, International Searching Authority (US).
Pradipta, Geraldo, et al., "A Machine Learning Based Parasitic Extraction Tool," Oct. 31, 2019, 3 pages, University of Minnesota, Minneapolis, Minnesota, USA.
Ren, Haoxing (Mark), "Machine Learning and Deep Learning Applications in Design Automation and Practical Issues," DAC '19: 56th Annual Design Automation Conference 2019, Jun. 2-6, 2019, 55 pages, Association for Computing Machinery, Las Vegas, Nevada, USA.
Ronneberger, Olaf, et. al., "U-Net: Convolutional Networks for Biomedical Image Segmentation," May 18, 2015, 8 pages, retrieved from https://arxiv.org/pdf/1505.04597.pdf.
Shi, Xuelong, et al., "Physics based feature Vector Design: a Critical Step Towards Machine Learning based Inverse Lithography," SPIE Proceedings 11327, Optical Microlithography XXXIII, Mar. 23, 2020, 8 pages, vol. 113270A, SPIE, San Jose, California, USA.
Sole, Marc Pons, "Layout Regularity for Design and Manufacturability," Doctoral Thesis, Jul. 8, 2012, 185 pages, Technical University of Catalonia, Barcelona, Spain.
Sperling, Ed, "Design Rule Complexity Rising," Semiconductor Engineering—Deep Insights for the Tech Industry, Apr. 19, 2018, 16 pages, SMG, retrieved from https://semiengineering.com/design-rule-complexity-rising/.
Teig, Steven L., "The X architecture: not your father's diagonal wiring," SLIP '02: Proceedings of the 2002 international workshop on System-level interconnect prediction, Apr. 6, 2002, 5 pages, ACM, retrieved from https://dl.acm.org/doi/10.1145/505348.505355.
Thies, Jurgen, "Introduction," LayoutEditor, Nov. 6, 2016, 4 pages.
Wang, Shibing, et al., "Efficient Full-Chip SRAF Placement Using Machine Learning for Best Accuracy and Improved Consistency," SPIE Proceedings 10587, Optical Microlithography XXXI, Mar. 20, 2018, 10 pages, vol. 105870N, SPIE, San Jose, California, USA.
Wang, Shibing, et al., "Machine Learning Assisted SRAF Placement for Full Chip," SPIE Proceedings 10451, Photomask Technology 2017, Oct. 16, 2017, 8 pages, vol. 104510D, SPIE, Monterey, California, USA.
Yang, Dingcheng, et al., "CNN-Cap: Effective Convolutional Neural Network Based Capacitance Models for Full-Chip Parasitic Extraction," Jul. 14, 2021, 9 pages, retrieved from https://arxiv.org/pdf/2107.06511.pdf.
U.S. Appl. No. 17/992,870, filed Nov. 22, 2022.
U.S. Appl. No. 17/992,874, filed Nov. 22, 2022.
U.S. Appl. No. 17/992,881, filed Nov. 22, 2022.
Kareem, Pervaiz, et al., "Fast Prediction of Process Variation Band through Machine Learning Models," Optical Microlithography XXXIV,

(56) References Cited

OTHER PUBLICATIONS

Feb. 2021, vol. 11613, 8 pages, Proceedings of SPIE—The International Society for Optical Engineering.
Liu, Yong, et al., "Inverse Lithography Technology Principles in Practice: Unintuitive Patterns" Proceedings SPIE 5992, 25th Annual BACUS Symposium on Photomask Technology, Nov. 8, 2005, 8 pages, SPIE.
Ma, Yuzhe, et al., "Methodologies for Layout Decomposition and Mask Optimization: A Systematic Review," Proceedings of the IFIP/IEEE International Conference on Very Large Scale Integration, Oct. 23-25, 2017, United Arab Emirates, 6 pages, IEEE.
Screen captures from YouTube video clip entitled "FullChip Lithography Engineering Software", 5 pages, uploaded on Feb. 5, 2019 by panoramichtech. Retrieved from Internet: https://www.youtube.com/watch?v=zvkjjOseU_Y.
Screen captures from YouTube video clip entitled "Silicon photonics lithography prediction simulation", 3 pages, uploaded on Nov. 30, 2013 by lukaschrostowski. Retrieved from Internet: https://www.youtube.com/watch?v=-Z1HYzCUKeo.
Dong, Xuan, et al., "Process-Variation-Aware Rule-Based Optical Proximity Correction for Analog Layout Migration," IEEE Transactions on Computer-Aided Design of Integrated Circuits and Systems, vol. 36, No. 8, Aug. 1 2017, pp. 1395-1405, IEEE.
Shao, Dongbing, et al., "Incorporating Process Variation Contours in Design Rule Calculation and SRAM Design Optimization", Proceedings of SPIE, vol. 10962, Design-Process-Technology Co-optimization for Manufacturability XIII, Mar. 20, 2019, 7 pages, SPIE, San Jose, California.
Shao, Hao-Chiang, et. al., "From IC Layout to Die Photograph: A CNN-Based Data-Driven Approach" IEEE Transactions on Computer-Aided Design of Integrated Circuits and Systems, vol. 40, No. 5, May 2021, pp. 957-970, IEEE.

* cited by examiner

2500

3200

3700

INTERACTIVE COMPACTION TOOL FOR ELECTRONIC DESIGN AUTOMATION

CROSS REFERENCE TO RELATED APPLICATIONS

The present application is related to the following applications having a similar specification and figures: U.S. patent application Ser. No. 17/992,870, filed Nov. 22, 2022; U.S. patent application Ser. No. 17/992,874, filed Nov. 22, 2022; and U.S. patent application Ser. No. 17/992,881, filed Nov. 22, 2022.

CLAIM OF BENEFIT TO PRIOR APPLICATION

This application claims the benefit of U.S. Provisional Patent Application 63/283,520, filed Nov. 28, 2021. U.S. Provisional Patent Application 63/283,520 is incorporated herein by reference.

BACKGROUND

In electronics engineering, a design rule is a geometric constraint imposed on circuit board, semiconductor device, and integrated circuit (IC) designers to ensure their designs function properly, reliably, and can be produced with acceptable yield. Design rules for production are developed by process engineers based on the capability of their processes to realize design intent. Electronic design automation (EDA) is used extensively to ensure that designers do not violate design rules; a process called design rule checking (DRC). DRC is a major step during physical verification signoff on the design, which also involves LVS (layout versus schematic) checks, XOR checks, ERC (electrical rule check), and antenna checks. The importance of design rules and DRC is greatest for ICs, which have nano-scale geometries, and for advanced processes, at smaller geometry process nodes.

Variation, edge placement error, and a variety of other issues at new process geometries are forcing chipmakers and EDA vendors to confront a growing volume of increasingly complex, and sometimes interconnected design rules to ensure chips are manufacturable. Equally daunting is the impact of different circuit layout polygons on each other, which has led to significant increases in the number of rules. At the smaller geometry processes (e.g., currently at 28 nm and below) in particular, many fabs also insist upon the use of more restricted rules to improve yield.

The number of rules has increased to the point where it's no longer possible to manually keep track of all of them, resulting in extreme design rule bloat. This increases the number of required checks, and it makes debugging more difficult. Further, some rules rely on other rules, which is a growing problem for some foundries at some processes.

General-purpose IC design rules have to be somewhat pessimistic/conservative in nature, in order to cater to a wide variety of designs, as it is not known a-priori what polygons will neighbor other polygons during an IC layout, and so the rules have to be able to accommodate just about every possibility.

Standard cell designers (e.g., SRAM designers) on the other hand have traditionally been able to take advantage of "DRC exemptions" due to the extreme regularity of their designs (e.g., each SRAM cell is surrounded in all directions by identical cells or close-to-identical dummy cells at the periphery of the memory array). This regularity means that it is known a-priori what polygons will neighbor other polygons, and so the rules can be 'relaxed' somewhat, allowing for a denser packing of polygons compared to that allowed for by the restrictive rules. Packing a cell tighter is more meaningful when it is repeated many times, so these exemptions are often negotiated between a designer and a foundry/fab. Even very small decreases in bit-cell (or any other type of cell used in a highly repetitive manner, such as Standard Cell Library cells) area can lead to exceptionally large improvements in chip density and area decrease at the chip level. Efforts have also been made in other design areas in the past to use DRC exemptions in conjunction with regularly structured designs/fabrics resulting in improved packing density, and/or improved manufacturing yield. Here, the regularity enforced by the design fabric has resulted in the relaxing of the design rule constraints somewhat. However, this approach is somewhat inflexible, as it requires an imposed significant regularity of the design fabric, and so reduces design and layout engineer choices.

A further problem facing layout and yield engineers today is that of lithography hotspots. A lithography hotspot ("hotspot" hereinafter) is a location in a design where it is probabilistically susceptible to fatal pinching (open circuit) or bridging (short circuit) errors due to poor printability of certain patterns in the design layout. One way to find hotspots is to run a lithography simulation on a layout. However, lithography simulation is too computationally expensive for full-chip design. Further, at the smaller geometry processes, the layout has to be colored for multiple-patterning and OPC-corrected before lithography simulation can be run, adding additional computational expense.

Optical proximity correction is a photolithography enhancement technique commonly used to compensate for image errors due to diffraction or process effects. The need for OPC is seen mainly in the making of semiconductor devices and is due to the limitations of light to maintain the edge placement integrity of the original design, after processing, into the etched image on the silicon wafer. These projected images appear with irregularities such as line widths that are narrower or wider than designed, and are amenable to compensation by changing the pattern on the photomask used for imaging. Other distortions such as rounded corners are driven by the resolution of the optical imaging tool and are harder to compensate for. Such distortions, if not corrected, may significantly alter the electrical properties of what was being fabricated. Optical proximity correction corrects these errors by moving edges or adding extra polygons to the pattern written on the photomask. This may be driven by pre-computed look-up tables based on width and spacing between features (known as rule based OPC) or by using compact models to dynamically simulate the final pattern and thereby drive the movement of mask patterns, typically broken into sections, to find the best solution, (this is known as model based OPC). The objective is to reproduce on the semiconductor wafer, as well as possible, the original layout drawn by the designer.

The most visible benefits of OPC are correcting area differences seen between contacts in regions of differing environments, linewidth differences seen between features in regions of different density (e.g., center vs. edge of an array, or nested vs. isolated lines), and line end shortening (e.g., gate overlap on field oxide). These may be used together with resolution enhancement technologies, such as SRAFs (sub-resolution assist features placed adjacent to resolvable lines) together with feature size adjustments. In addition, "dog-ear" (serif or hammerhead) features may be generated at the line end in the design. OPC has a cost impact on photomask fabrication whereby, for Variable- Shaped Beam (VSB) mask writers, the mask write time is related to the complexity of the mask shapes and data-files and similarly mask inspection for defects takes longer as the finer edge control requires a smaller spot size. For multi-beam mask writers, write time is independent of the complexity of the mask shapes.

At the leading edge technologies, advanced techniques such as ILT (Inverse Lithography Technology) are required for OPC correction, adding even more computational expense (ILT tools are notoriously CPU and GPU intensive). ILT may produce curvilinear or piecewise polygonal mask shapes, or ILT may be "Manhattanized" to produce axis-parallel orthogonal shapes, particularly targeted for writing on VSB mask writers.

In order to investigate if a candidate layout fix leads to the hoped-for improvement, the mask is OPC corrected before the lithography simulation is performed. For the most critical layers and patterns, the OPC is in the form of curvilinear ILT, which is more computationally expensive. Because turnaround-time is a critical business success factor, often the more time-consuming techniques are utilized for lithographically worst performing areas. During the process of OPC or ILT, these are commonly referred to as hotspots or lithography hotspots, but in this application both terms are used to refer to problem areas that remain even after the best that can be done by any OPC, including those fixed by ILT, or even full chip curvilinear ILT. The computational costs of any kind of OPC and lithography simulation for today's process nodes means that large delays exist in obtaining feedback on hotspot fix candidate solutions. These costs have eliminated the ability to perform such fixes in a truly interactive manner.

BRIEF SUMMARY

Some embodiments provide EDA methods that during the design process utilize predicted manufactured contours of the design components to make design decisions. In some embodiments, the predicted manufactured contours are generated by a machine-trained network (e.g., a trained neural network) that produces multiple manufactured wafer contours corresponding to design edits within a short amount of time (e.g., seconds) of the edits themselves. The use of the machine trained network in some embodiments allows for fast edit loops in interactive editing timeframes. In the discussion below, the machine-trained network is referred to as the "digital twin" of a manufacturing process that produces a set of masks for a design, or a wafer or IC die that is produced by using the set of masks. The predicted manufactured wafer contours produced by the machine-trained network is also referred to as the "digital twin" of the design that is produced by the set of masks or produced on the IC die/wafer.

The method of some embodiments predicts manufacturing rule compliance by using pre-computing techniques, e.g., by using a trained neural network, to accelerate processing time. In some embodiments, the method is used to implement a compactor that allows the designer to quickly view predicted wafer contours for automatic or manually driven compaction edits. Conjunctively, or alternatively, the method of some embodiments allows for fast automatic detailed routing of layout driven by manufacturing rules in turn driven by the predicted wafer contours. Also, the digital twin-inferred wafer contours in some embodiments take coloring, mask OPC/ILT and lithography effects into account (e.g., by using a trained neural network). These methods accelerate the iterative optimization of the EDA tool by evaluating each iteration quickly and provide greater insight into manufacturing considerations at each of their respective design stages.

Some embodiments provide an EDA architecture that leverages a high degree of concurrency to achieve interactive and iterative timeframes, by performing different tasks related to the problem of setting up the data for pre-computed evaluation, potentially by a neural network, and post processing its results, using concurrent execution flows along with GPU acceleration. The advanced applications of the interactive layout design method of some embodiments includes bus route compaction and interactive lithography hotspot repair to name a few. The methods of some embodiments reduce design-level hotspots to a level that even the best curvilinear ILT solution would not be able to resolve during the manufacturing process.

The methods of some embodiments are used in interactive layout design processes, in which one or more EDA tools quickly present results of user-driven edits to a designer to receive additional edits or instructions from the designer. The interactive design architecture of some embodiments greatly minimizes the delay between a designer-performed layout edit, and the subsequent OPC/ILT-aware visualization of manufactured silicon water contours, allowing for tight, interactive feedback loops and greatly improved productivity in the hotspot fixing process.

Also, for interactive custom IC designs, some embodiments provide new EDA methods that extend the concept and application of DRC exemptions to arbitrary design scenarios (e.g., to arbitrary custom IC designs) during design layout time. These methods effectively simplify design rules for the layout designer, and improve the resulting design yield and manufacturability. The EDA methods of some embodiments provide the DRC exemptions to custom IC designs without compromising layout flexibility, i.e., without forcing the layout designer to use a small number of predefined layout templates.

Some embodiments also use machine learning processes (such as the deep neural network processes disclosed in U.S. patent application Ser. No. 16/949,270, now issued as U.S. Pat. No. 12,372,864, which is incorporated herein by reference) to present the designer with a 'WYSIWYG' (What You See Is What You Get) paradigm. These embodiments allow for interactive design updates, while visualizing in real time the expected manufactured silicon results. Some embodiments provide an architecture that minimizes the delay between a designer-performed layout edit, and the visualization of manufactured silicon water contours, allowing for tight feedback loops in DRC-exempt design compaction. The methods of some embodiments are used in other forms of layout design, including automated layout design and/or synthesis.

The use of neural networks, perhaps by neural networking techniques, for these embodiments as described herein is useful because neural networking is a statistical technique. While neural networking may contain some errors in the output, certain of the neural networking techniques contain the errors so that the worst output is not outlandishly bad. In the embodiments that only use neural networking methods for estimation purposes, the statistical nature of the output is sufficient for the tasks that they perform.

The extremely fast runtimes of neural networking based methods enable processes that may traditionally take weeks of computing to now be approximated/estimated reasonably accurately in mere seconds. These fast runtimes are in direct contrast to simulation-based analysis, which often takes weeks or days to complete, particularly when chaining together a sequence of image-to-image transforms to perform a particularly long chain of constructive and simulation-based processing, such as Monte Carlo analysis of various coloring possibilities, a Monte Carlo analysis of various neighborhood possibilities, OPC/ILT, MPC, mask simulation, and wafer simulation. The neural-networking based methods even provide fast runtimes when accounting for various types of more complex analyses (such as Monte Carlo analysis) to improve their predictions. This is because the time needed to account for the more complex analyses can be entirely or mostly subsumed into the training time of the neural networks, which allows these networks to continue their fast runtime operations. While some embodiments use neural networks, one of ordinary skill will realize that other embodiments use other types of machine-trained networks or processes.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description, the Drawings and the Claims is needed. Moreover, the claimed subject matters are not to be limited by the illustrative details in the Summary, Detailed Description and the Drawings.

BRIEF DESCRIPTION OF FIGURES

The novel features of the invention are set forth in the appended claims. However, for purposes of explanation, several embodiments of the invention are set forth in the following figures.

DETAILED DESCRIPTION

Figure 1:
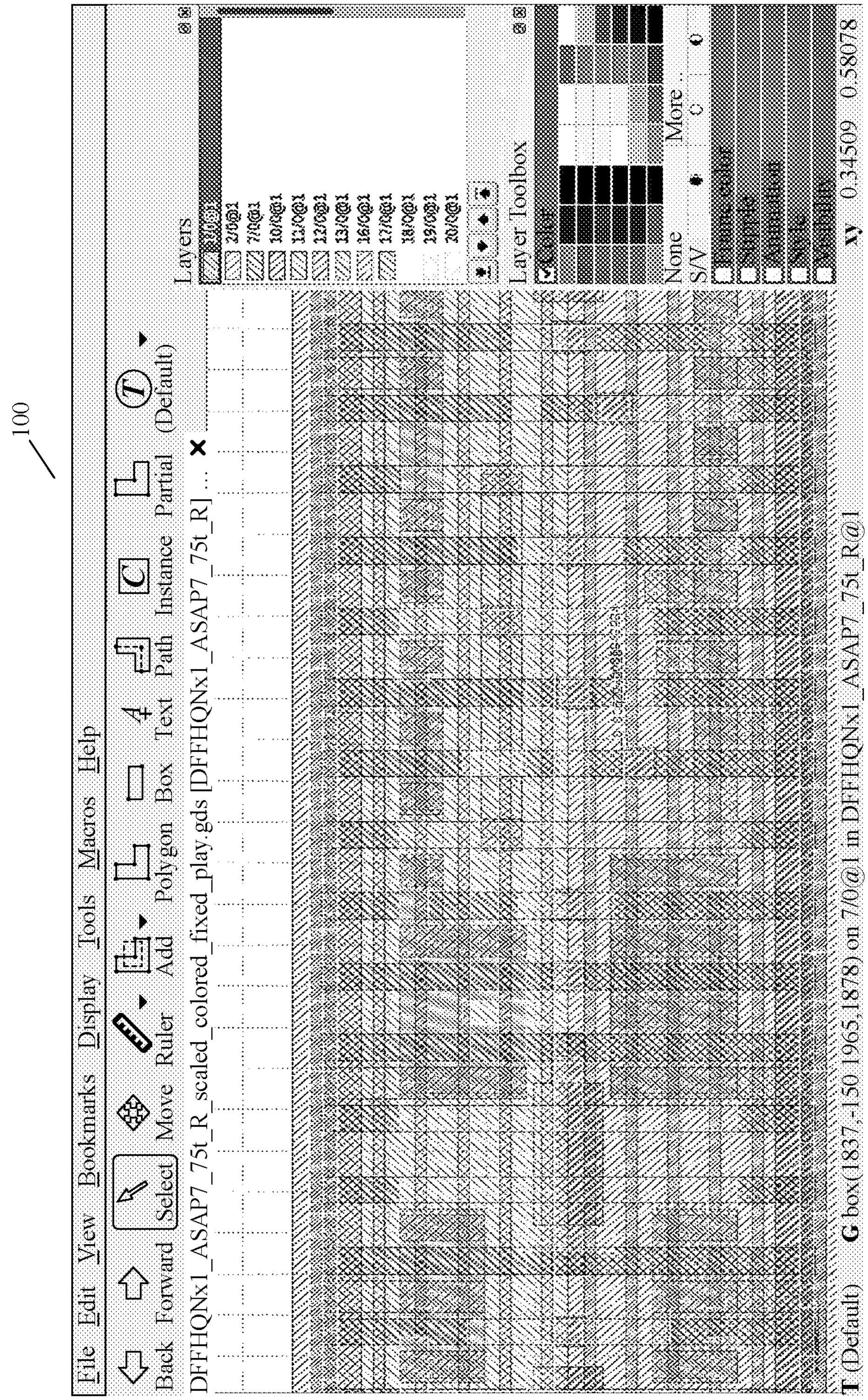
FIG. 1 illustrates an example of a user interface of an interactive IC layout editing tool.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments provide systems and methods for circuit layout editing driven by a knowledge of the manufactured wafer contours as specified by digital twins that are produced for the circuit layouts through machine-trained processes, such as neural networks. Such systems and methods are referred to below as digital twin-guided, circuit layout systems and methods. In some embodiments, these systems and methods are used in interactive editing tools, to provide fast edit loops in interactive editing timeframes, in which the manufactured wafer contours corresponding to design edits are presented within seconds of the edits themselves. In some embodiments, the wafer contours take mask OPC/ILT and lithography effects into account (e.g., by using a trained neural network to account for these effects).

In some embodiments, the machine-trained network or process produces multiple predicted manufactured contours of design components to facilitate in the making of design decisions. The different manufactured contours that are generated in some embodiments correspond to different manufacturing process variations, such as different doses to account for mask variations, or different depth of focus and exposure strengths for wafer production variations. In the discussion below, the machined-trained network or process is referred to as the "digital twin" of a manufacturing process that produces a set of masks for a design or a wafer or IC die that is produced by using the set of masks. The predicted manufactured wafer contours produced by the machine-trained network is also referred to as the "digital twin" of the design that is produced by the set of masks or produced on the IC die/wafer.

The architecture of the design system of some embodiments uses a high degree of concurrency to achieve the interactive timeframes, by performing different tasks related to the problem of setting up the data for the neural network, and post processing its results, using concurrent execution flows along with GPU acceleration. The advanced applications of the interactive layout design method of some embodiments includes bus route compaction and interactive lithography hotspot repair to name a few.

Some embodiments provide digital twin-guided interactive routing and/or compaction methods. In some embodiments, the digital twins of the manufacturing process are leveraged to provide information regarding the detailed silicon contours that will appear after manufacturing, the information thereafter guiding various facets of circuit design and layout. While several examples are presented below in the context of interactive layout design, the systems and methods of some embodiments are equally applicable to other forms of layout design, including layout synthesis, automatic placement, routing and compaction, etc.

Also, several embodiments are described below with respect to a deep learning-based implementation of digital twin technology, which are manufacturing aware. However, one of ordinary skill will realize that some embodiments are not limited to deep learning-based digital twins, but rather also encompass other forms of digital twins, e.g., those based on shallow learning, other computational approaches not limited to neural networks and/or other forms of pre-computing.

FIG. 1 illustrates an example of a user interface 100 of an interactive IC layout editing tool. Commercial examples of such tools include Custom Compiler from Synopsys Inc., and Virtuoso from Cadence Design Systems Inc. A custom, or full-custom IC, design process uses unique building blocks that are created specifically for the function required. Many of the same tools are used in a custom IC design process that are used in the semi-custom, or ASIC, design process. The difference is the building blocks that are assembled are often custom built to deliver specific capabilities. An IC layout editor is an important tool for this kind of design process.

The methods used to assemble these devices can also be different to accommodate the unique requirements of the IC or block being developed. Critical components of cutting edge designs are often designed using custom IC design processes and tools such as the above. Examples may include SRAM bit cells, Standard Cell Library cells, and Analog/RF design cells. One use model is interactive designs in which designers place polygons or polygon collections representative of blocks, transistors, etc., in the layout and draw wires to connect them together.

In an interactive IC layout editing tool of some embodiments, automation is also present, e.g., local routing tools may help complete routing. Among other things, these tools present a canvas area in which a user-design is edited, a layer selector window allowing the various process layers to be selected for editing and/or display, and various menus, toolbars and bind-key actions for performing the various layout design edits, typically in conjunction with mouse input for graphically specifying geometrical coordinates. Such tools are also not limited to the editing of a single cell, but allow editing and assembly of hierarchical layouts (cells placed within cells).

It is common for these tools to be used for editing a single cell at a time, without the context in which that cell is eventually to be used. It is also common for these cells to be used to edit a cell in the context of another, larger cell in which it is placed. These latter forms of editing operations are known as "edit-in-place", where the editor displays not only the contents of the cell being edited, but also the surrounding context (i.e., the context of the hierarchy 'above' or alongside the cell being edited). In the edit-in-place context, the user and tool are aware of the context surrounding the cell being edited, which can greatly facilitate certain operations.

In some embodiments, the tool/user may be editing a cell by itself, without the surrounding context, which will be referred to in this document as "context-free" editing. In other embodiments, the tool/user may be editing a cell using the edit-in-place paradigm in which the surrounding context may be available. Some embodiments support both context-free and edit-in-place paradigms. When rasterizing a cell-under-edit, if the context is already available due to the use of the edit-in-place paradigm, the rasterization process in some embodiments can be expanded to include not just the cell being edited, but also some or all of the surrounding context. Rasterization is the process of taking an image described in a geometrical/vector graphics format (shapes) and converting it into a raster image (a series of pixels, dots or lines, which, when displayed together, create the image which was represented via shapes). The expansion portion can include only that area of the surrounding context that affects the contours of the design cell under edit. Areas of the surrounding context that are too far away from the cell under edit (and hence have no effect on its manufactured contours), are excluded from the expansion portion in some embodiments. In some embodiments, the lithography ambit dimension can be set to a known, fixed amount, or can be specified by the user.

When a cell is being edited in a context-free paradigm within the editing tool, a context may be inferred for the cell, i.e., certain assumptions made about the surrounding context of the environment in which the cell will eventually be placed. For a memory bit-cell for example, the method may assume the cell-under-edit is surrounded by similar cells, perhaps with the same orientation, or with different orientations (e.g., mirror images in X or Y). For standard cells, which will form a standard cell library and eventually be placed and routed in rows, the method may assume the cell-under-edit is surrounded by other instances of itself, or instances of the other cells in the standard cell library, in any of the possible valid orientations.

In this case, when the cell is rasterized, copies of it surrounded by those various contexts are also rasterized at the same time, which effectively synthesizes different neighborhoods for the cell being edited. Some embodiments also combine (effectively superimpose) the predicted wafer contours across these different neighborhoods, i.e., effectively anticipating and taking neighborhood-induced variations into account. The contours presented and used in the resulting computations in some embodiments are statistically determined, or are simply taken as the most extreme possible (the largest possible 'outer' contour and the smallest possible 'inner' contour). The inner/nominal/contours will also be described in more detail further below.

To simplify discussion, several examples discussed below and illustrated by their accompanying figures are presented as if the edited designs are being edited in a context-free manner, without inference of a context as described above. However, one of ordinary skill will realize that the embodiments of the invention extend to edit-in-place paradigm, as these embodiments are equally applicable to context-free and edit-in-place paradigms.

Figure 2:
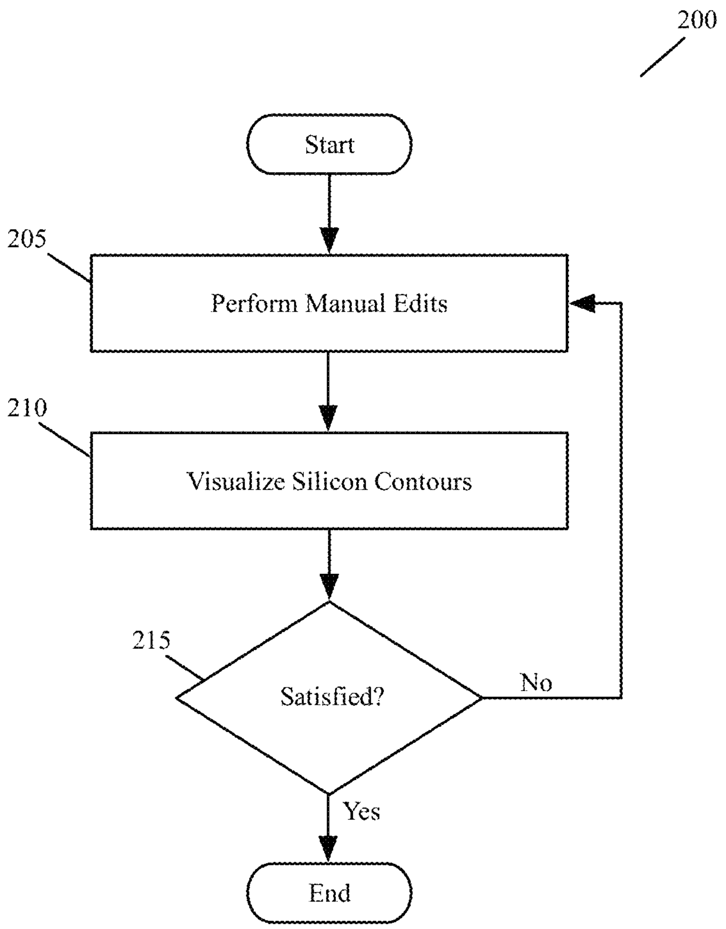
FIG. 2 conceptually illustrates an interactive editing process of some embodiments.

FIG. 2 conceptually illustrates an interactive editing process 200 of some embodiments. This interactive process provides manufactured-aware predictions regarding design element contours to a designer in order to allow the designer to assess the quality of the designs viewed, produced and/or edited through an interactive design tool. As shown, the process 200 involves one or more iterations of three operations. These operations are (1) a designer performing (at 205) a manual edit operation, (2) the interactive tool providing (at 210) a quick visualization of the representations of the wafer contours as it will appear on silicon after manufacturing, and (3) the designer assessing (at 215) whether the designer is satisfied with the edit. When the designer is satisfied, the process ends. Otherwise, the process returns to 205 for the designer to perform another manual edit, followed by another quick visualization representations of the predicted wafer contours once the integrated circuit is manufactured.

In some embodiments, the process 200 is used by an interactive design tool that employs an interactive DRC-exempt use model to allow a designer to perform various manual edits at 205. Also, in some embodiments, the manual edits are facilitated with some automated tool operations. In addition, the quick visualization representations in some embodiments are produced within seconds of the manual editing operations, allowing a user to quickly assimilate the contour information and make subsequent contour-driven edits in real time.

The visualization representations in some embodiments are intended to accurately represent the silicon after it is manufactured, by taking OPC/ILT mask correction and lithography effects into account at small process geometries. With such visualizations, a user may visually inspect the contours and decide to make the next editing operation, such as moving some shapes closer together or further apart, in response to the observed contours. When the silicon wafer contours are not determined and rendered sufficiently quickly, the interactive use model paradigm will fail, and throughput will be diminished. As a result of the diminished productivity, the final layout is unlikely to be optimal.

Figure 3:
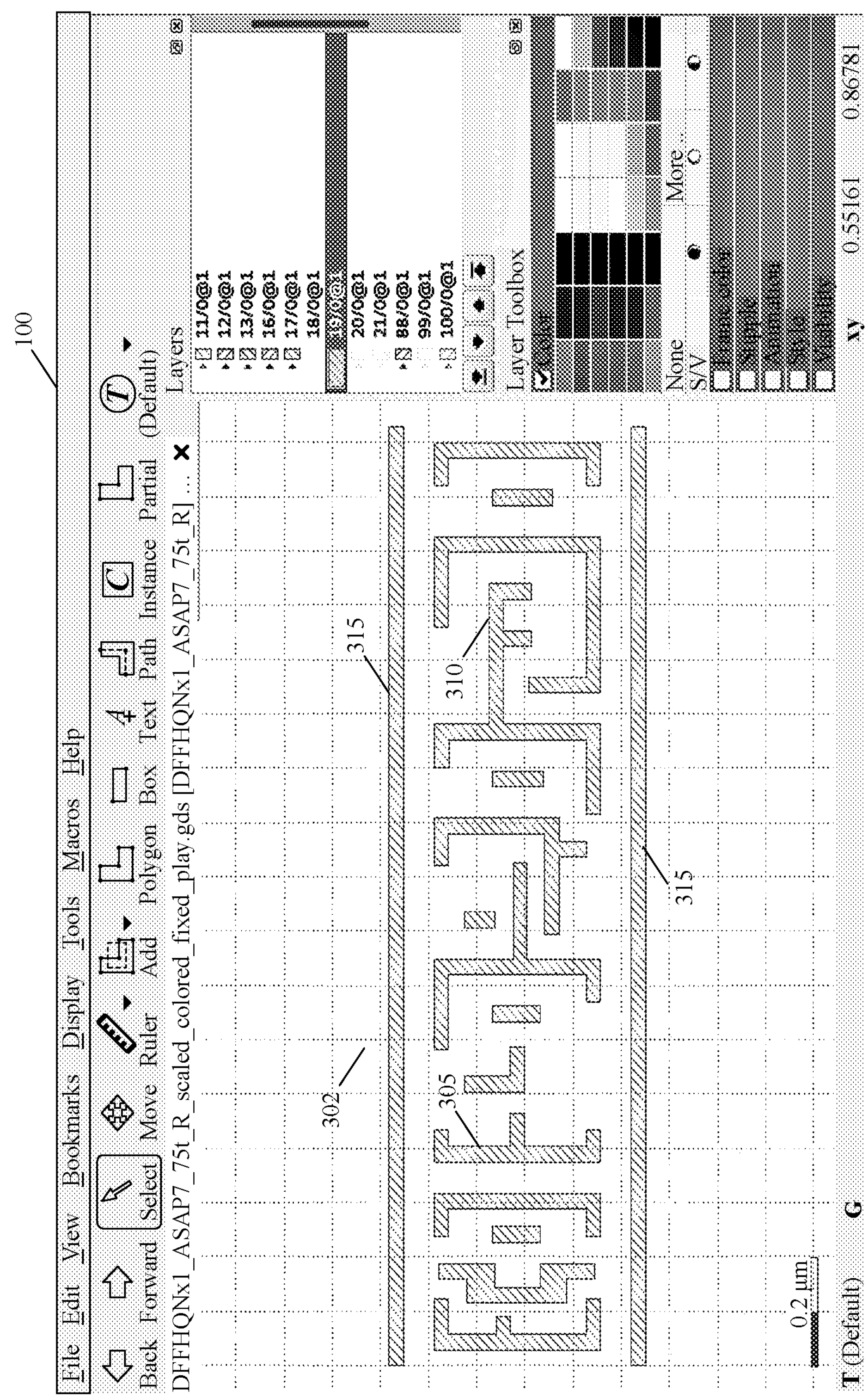
FIGS. 3-10 illustrate an interactive design process that is provided by an interactive-design tool of some embodiments.

FIGS. 3-10 illustrate an interactive design process that is provided by an interactive-design tool of some embodiments. This process is presented as various user-interface stages that present various stages of a designer's interaction with the tool. FIG. 3 shows the user interface 100 of the interactive-design tool as displaying several IC-design components for a D Flip Flop (DFF) standard cell design 302 on metal layer 1. These components include several Manhattan routes (e.g., E-shaped routes 305, F-shaped routes 310, etc.), along with long horizontal power rails 315 at the top and bottom of the cell 302.

Figure 4:
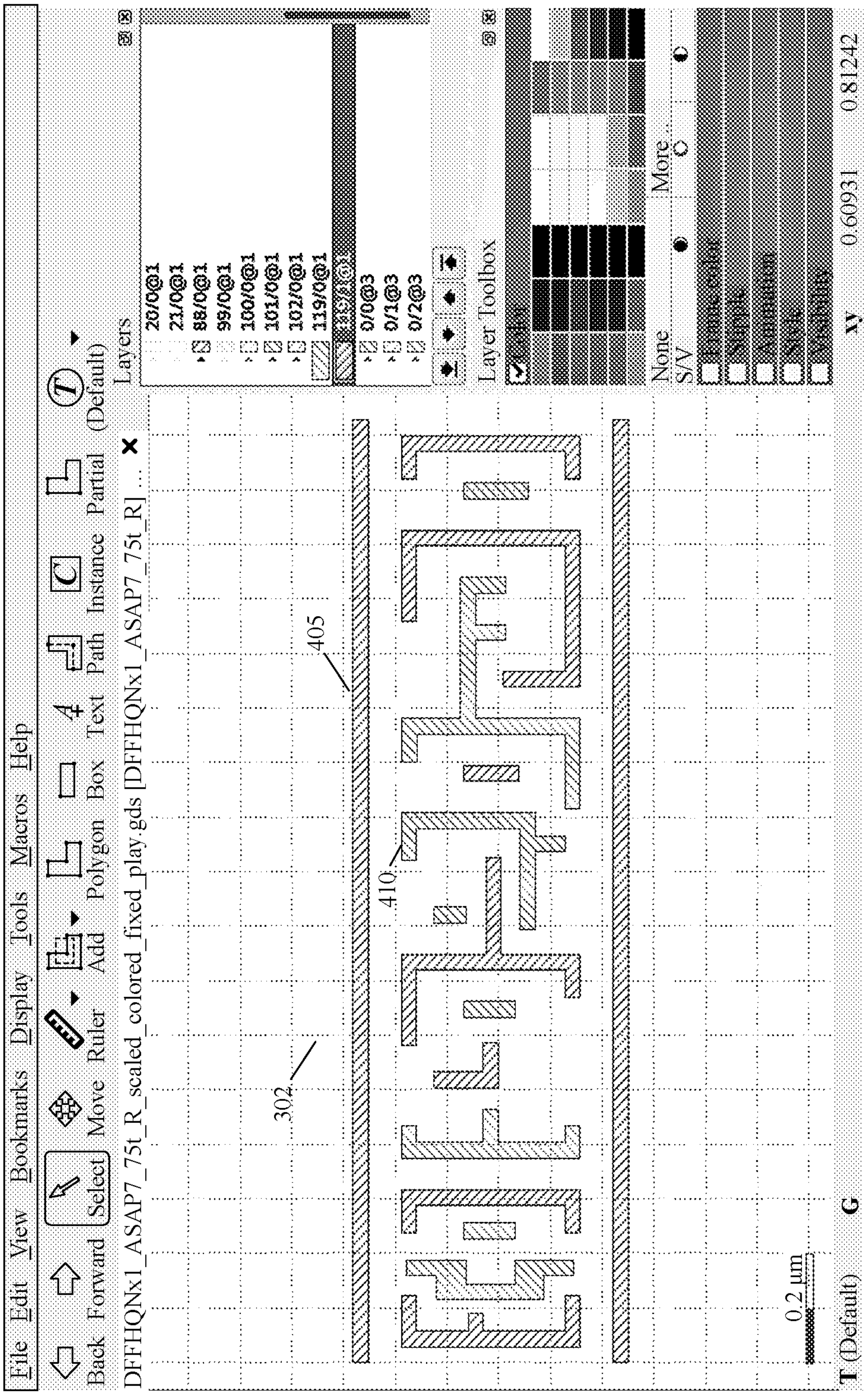

FIG. 4 illustrates the design 302 after it has been separated into two color masks using a Double Patterning Technique (DPT). The two color masks are red-color mask components 405 and blue-color mask components 410. These color masks are shown in the figure in different shades of grey, and use different stipple patterns, one with left-to-right cross hatching for the red-color mask, and the other with right-to-left cross hatching for the blue-color mask.

This process of separating a wafer layer into multiple mask layers is commonly referred to as "coloring." The various metal shapes are separated into two color masks to enhance the feature density, a process known as Multiple Patterning, which is a class of technologies for manufacturing ICs developed for photolithography to enhance the feature density. Today, multiple patterning is necessary for the 10 nm and 7 nm node semiconductor processes and beyond. The premise is that a single lithographic exposure may not be enough to provide sufficient resolution. Hence, additional exposures would be needed, or else positioning patterns using etched feature sidewalls (using spacers) would be necessary.

A user attempting to push the design rules will attempt to squeeze these shapes closer together, while maintaining manufacturability of the shapes, ability to connect to the shapes on the layers above and below, among other things. Without the benefit of some embodiments of the invention, standard restricted design rules normally constrain the user to employ pessimistic spacing rules. However, with a DRC-exemption feature of some embodiments, a user can remove some of the pessimism and compact the spacing below the minimum allowed by the restricted design rules.

Figure 5:
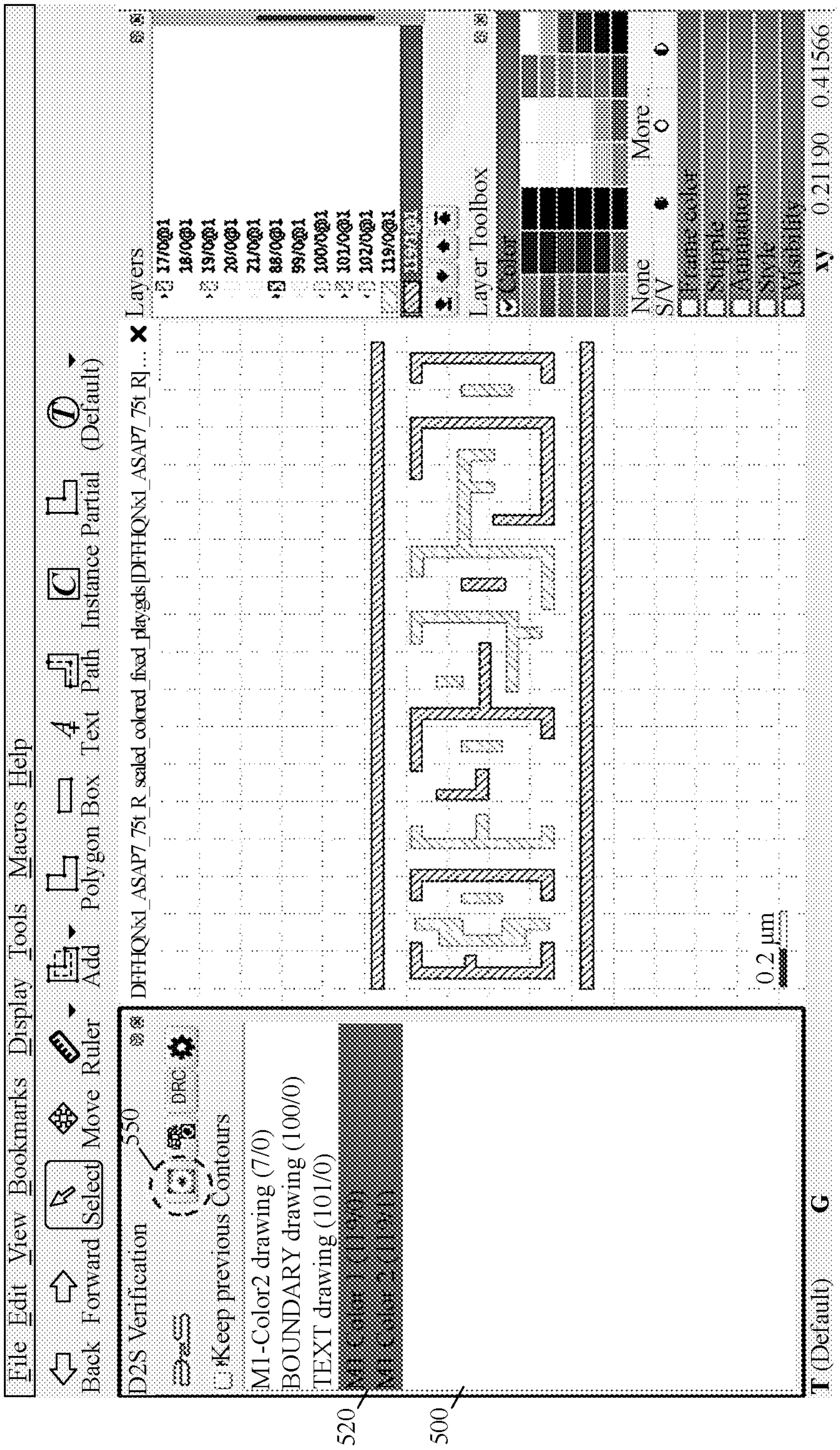

FIG. 5 illustrates a selection of a verification tool 500 of the interactive-design tool of some embodiments. This tool allows the designer to select one or more semiconductor layers, and direct the tool to present visualization of the contours of the manufactured silicon shapes across process variations. In this example, the designer has selected the two metal 1 color masks 520, and directed the tool to present the visualization by selecting (e.g., clicking) a UI control 550 (e.g., UI button).

Figure 6:
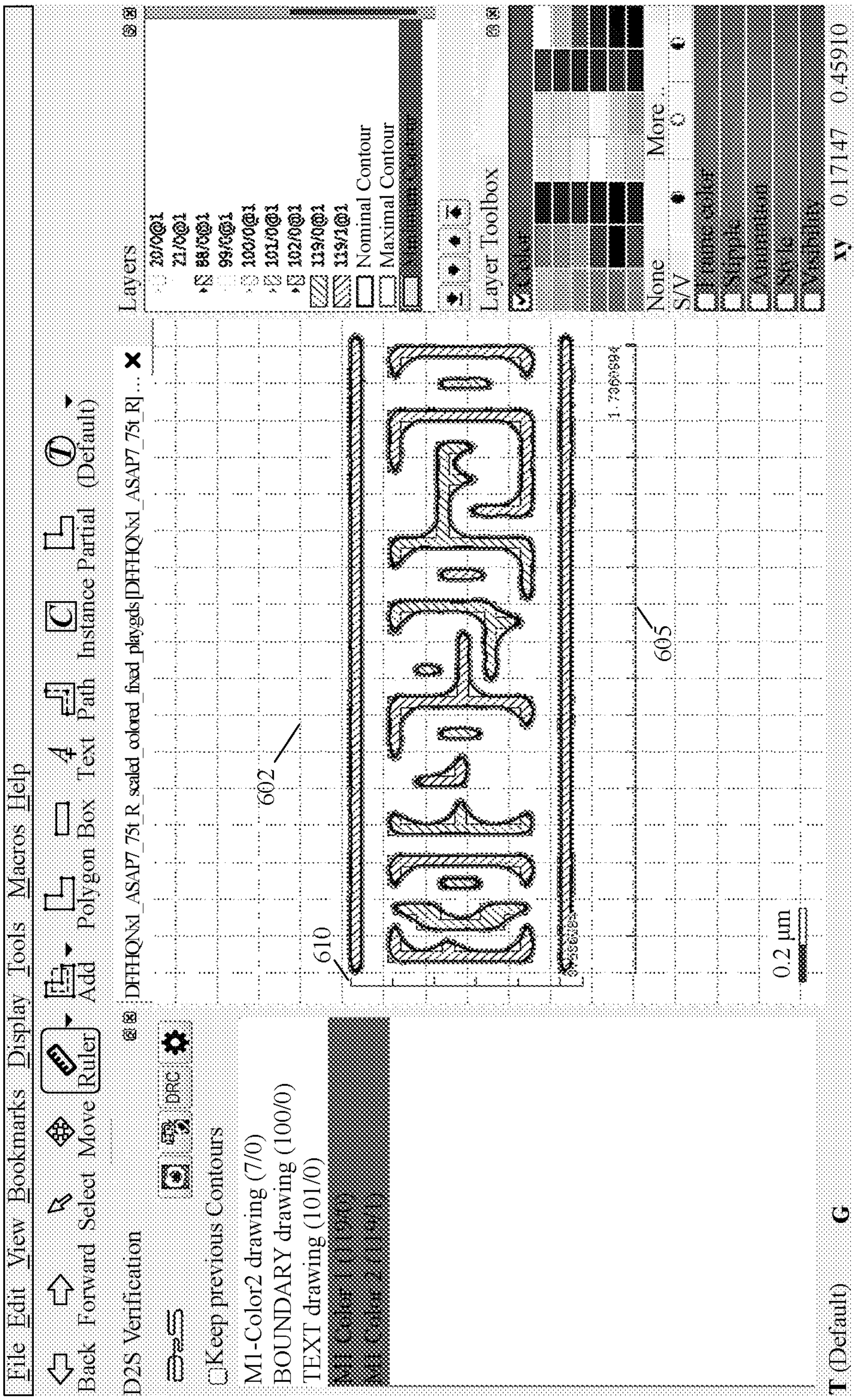

FIG. 6 illustrates a predicted design 602 that represents a prediction of how the design 302 would appear once it is manufactured. Such designs are referred to below as predicted manufactured design. The interactive-design tool in some embodiments generates this design by using a machine-trained network (e.g., a neural network) that has been trained to take EDA designs as input and produce as output predicted manufactured designs that represent the predicted shape of the input designs. The machine-trained network is trained in some embodiments through a learning process that uses known input designs (e.g., input designs post coloring) with known output designs (e.g., outputs designs post mask making or mask simulations) to train the machine-trainable parameters of the network (e.g., the weight values of the neural network).

As shown, the predicted design 602 includes a detailed image of the wafer contours (over process variations) for the shapes of the layers selected in FIG. 5. The interactive-design tool presents this detailed image very quickly as it uses a machine-trained network (e.g., a neural network) to produce this detailed image. In FIG. 6, the generated silicon wafer contours are superimposed on the design along with the original design layout components, so that they can be seen in the full context of the design. It is highly advantageous to present this information to the user quickly (within a few seconds, or less), in order to allow for interactive editing to be performed quickly.

Several other examples illustrated in other figures described below also show the machine-generated predicted contours superimposed on the design layout along with their corresponding components in the design layout. One of ordinary skill will realize that other embodiments do not draw the predicted contours superimposed on the design layout along with their corresponding layout components but rather just draw the predicted contoured shapes.

In FIG. 6, as well as other examples described below, the predicted manufactured shape of each component is drawn with multiple contours (i.e., is drawn as multiple shapes with multiple sets of curvilinear segments). Each contour of each component represents the predicted shape of that component for a particular manufacturing process variation. As mentioned above, the interactive design tool of some embodiments employs a machine-trained network (e.g., a neural network) that has been trained to produce a range of predicted shapes for each component of a selected portion of a design over a range of process variations. For instance, in some embodiments, the interactive-design tool presents to the designer not only the nominal manufacturing process wafer contours, but also those that correspond to the outer (Maximum) and inner (Minimum) contours, reflective of maximum and minimum manufacturing process variations.

Figure 7:
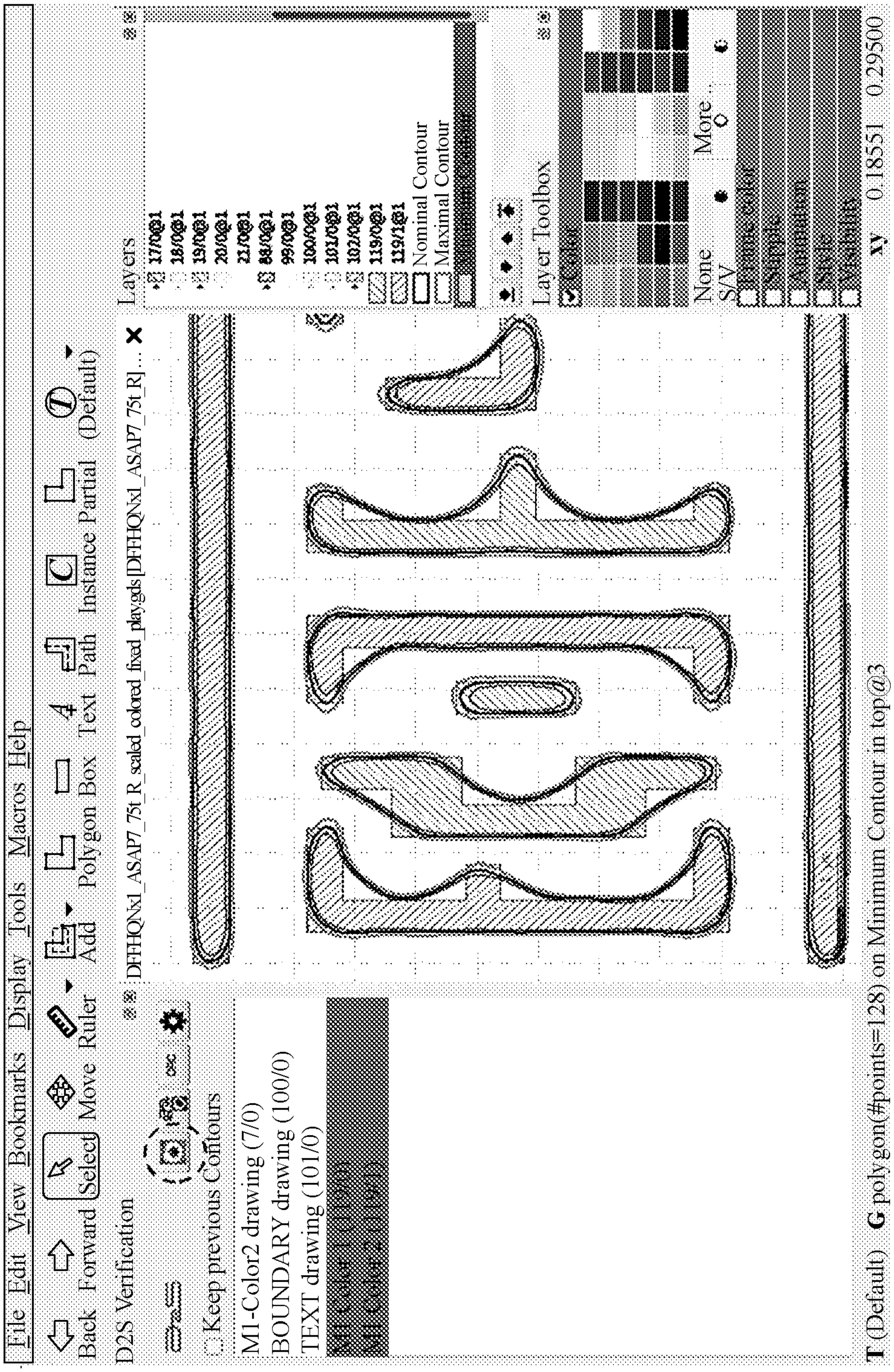

In this example, two rulers 605 and 610 indicate the size of the initial design to be approximately and 1.7 microns in the X direction, and 0.55 microns (micrometers) in the Y direction. FIG. 7 illustrates a change in a zoom level of the UI 100, which a designer makes in order to inspect the contours of the predicted manufactured design 602 in more detail, and to insert measurement rulers allowing the widths of, and spaces between, the manufactured contours to be determined.

Figure 8:
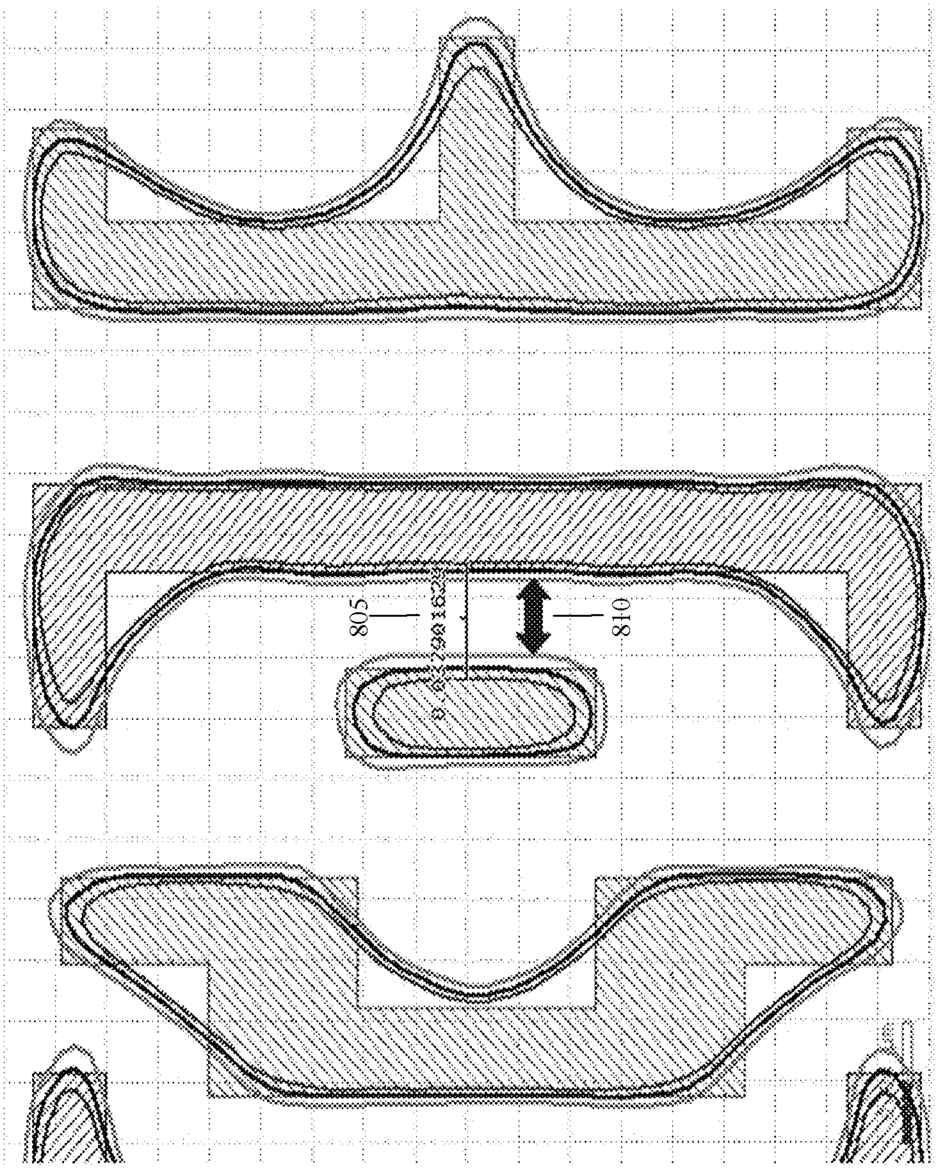

FIG. 8 illustrates an example of the results of a ruler placement operation. Here, the user has quickly determined, via a ruler operation, the largest possible spacing (after manufacturing) between two particular pieces of metal 1. As shown by a ruler 805, this spacing is identified between the inner wafer counters to be 0.037901629 microns, or approximately 38 nm. The designer may also wish to determine the least possible spacing, for example, by placing a ruler between the outer manufactured contours as indicated by the arrowheads 810.

A designer can decide to perform some edits to push beyond the design rules, e.g., in a DRC-exempt design scenario, when the contours are accurate and sufficiently reflective of OPC/ILT mask correction and of manufacturing (lithography) realities/non-idealities of today's small geometry process nodes, and ideally take the design context (neighboring shapes on the same layer) into account. For example, the designer can decide to further reduce the spacing between the rectilinear metal shapes, and re-compute/visualize the contours that would be correspondingly manufactured. As the shapes are pushed closer together, the impact on the resultant contours increases, and the shapes and spacings of the contours will change significantly, but these results can be readily determined and visualized per manufacturing-aware design paradigm of some embodiments of the invention.

Figure 9:
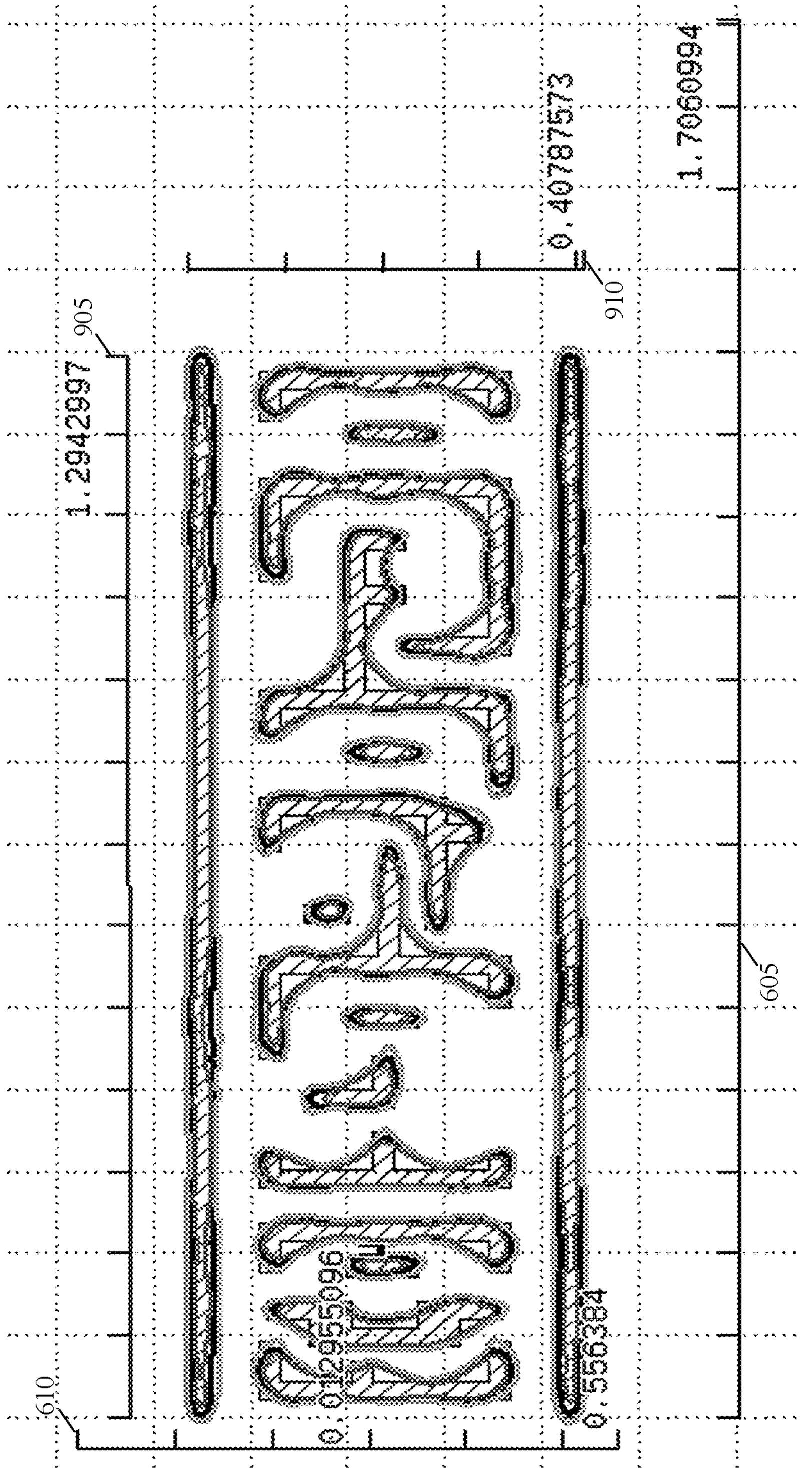

To illustrate the point, an extreme and naive first attempt to compact the design may be to take the entire design, and shrink the entire design by some scale factor. FIG. 9 illustrates the results of a naive attempt of scaling the design by a factor of 0.75. In this example, a second pair of rulers 905 and 910 has been placed (the original rulers 605 and 610 have also been retained) showing the dimensions of the shrunken design. The new design measures 1.29 microns in the X dimension (smaller than the previous design of 1.7 microns), and 0.4 microns in the Y dimension (smaller than the previous design of 0.56 microns).

Figure 10:
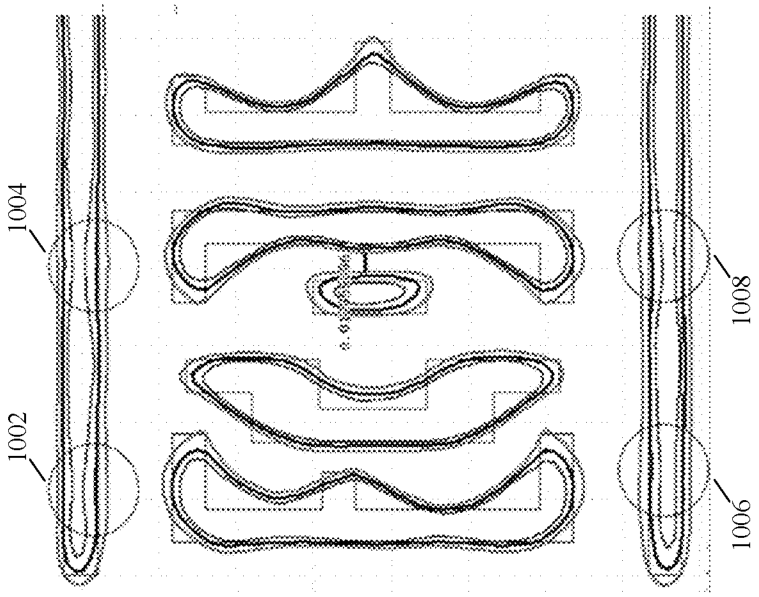

FIG. 10 shows a zoom on the naively shrunken design with four circled regions 1002-1008 indicating power rail pinching at one process corner (inner contours). While the distance between the outer contours of neighboring pairs of shapes may now be reasonable, the circled areas indicate this has come at the cost of significant metal pinching on the power rails, which will lead to yield and/or long-term reliability issues.

When the designer can see such contours almost instantaneously after performing edits such as the global design shrink, the designer can quickly undo the shrink and seek other means to make the design more manufacturable. For example, a user may choose to add width to the power rail to provide extra margin. As another example, a choice may be made to expand the size of the cell to make its yield under all neighborhoods more tractable. Or it may be possible after creative manipulation to shrink the design, yet improve manufacturability. Such operations and decisions can only be interactively performed when the feedback loop to determine and present the predicted-manufactured contours is sufficiently quick, e.g., within 5 seconds or less.

Figure 11A:
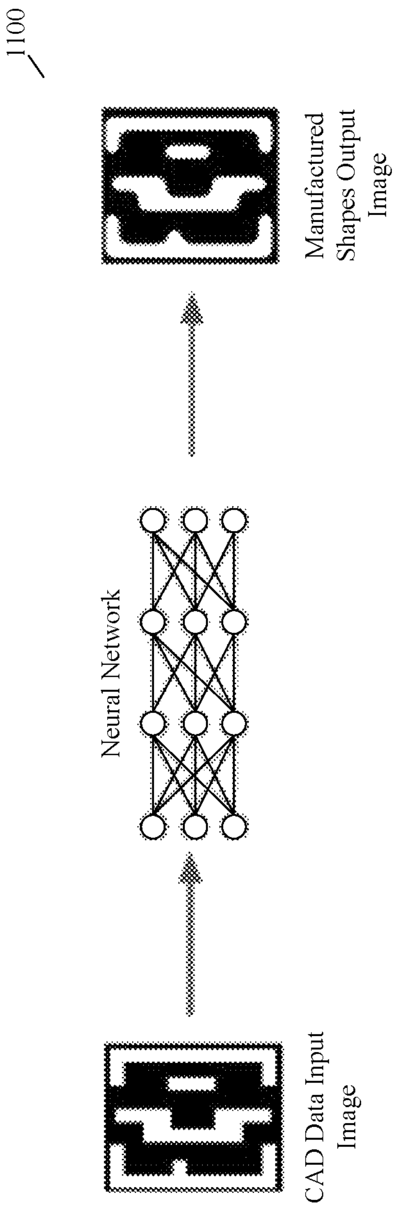
FIG. 11A illustrates the use of a neural network to infer manufactured shapes from CAD (computer aided design) data input.

Some embodiments use the neural network models described in U.S. patent application Ser. No. 16/949,270, which is incorporated herein by reference. These models allow an image representative of a user-edited layout design to be presented as input, and the resulting silicon wafer contours to be produced as output. FIG. 11A illustrates the use of a neural network 1100 to infer manufactured shapes from CAD (computer aided design) data input. This neural network is described in the above-incorporated patent application. When neural networks are executed on modern GPU architectures, the inference time, even for relatively large designs, can be reduced to interactive time frames (i.e. within seconds). While some embodiments employ neural networks, other embodiments use other machine learning processes to formulate predictions as to the eventual shapes that would result once a design is manufactured.

Figure 11B:
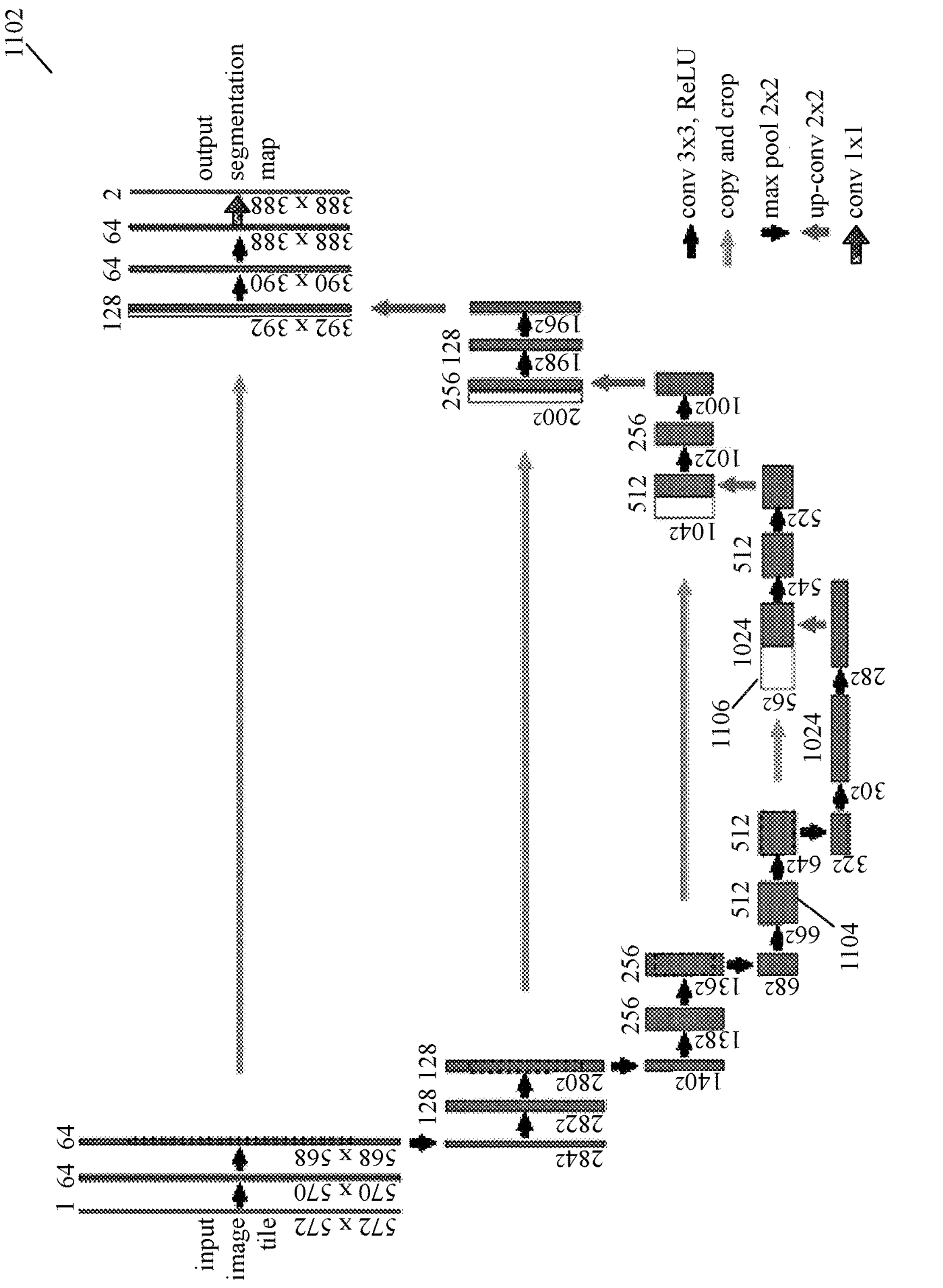
FIG. 11B illustrates an example of an U-Net model architecture.

When the input image is too large to be processed at once, it may be split into a collection of (overlapping) image tiles. Each of the smaller tiles may then be processed by the network, and the output tiles collected and re-assembled into the final output image. In some embodiments, a neural network architecture inspired by an original U-Net model architecture is used. FIG. 11B illustrates an example of an U-Net model architecture. In the U-Net model architecture 1102, each shaded box 1104 corresponds to a multi-channel feature map. The number of channels is denoted on top of the box. The x-y-size is provided at the lower left edge of the box. White boxes 1106 represent copied feature maps. The arrows denote the different operations. At the final layer, a 1×1 convolution is used to map each 64-component feature vector to the desired number of classes. In total, the original network has 23 convolutional layers.

The architecture is essentially an encoder-decoder network, in which the encoding side (left side) and bottleneck layer (bottom) guide the model to learn a low dimensional encoding of the input image. The decoder network on the right side then decodes that low-dimensional representation of the image back to the full output resolution, and both sides cooperate to learn the transformation from the input image to the output image during training. The copy and crop operations act as skip connections which provide additional information from the encoder side of the network to the decoder side to help localize information in the x,y space.

In some embodiments, the inputs to the neural network represent (tiles from) an input image representing the design intent i.e., what is intended to be manufactured, assuming an 'ideal' (but not realistic) manufacturing process. In some embodiments, the output image represents what will actually be manufactured by the realistic manufacturing process, in which sharp corners will be rounded, via or metal shapes drawn as small squares will be manufactured as circles or ellipses, etc. After training the CNN on semiconductor manufacturing image data, the network model weights will be tuned to produce output images reflective of the entire manufacturing process.

Figure 11C:
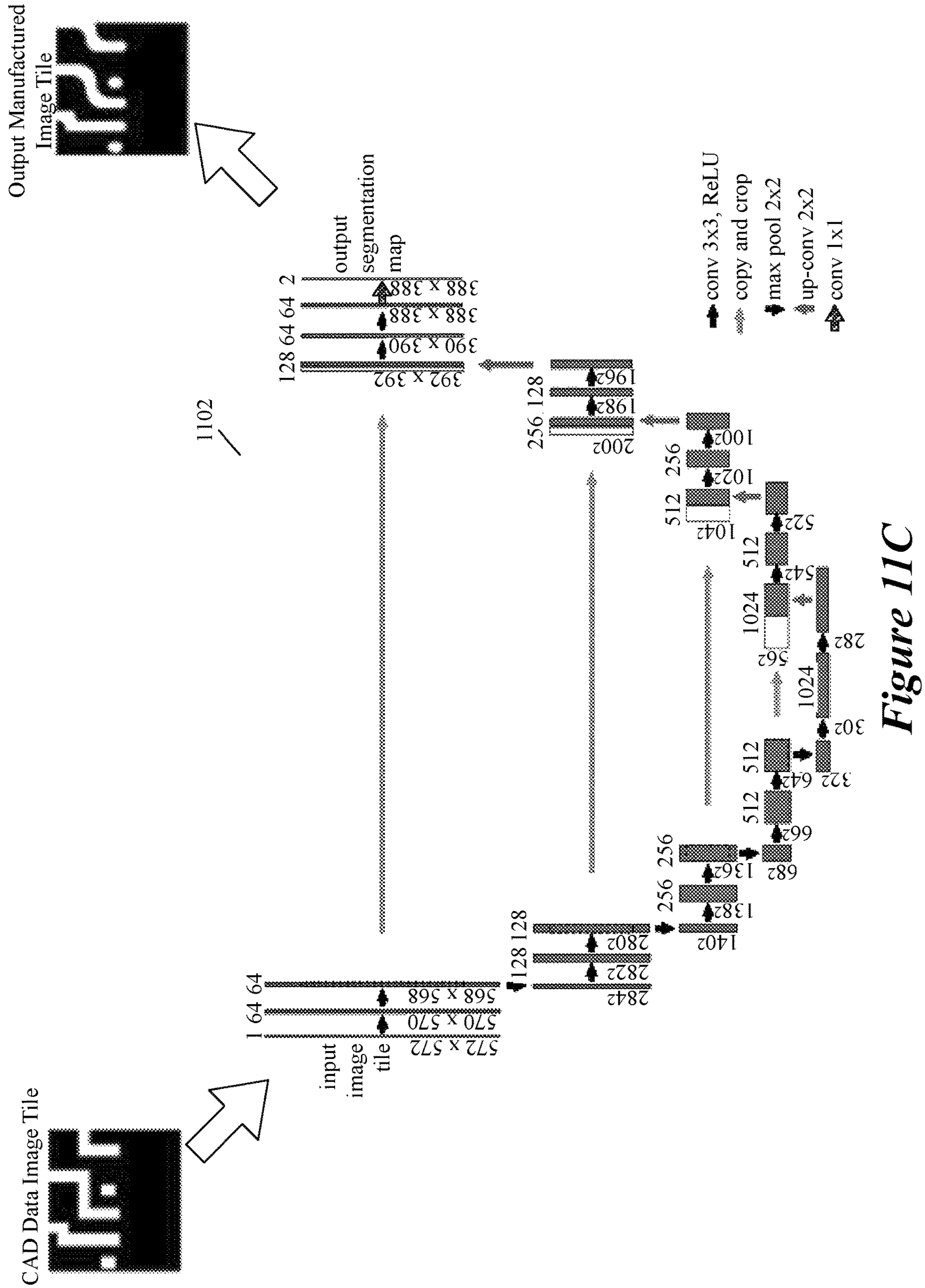
FIG. 11C illustrates the use of the inspired U-Net model architecture in some embodiments to predict manufactured wafer aerial images from rasterized image tiles representing the user-drawn layout.
Figure 11D:
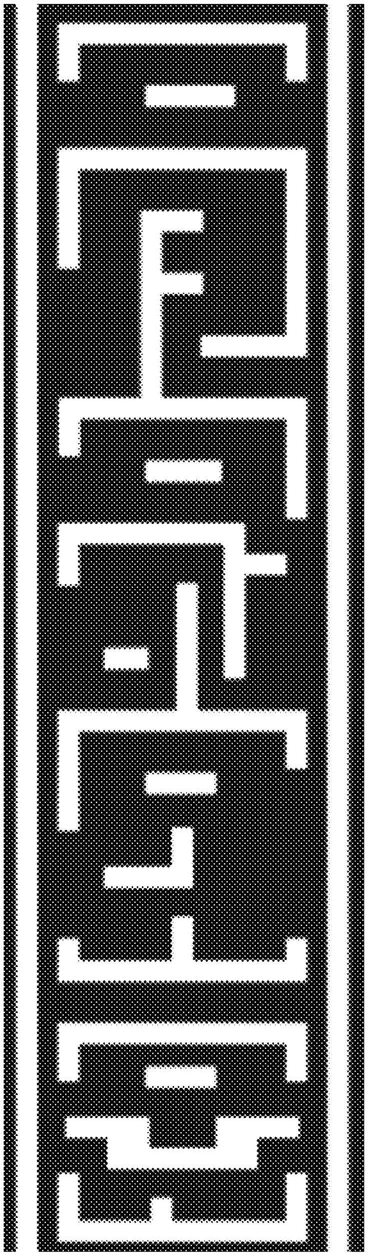
FIG. 11D illustrates an example of the rasterized image corresponding to the desired printed metal for one of the metal layers within a D-type Flip Flop (DFF) standard cell.

FIG. 11C illustrates the use of the inspired U-Net model architecture 1102 in some embodiments to predict manufactured wafer aerial images from rasterized image tiles representing the user-drawn layout. FIG. 11D illustrates an example of the rasterized image corresponding to the desired printed metal for one of the metal layers within a D-type Flip Flop (DFF) standard cell. The white pixels show where metal is intended to be manufactured on a silicon substrate. Conversely, the black pixels show where metal is not intended to be manufactured.

In some embodiments, some modifications to the original U-Net architecture were performed to facilitate the creation of output images reflecting the manufactured semiconductor shapes. One modification involves changing the final output layer of the U-Net from using a sigmoid activation function to using a linear activation function. With this modification, the U-Net can now produce images with gray-scale pixel values containing floating point values that range continuously from 0.0 to 1.0, which are more reflective of semiconductor wafer exposure images.

In some embodiments, for a semiconductor manufacturing application, a U-Net architecture is used as described above, but reduces the initial number of filters from 64 to 32, continuing with a filter doubling after each max pooling operation. This has the effect of greatly reducing the overall number of trainable parameters for the network, while preserving a sufficient level of accuracy for the semiconductor manufacturing application. In some embodiments, different input and output tile sizes are used, for example, 256×256 (with an inner core tile of 128×128). In another embodiment, the network may be further altered by removing some of the layers (shorter 'U' depth), or by adding additional layers (deeper 'U'), as necessary for accuracy. In another embodiment, rather than doubling the number of filters after each downsampling (max pooling) or up sampling convolution, a different ratio may be used. In one embodiment, a fixed ratio (such as 2.0) may be used at each layer, and in an alternative embodiment, a different, layer-specific ratio may be used at each layer. For example, the ratio may progressively increase as we get lower and closer to the bottom bottleneck layer of the 'U' shape, and thereafter correspondingly decrease again as we proceed away from the bottleneck layer and ascend towards the output. These ratios and other network parameters may be tuned as part of a hyperparameter search during the training phases. In an embodiment, the tuning may be repeated for each different manufacturing process, and/or for each different layer in a manufacturing process.

In some embodiments, the network has a single input and a single output, representing the manufactured output image corresponding to a single set of process conditions (i.e., a unique process corner). The input to the network consists of an image corresponding to the CAD data (a tile from the CAD image drawn by the circuit designer), and the output consists of an image corresponding to the accordingly manufactured silicon for that unique set of process conditions. An example of a reassembled tile collection representing a desired DFF circuit metal layer is shown in FIG. 11D.

Figure 11E:
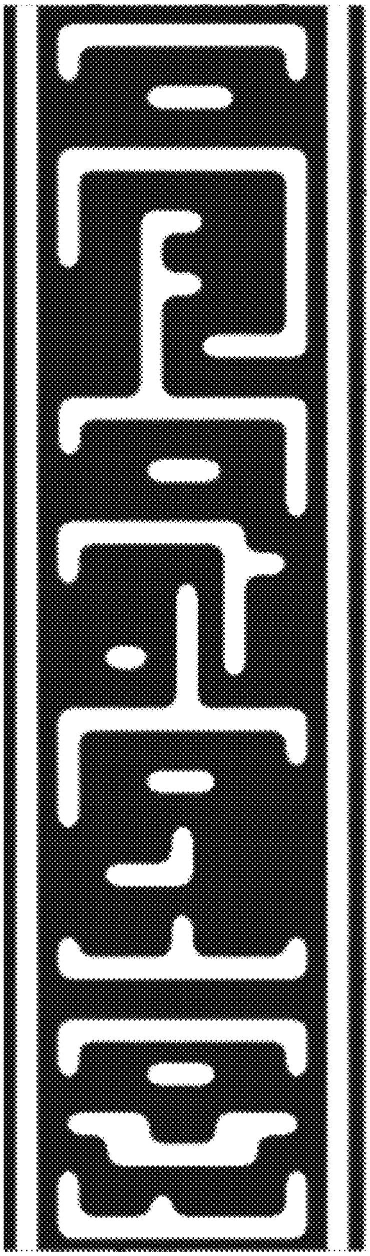
FIG. 11E illustrates an example of the corresponding manufactured output (assembled tile collection).

FIG. 11E illustrates an example of the corresponding manufactured output (assembled tile collection). As shown, each white pixel represents an area where metal is present on the manufactured silicon wafer, and each black pixel represents where the metal is absent. The pixel values are however actually gray-scaled and real-valued, such that some pixel values at the 'edges' of the polygons are between the values 0 and 1.0. This image is produced by re-assembling the tiles produced by a single input, single output, fully-trained deep convolutional neural network as described above.

Figure 11F:
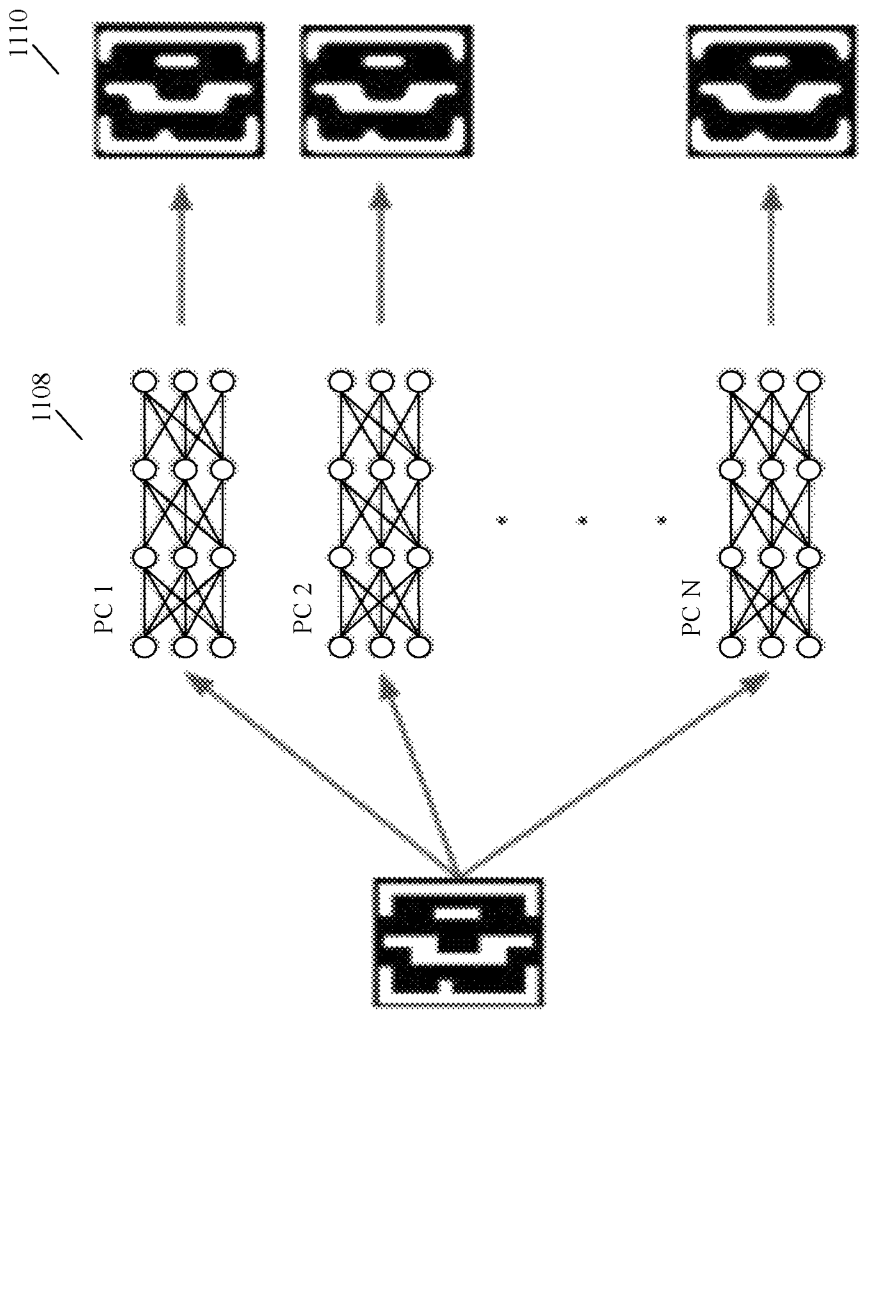
FIG. 11F illustrates multiple networks, each trained to generate an output for a different process corner (PC) corresponding to different manufacturing parameters (MP).

To deal with process variations, i.e., the case of multiple sets of process conditions, multiple copies of the single-output network may be produced in some embodiments, i.e., one network per unique set of process conditions (manufacturing parameter values), and each of these single-output networks may be trained in parallel. FIG. 11F illustrates multiple networks (1108), each trained to generate an output 1110 for a different process corner (PC) corresponding to different manufacturing parameters (MP). After training, each of these networks may be used to infer the output for that unique set of process conditions i.e., that particular process corner, for a given CAD data input image.

Figure 11G:
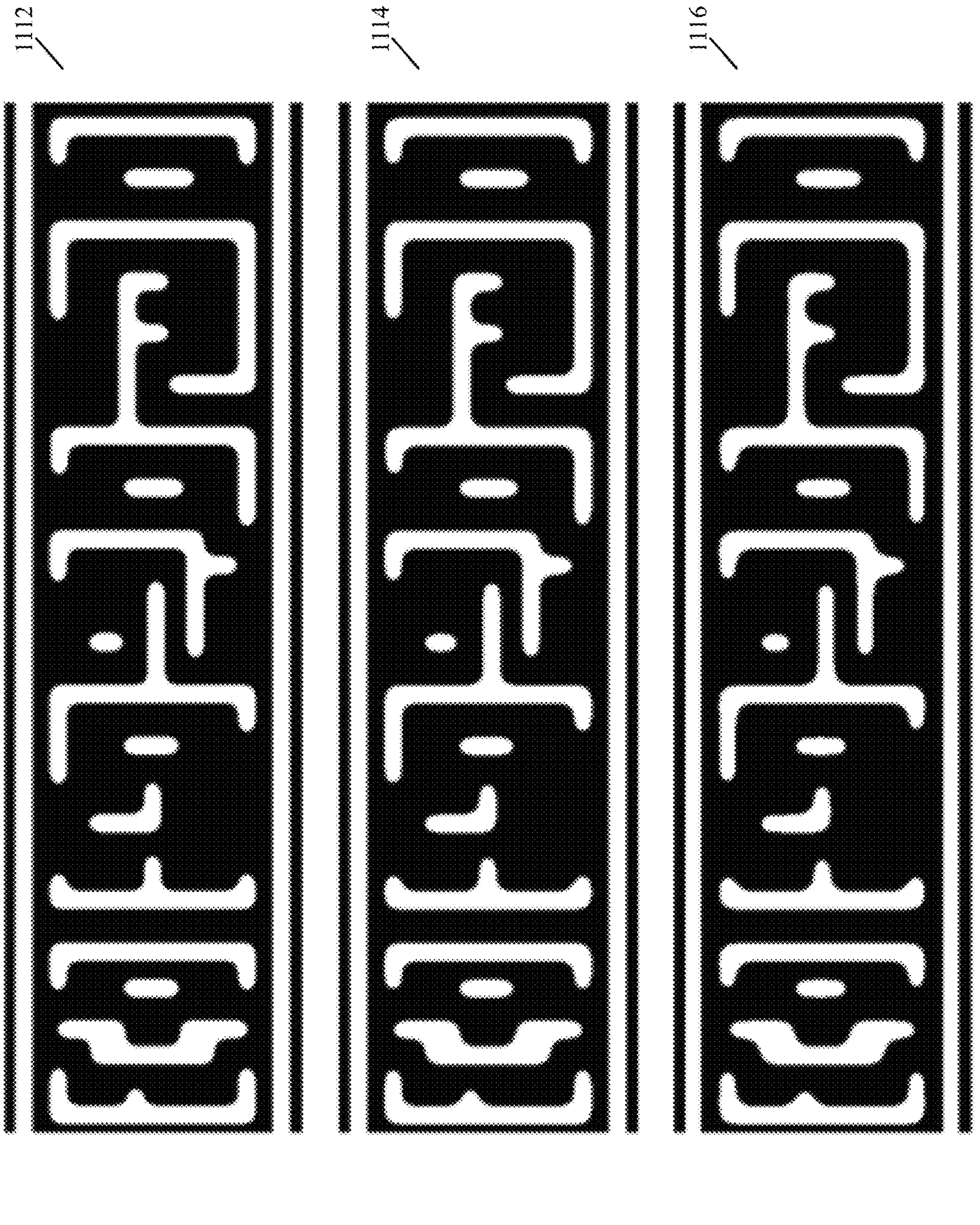
FIG. 11G illustrates an example of an inferred output, in which the reassembled tiles representing the images representative of the manufactured shapes of the DFF design under three different unique process conditions.

FIG. 11G illustrates an example of an inferred output, in which the reassembled tiles representing the images representative of the manufactured shapes of the DFF design under three different unique process conditions. Though similar at first glance, it is apparent upon closer inspection that the three images are different. For example, a different amount of 'corner rounding' is apparent in each. The shapes of the top-most image 1112 are 'closest' to the drawn rectilinear CAD shapes from the image shown earlier. The shapes of the bottom-most image 1116 are perhaps the furthest away with a more significant degree of corner rounding and shape narrowing. The middle image 1114 lies somewhere between these two extremes. While in this example we have shown just three examples as representative of semiconductor manufacturing process conditions for brevity, a more comprehensive set may include additional process parameters, representing the different extremes in mask and wafer manufacturing.

In some embodiments, this per-process-corner inference may be done serially (for example, using a single GPU), and in other embodiments, this per-corner inference may be done in parallel (using multiple GPUs). In a preferred embodiment, the outputs at different process corners may be inferred by a single, multi-output GPU, such as shown in FIG. 22.

In order for the neural network to be able to generate the output image(s), the network must first be trained. The training is performed by exposing the network to a large collection of input/output image samples, where each sample includes an input image (reflective of a portion of an IC design), and one or more output images (reflective of what will be manufactured in response, given that input). To obtain the samples, a number of input designs may be selected or generated. The corresponding output images may be produced from the input designs via a process of detailed simulation involving numerical computations. For each input sample, a single output sample may be produced, reflective of nominal process conditions. Or, multiple output samples may be produced, reflective of different manufacturing process conditions. Exemplary processes for generating input and output training data (i.e., generating training output data from training input data) will be described below by reference to FIGS. 11H, 11I, and 58.

Different manufacturing conditions may yield substantively different manufactured wafer shapes. Manufacturing Parameters (MPs) that may be different include coloring tools and parameters, OPT/ILT tools and parameters including light source and wafer process model parameters, MPC tools and parameters including mask process model parameters, fracturing tools and parameters, mask writing tools and parameters, mask processing parameters, and wafer process and parameters including light sources and wafer processing parameters. While these parameters are somewhat interdependent and collectively form a high dimensional space, it is common in the art of semiconductor manufacturing to attempt to reduce this to a lower dimensional space. Parameters associated with mask manufacturing are collectively reduced to a single dimension represented by dose margin variations, and those associated wafer manufacturing are reduced to two primary dimensions: dose-margin variations and depth-of-focus variations. The majority of the total variance introduced by the original (large) set of parameters can therefore be expressed by variations in this much smaller set of independent parameters.

Figure 11I:
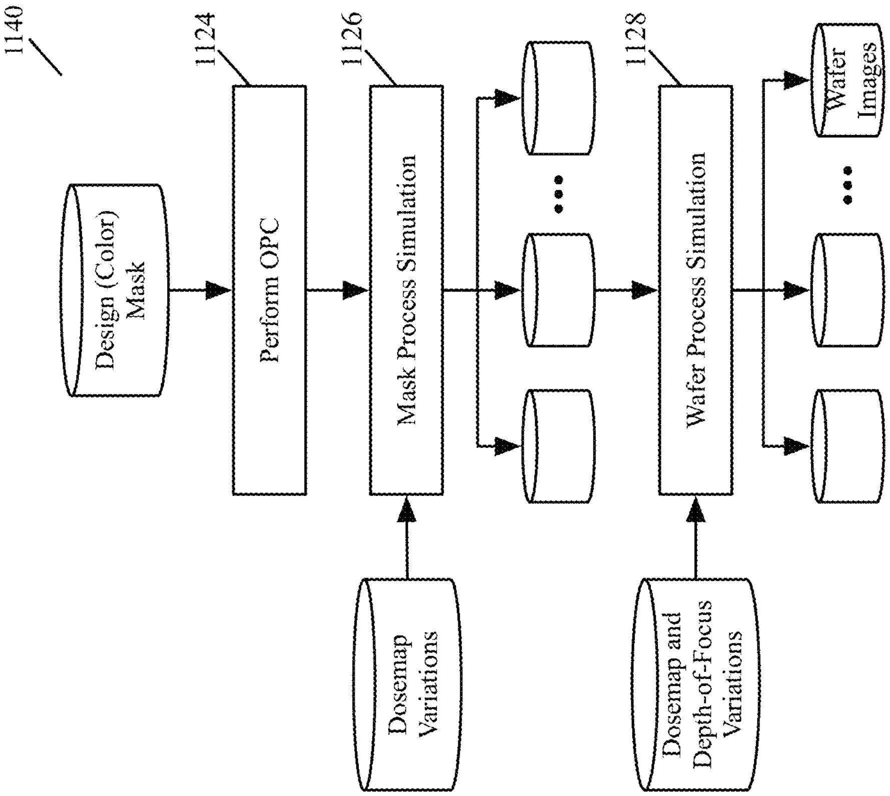
FIG. 11I illustrates an example of a data flow diagram in which these inputs are provided to the mask and wafer process simulation steps.
Figure 11H:
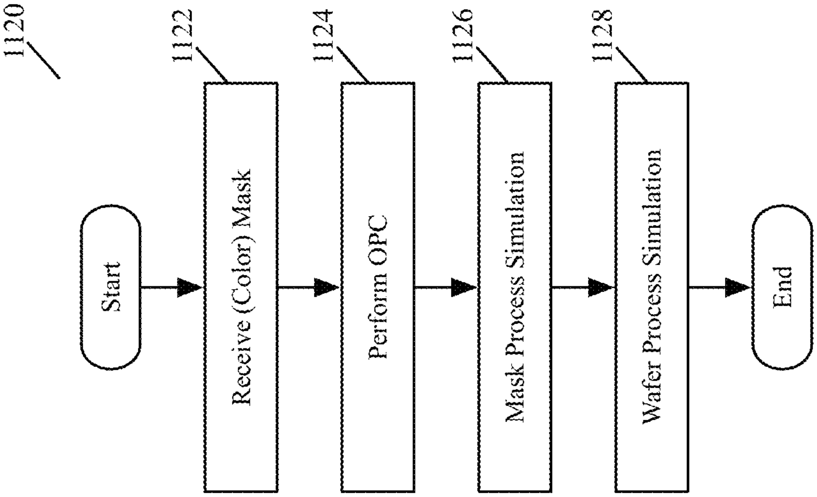
FIG. 11H illustrates a process of the overall simulation by which the output samples can be generated given a received input design sample.

FIG. 11H illustrates a simulation process 1120 that is used in some embodiments to produce an output training sample for a received input design training sample. In some embodiments, the input sample is an entire IC design, while in other embodiments, the input sample is a portion of an IC design in some embodiments.

As shown, the process 1120 starts by performing (at 1122) a coloring operation that separates an input sample into multiple mask layers. In the coloring operation, each feature of the input sample on a reticle layer is colored to reflect the assignment of a feature to a particular mask layer. After the colorization operation, the process 1120 performs (at 1124) an optical proximity correction (OPC) operation to produce one or more possible sets of mask designs, with each set of mask design corresponding to the input sample.

For the input sample, the generated mask designs in some embodiments include a nominal mask design with variation. In some embodiments, the possible mask designs produced at 1124 may be combined to create the nominal mask design with variations. Conventionally, the nominal mask design can be determined using a nominal dose, such as 1.0 and calculating a nominal contour of a mask design at a threshold, such as 0.5. In some embodiments, the nominal contour of the mask design is calculated from several possible mask designs. In some embodiments, the OPC operation includes an ILT (inverse lithography technology) operation. The ILT operation in some embodiments creates ideal curvilinear ILT patterns, while in other embodiments, the ILT operation rectilinearizes the curvilinear patterns.

The process 1120 performs (at 1126) a mask simulation operation to produce mask data preparation (MDP), which prepares the mask design for a mask writer. This operation in some embodiments includes "fracturing" the data into trapezoids, rectangles, or triangles. This operation also includes in some embodiments Mask Process Correction (MPC), which geometrically modifies the shapes and/or assigns dose to the shapes to make the resulting shapes on the mask closer to the desired shape. MDP may use as input the possible mask designs or the results of MPC. MPC may be performed as part of a fracturing or other MDP operation.

After the mask simulation, the process 1120 performs (at 1128) a wafer simulation operation that calculates possible IC patterns that would result from using the generated masks. In some embodiments, the wafer simulation operation (at 1128) includes a lithography simulation that uses the calculated mask images. The operation at 1128 calculates several possible patterns on the substrate from the plurality of mask images.

For the input sample, the generated IC pattern in some embodiments represents an output pattern or a range of output patterns (when the produced shapes have multiple contours to account for process variations and manufacturing parameter variations). The input sample and the generated output pattern represent a known input with a known output that are used to train the machine-trained neural network in some embodiments. Once trained, the neural network can then be used during compaction to assist in the compaction operations in the manner described above.

It will be appreciated by those of ordinary skill that the process 1120 may be somewhat more, or less, involved than that shown. Typically, the mask process simulation software can be parametrized i.e., instructed to perform the mask process simulation under a set of mask process (e.g., dosemap variation) parameter values. Likewise, the wafer simulation software can be parameterized i.e., instructed to perform the wafer process simulations under a set of wafer process (e.g., dosemap variation and depth-of-focus variation) parameter values.

FIG. 11I illustrates an example of supplying these process variations (e.g., dosemap variation and depth-of-focus variation) in manufacturing parameters as input to the simulation process that is used to generate output training data from input training data. The process 1140 illustrated in FIG. 11I is similar to the process 1120 of FIG. 11H, except that dosemap variations are provided to the mask process simulation 1126 and dosemap and depth-of-focus variations are provided to the wafer process simulation 1128.

In response, the mask process simulation operation 1126 in FIG. 11I may produce a number of image files, representative of manufacturing the mask under the variety of mask process variations (dosemap variations). In some embodiments, this is a number of mask files, representative of the nominally produced mask (dosemap parameter at nominal value), and of some extreme corner conditions (dosemap parameter at some 'extreme' values e.g., some percentage such as +/−10% of nominal values). Percentage values may be specified that represent the true mask manufacturing process extremes, or percentage values may be specified that represent other limits e.g., statistical limits such as 1-sigma, 2-sigma, or 3-sigma values.

For each of the so-produced manufactured mask images (as determined by simulation), the wafer process simulation operation 1128 in FIG. 11I may then be performed. As for the mask process simulation operation, the wafer process simulation operation 1128 produces multiple wafer images, representative of using the mask to manufacture a silicon wafer layer under the variety of wafer process variations (dosemap variations, in addition to depth-of-focus variations). In some embodiments, this is a number of wafer image files, representative of the nominally produced wafer surface (dosemap parameter at nominal value, in addition to depth-of-focus at nominal value), and of some extreme corner conditions (dosemap+depth of focus parameters at some 'extreme' values e.g., some percentage such as +/−10% of nominal values). Percentage values may be specified that represent the true wafer manufacturing process extremes, or percentage values may be specified that represent other limits e.g., statistical limits such as 1-sigma, 2-sigma, or 3-sigma values.

In some embodiments, the mask and wafer manufacturing parameters distributions may be taken as joint distributions, and the percentage values chosen to reflect the 1-sigma, 2-sigma or 3-sigma joint probability limits. (Given random variables X, Y, . . . that are defined on a probability space, the joint probability distribution for X, Y, . . . is a probability distribution that gives the probability that each of X, Y, . . . falls in any particular range or discrete set of values specified for that variable. In the case of only two random variables, this is called a bivariate distribution, but the concept generalizes to any number of random variables, giving a multivariate distribution, as will be familiar to those of ordinary skill). In some embodiments, a Monte Carlo simulation may be performed in which the independent parameters are randomly drawn from their distributions or joint probability distribution.

The collection of wafer images so-produced are then reflective of the manufacturing process variations at the extreme limits, or at the +/−N-sigma values. This collection of images may then be further aggregated down to a nominal image, a (pixelwise) minimum image, and a (pixelwise) maximum image, reflective of the process parameters at the corresponding +/−N sigma values. The process may be repeated for different values of N e.g., for N=1, 2, 3.

As a result of this process, given any input design mask reflective of a portion of a design, the simulation process produces multiple images reflective of the entire manufacturing process at the nominal process values, and at extreme values reflective of absolute limit values, or statistical values such as 1, 2 or 3 sigma. Each of these outputs we refer to as a 'set' of process conditions, such as nominal, minimum or maximum.

Different statistical neural network models may then be trained by exposing the neural network to image sets corresponding to the nominal, minimum and maximum values at the various N sigma levels. At the end of the training, each of these neural networks is then capable of producing images reflective of the statistical N-sigma values, i.e., reflective of the variances in manufacturing at the corresponding N-sigma values.

FIG. 11G shows nominal, minimum and maximum images produced for a tightly controlled process, in which the variations are relatively small compared with the nominal conditions. The variations are small, but not zero. However, the corresponding images for a modern, small geometry nanometer-era process will exhibit far larger image variations than shown in FIG. 11G, and these larger variations will be illustrated by additional figures in this disclosure in the context of various circuit design applications.

The process of FIG. 11I may take a long time, but it only needs to be performed once per manufacturing process for which the parameter variations are known. It does not need to be performed once-per-design intended to be manufactured on the manufacturing process however, hence the computational cost of generating the data to train the models can be amortized across many designs.

Returning now to the discussion on design compaction, to accelerate the process of generating predicted shapes, some embodiments perform additional operations over and above those described previously with respect to FIG. 11A. These additional operations are needed because even with a quick neural network inference process, the various overheads involved in setting up the problem and getting the data to the neural network, and subsequently post processing the results produced by the neural network to make them presentable in the layout editor, make the overall process take substantially longer. Some embodiments are tailored towards removing or greatly reducing the setup costs, allowing neural networks such as described in U.S. patent application Ser. No. 16/949,270 to be used in conjunction with an interactive layout editor, in truly interactive time frames (seconds or less), in tight interactive (edit, visualize, edit, visualize . . . ) loops. As a result, various different potential layout-modification solutions can be enumerated over and evaluated very quickly by the circuit layout designer, allowing for the best solutions to be quickly determined and adopted.

Figure 12:
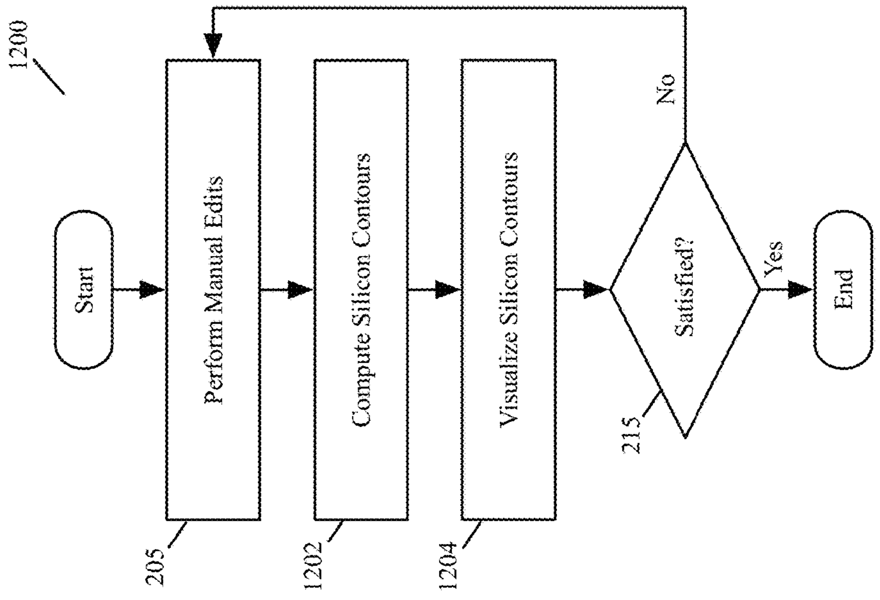
FIG. 12 illustrates a process that is a more-detailed representation of the process of FIG. 2.

FIG. 12 illustrates a process 1200 that is a more-detailed representation of the process 200 of FIG. 2. The process 1200 shows that the visualization operation 210 is composed of two sub-operations, which are (1) a computation operation 1202 to compute the silicon contours of each component in the selected design portion, and (2) a presentation operation 1204 to display a visualization of the computed silicon contours.

Figure 13:
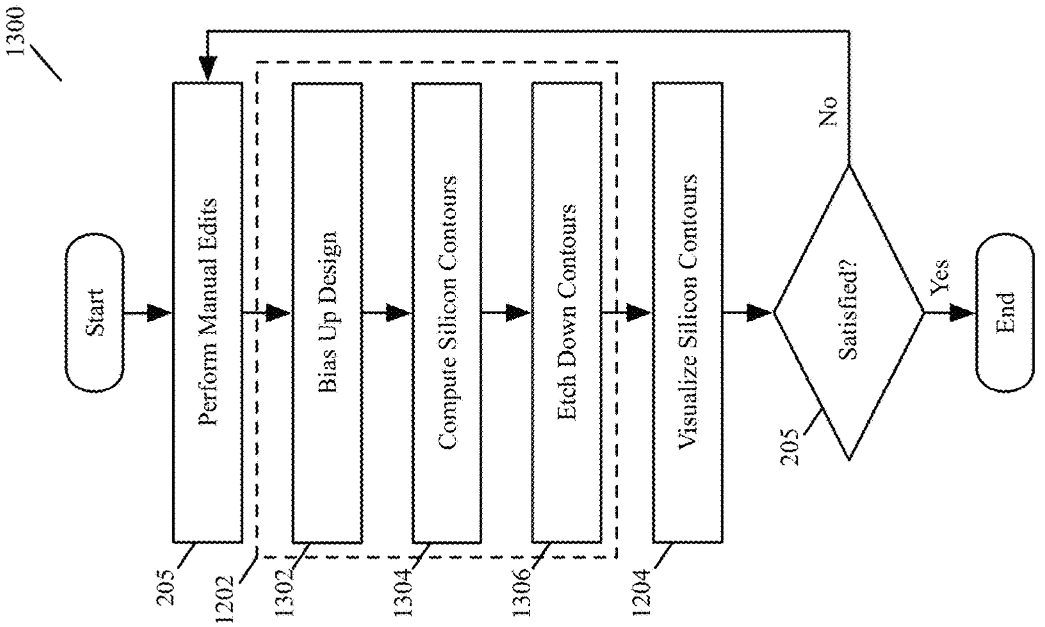
FIG. 13 illustrates further detail regarding the computation operation in some embodiments.

In some embodiments, significant extra computational operations are required in order to compute the silicon wafer contours in a form that makes them presentable within the layout editor. FIG. 13 illustrates further detail regarding the computation operation 1202 in some embodiments. This figure illustrates that in order to compute the contours, the data from the layout editor must first be prepared so that it is in a form suitable for consumption by the neural network, the neural network must perform its processing, and the output from the neural network must then be post-processed to a form suitable for rendering within the interactive layer editor tool.

Specifically, FIG. 13 illustrates that computing the silicon contours further requires additional (1) bias operation 1302 that pre-processes the data to be in a form suitable for consumption by the neural network, followed by (2) a compute operation 1304 to use a neural network to generate the silicon contours of each component in the selected design portion, and then (3) an etch-down contour operation 1306 that post-processes the data to be in form suitable for rendering within the interactive layer editor tool. In some embodiments, biasing increases the size of the component shapes in the design (e.g., to make the shapes easier to manufacture), while the etching operation trims down the size of the component shapes in the design.

As part of semiconductor manufacturing at advanced, small geometry process nodes, the shapes in the IC layout database are pre-processed in a size-up or 'bias-up' operation, along with corner rounding, which enlarges the shapes and generates a target wafer shape that is more realistic to manufacture (since 90 degree corners are practically impossible to manufacture), prior to mask creation. An example of a bias-up operation performed in the geometry domain is to compute all edges of all polygons, and then increase all edges by a certain length. Sizing is typically specified at drawn dimensions (1×) before reticle scaling is applied. Sizing is typically applied "per side," which means the distance each edge of a polygon moves towards the interior or exterior of the polygon. For example, a square that is 1.25 um per side that is sized −0.125 um per side will shrink the square to 1.00 um per side, a total shrink of −0.25 um in both X and Y dimensions.

Masks are generated for the corner rounded versions of the corresponding biased-up shapes, and optimized to ensure the best fidelity in printing on the silicon wafer, using a process known as OPC (Optical Proximity Correction). At advanced process nodes, an advanced form of OPC known as ILT (Inverse Lithography) is often performed to achieve the best printability. ILT sometimes produces Manhattanized shapes and sometimes produces curvilinear shapes. ILT is a very computationally demanding process, including simulations or emulations that (1) predict how wafer manufacturing, and perhaps also mask manufacturing, may systematically deviate from the desired target shape, and (2) compensate for them. In order to determine the final silicon contours after these operations, some embodiments reflect all of these steps in the computations for each color mask when multiple patterning is performed. For instance, in FIG. 4, there are two color masks involved.

Some embodiments employ simple models for bias up and etch processes that are evaluated within the layout editing tool itself, e.g., a wafer etch process is modeled in some embodiments as a constant etch that is a bias-down operation that complements the bias up model. When more complex models are required, some embodiments use manufacturing simulation software and accompanying hardware to perform the bias up and/or etch modeling. Other embodiments are used in conjunction with Extreme Ultraviolet Lithography (EUV) manufacturing. In these embodiments, the biasing and etch steps are omitted or implemented as pass-thru operations.

After creating the biased up mask shapes (at 1302), the process 1300 computes (at 1304) the on-wafer contours. As previously noted, manufacturing computational software is used in some embodiments to perform these steps, however such software is somewhat computationally expensive, and has operational timelines that are not ideal for the interactive use model even with GPU support. Accordingly, some embodiments use machine-trained processes (e.g., machine-trained neural network or other machine-trained networks) in lieu of such computational software to perform the wafer contour determination step. As mentioned above, trained neural networks such as described in U.S. patent application Ser. No. 16/949,270 can be used to vastly improve the performance of the contour determination step, when the neural network inference operations are performed on a GPU device.

In order to allow a neural network to perform its processing, the biased up mask data needs to be converted from its geometrical form (edges and point arrays in geometry domain) to the raster domain, i.e., converted to a pixel image format. Rasterization of polygons is a fundamental technique of geometric data processing widely used in the electronic design automation (EDA) industry in particular, and many other industries in general. A set of polygons in EDA (e.g., the shapes defining the physical design of an integrated circuit) is usually represented in GDSII or OASIS format as arrays of vertices, and the rasterization process seeks to represent them by grayscale pixels on a grid. Some embodiments use large-resolution curvilinear formats that use techniques such as splines. A number of formats represent pixel dose data in a compressed way to minimize data size and transmission time. Different embodiments use different methods for expressing shapes, however, many of the embodiments use a transmission mechanism that least impacts accuracy while being as compact as possible.

Figure 14:
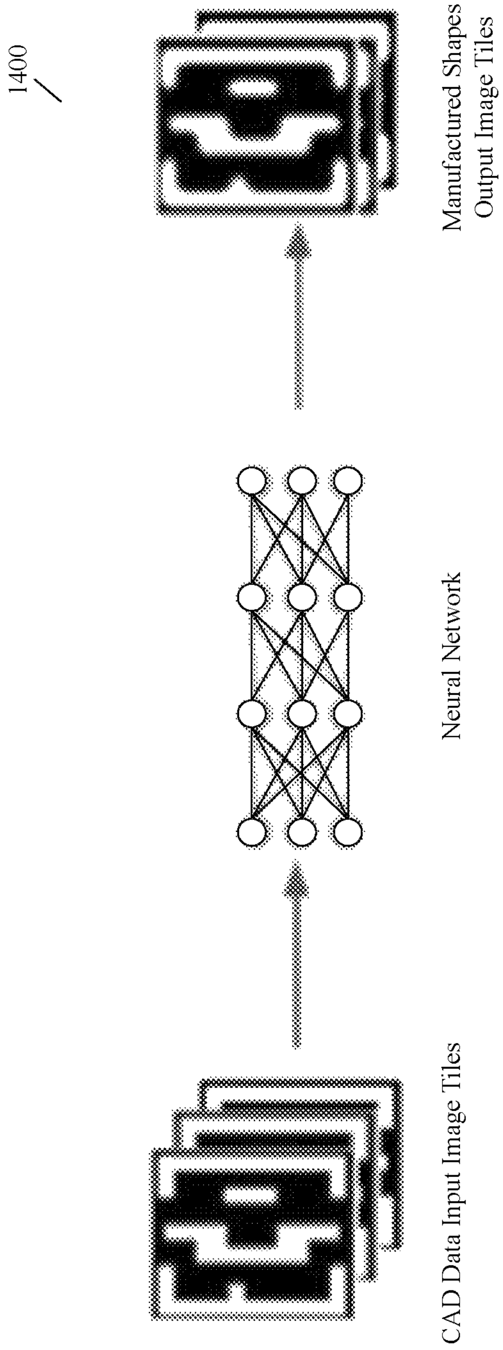
FIG. 14 illustrates an example of a neural network that receives image tiles representative of the biased-up mask shapes, and produces image tiles representative of the corresponding silicon wafer contours, in an operation known as inference.

Once the neural network receives the data in the raster domain, it processes the data and produces a raster image of the manufactured silicon contours as output. To allow the raster images to fit in GPU memory along with the neural network model, the images need to be broken up into smaller image tiles, as outlined in U.S. patent application Ser. No. 16/949,270. FIG. 14 illustrates an example of a neural network 1400 that receives image tiles representative of the biased-up mask shapes, and produces image tiles representative of the corresponding silicon wafer contours, in an operation known as inference.

The process 1300 in some embodiments performs post processing to stitch the neural network-produced (inferred) output tiles into a final, full-sized raster image of the manufactured design. In some embodiments, the process 1300 also performs additional post-processing operation to convert the raster images into geometrical images suitable for rendering in the layout editing tool, which does not operate in the raster domain. This last form of post processing is known as 'contouring', and may be performed by manufacturing computational software and/or hardware such as TrueMask® DS.

Figure 15:
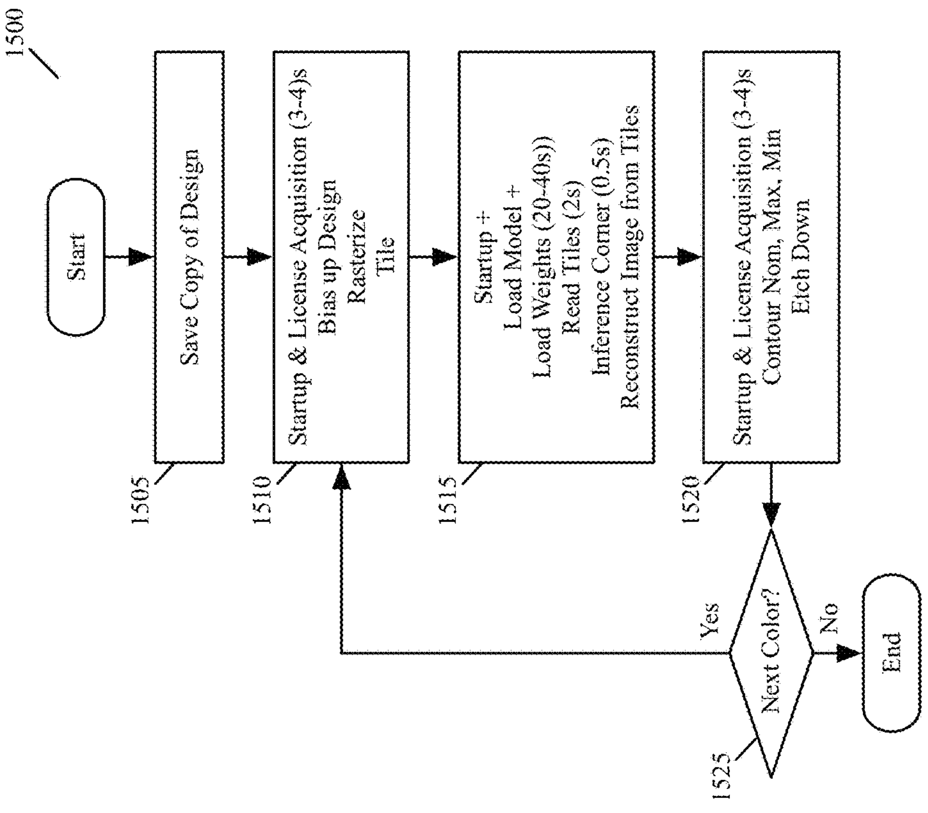
FIG. 15 illustrates an example of the overall process that incorporates all of the operations to produce the contours by leveraging neural networks.

FIG. 15 illustrates an example of the overall process 1500 that incorporates all of the above-described operations to produce the contours by leveraging neural networks. This process 1500 is performed by several different processes, which are identified by text legends placed next to each operation. These processes are a layout editing software, a manufacturing software process, and a deep learning software process. As shown, the layout editing software initially saves (at 1505) a copy of the design.

Next, at 1510, the manufacturing software process starts up, acquires license, biases-up the design components for one of the colors, converts the design to a rasterized format, and tiles up the tiles. At 1515, the deep learning software process starts up, loads its neural network along with its weights, iteratively reads and processes tiles of input to produce predicted output design(s), and then stitches together the outputs it produces for the processed tiles. In some embodiments, the neural network produces N (e.g., 3) different predicted output designs for N (e.g., 3) different process variations, with each predicted output design expressed in terms of pixels values that have to be processed to derive the component contours for each process variation. Instead of one neural network, other embodiments use N neural networks, with each neural network producing one of N different predicted output design for one of N different process variations.

At 1520, the manufacturing software process (1) starts-up again, (2) analyzes the pixel values in each predicted output design that is produced by the neural network(s) to produce the component contours (e.g., the nominal, maximum and minimum contours) of the predicted output design, and then (3) etches down the predicted contoured design. At 1525, the manufacturing software process determines whether it has processed the design components for all of the colors. If so, it ends. Otherwise, it returns to 1510 to repeat its operation for another set of components of another color.

Figure 16:
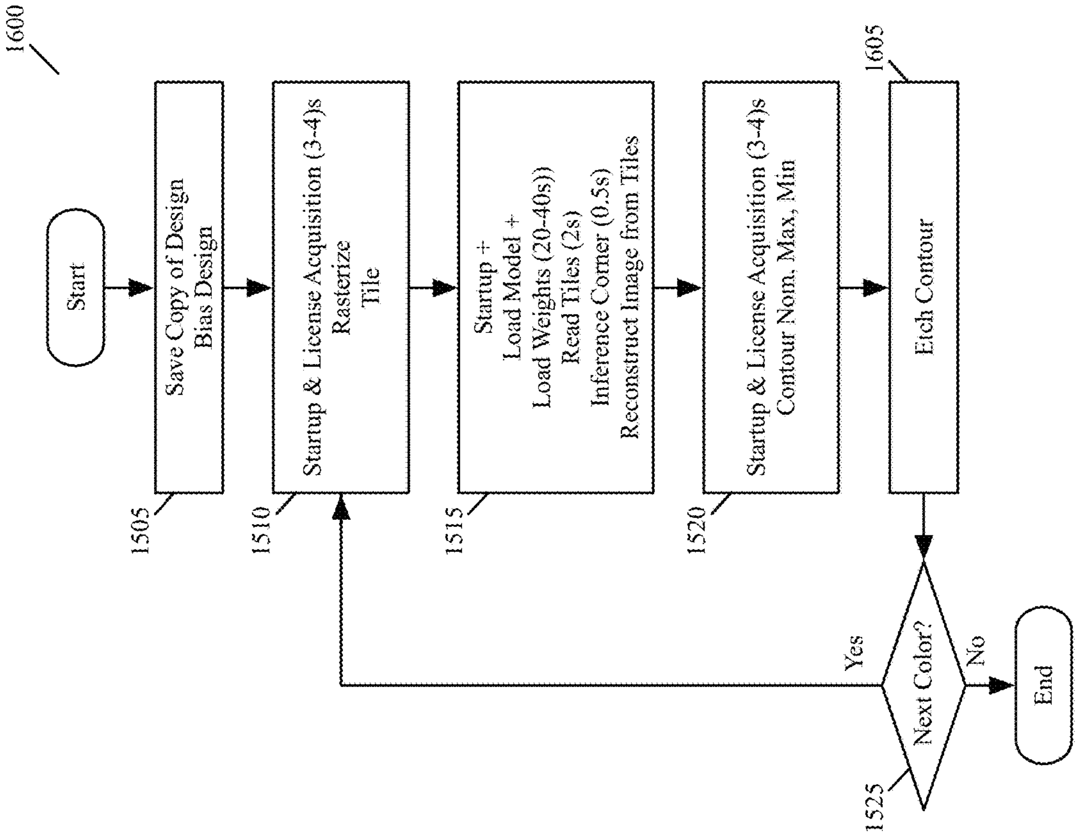
FIG. 16 illustrates a process that divides up the sub-operations somewhat differently than the process of FIG. 15.

Other embodiments divide up the sub-operations of the process 1500 differently. FIG. 16 illustrates a process 1600 that divides up these sub-operations somewhat differently than the process 1500. In the process 1600, the bias and etch sub-operations are performed by the layout editing software instead of the manufacturing software process. Specifically, the layout editing software performs the bias operation at 1505, and performs the etch operation at 1605.

The start-up time and license acquisition of the manufacturing software process, and the start-up time and the network load-up time of the neural network process, add delays to the overall speed of the process 1500. The inference work of the neural network (the time taken to produce its outputs once the model has been loaded and its inputs have been made available) may be quite short (often of the order of less than a second). However, there are various overheads associated with starting up the manufacturing software process to prepare that input (acquire license, perform the rasterization and tiling steps), and converting the network-produced output to a form suitable for rendering in the layout tool (reconstructing the manufactured contour image from the tiles, acquiring license and contouring from raster domain to geometry domain and simulating the etch step).

The time delay associated with these overheads is not acceptable in some instances. Moreover, rasterization, tiling, neural network inference, reconstruction, contour operations steps need to be performed once per color mask. Also, as mentioned above, some embodiments present to the user not only the nominal manufacturing process wafer contours, but also those that correspond to the outer (maximum) and inner (minimum) contours, reflective of manufacturing process variations.

Moreover, when two color masks are involved (double patterning), and three process conditions (nominal, maximum and minimum) are to be considered for each mask, that is a total of six sets of contour-determination operations that have to be performed. When the manufacturing software process alone takes 3 seconds to start up and acquire its license, this requires a minimum overhead of 18 seconds. If the neural network software takes an additional 20-40 seconds to start up, load its libraries, the neural network model and the neural network weights, an additional 120-240 ((20-40)*6) seconds of overhead is added.

Hence, sequential data processing flow that starts up the necessary processes when needed, and waits for each to finish sequentially by the process 1500 or 1600 of FIG. 15 or 16 is not used in some embodiments. In its place, some embodiments use the novel software architecture 1700 of FIG. 17, which greatly improves the throughput time of the interactive-editing process by improving the operation and communication of the layout editor, manufacturing software server process and the neural network software server process.

In this example, the data flow has been modified to allow three concurrent independent execution sequences (referred to as flows below). In some embodiments, these may map to multiple threads of execution, while in other embodiments they map to multiple cooperating operating system processes. For instance, in the example illustrated by FIG. 17, as well as other examples illustrated in FIGS. 18-21, the independent execution sequences are (1) separate threads of one process, (2) separate processes, and (3) separate one or more threads of two or more processes. Multiple operating system processes may be required in order to utilize multiple GPU resources.

Figure 17:
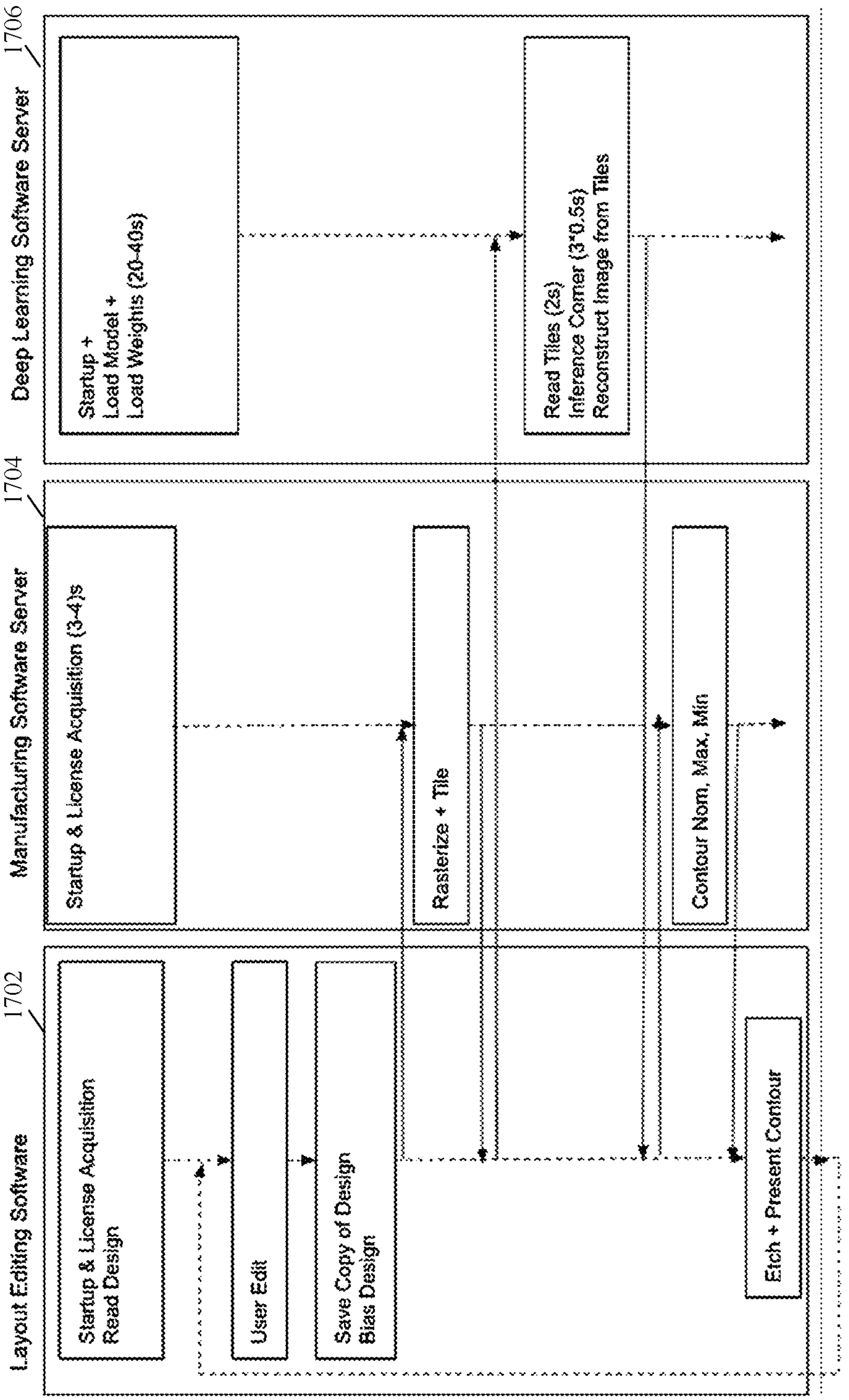
FIG. 17 illustrates the use of a novel software architecture which greatly improves the throughput time of the interactive-editing process by improving the operation and communication of the layout editor, manufacturing software server process and the neural network software server process.

In FIG. 17, the first execution flow 1702 represents the layout editor software, with which the user performs the edits and visualizes the results. In some embodiments, the layout editing software process runs on a non-GPU enabled system. The second flow 1704 represents a manufacturing software process server. This server performs the rasterization and tiling operations, and also the contour operations in which the raster images produced by the neural networking software server are converted back to the geometry domain for rendering in the layout editing software. In some embodiments, the manufacturing software process server is pre-launched by the layout editor software, e.g., when the verification tool 500 illustrated in FIG. 5 is selected by the designer.

The third concurrent execution flow 1706 is the neural networking software itself, containing the trained neural network, which is responsible for inferring the wafer contours from the rasterized and tiled images produced by the manufacturing software server. To achieve the required performance, this process runs on a GPU-enabled system. In some embodiments, the neural networking software process is launched by the layout editor software, e.g., when the verification tool illustrated in FIG. 5 is selected by the designer.

As shown in FIG. 17, the neural networking software server process takes the output tiles produced by the neural network, and reassembles them to reconstruct the full size raster image. In an alternative embodiment, this reconstruction process is moved from the neural networking software server to the manufacturing software process server.

In some embodiments, the three processes 1702, 1704 and 1706 are started up concurrently (e.g., by a wrapper script used for launching the layout editor). In further embodiments, the manufacturing software server process 1704 and neural networking software server process 1706 operate as servers, waiting for instructions to arrive via network sockets (e.g., Internet sockets), once they have finished their initialization processes. Hence, while the layout editor software is acquiring its license and loading the IC layout design, the manufacturing software server may also be likewise starting up and acquiring its license, and the neural networking software server may also be likewise going through its initialization, which includes the relatively lengthy steps of loading the neural network model and setting the neural network weights. Because these three processes are performing their initializations concurrently, rather than serially as shown in FIG. 15, these initialization times are removed from the inner-loop time to process the design and render the contours after the user performs interactive edits, thus greatly improving the turn-around time in each iteration of the edit, compute, and visualization operations of the interactive editing tool of some embodiments. Thus, in the architecture of FIG. 17, the initialization times for the three major processes have been moved up-front before the interactive editing loop, and hence are removed from the computation step performed after each user edit in the edit, compute, visualize loop.

In FIG. 17, as well as other sequence diagrams discussed below, boxes are drawn around sub-processes that consume significant CPU or GPU time. Dashed vertical arrowed lines represent periods of essentially idle time, where the corresponding software processes waits for an input from the user, or one of the other processes involved. Horizontal arrowed lines represent data transfer from one process to another. The communication between the processes in some embodiments are Internet/network socket communications. Also, in some embodiment, horizontal arrowed lines flowing from left to right represent a client-side, socket-based request for a service to be performed. On the other hand, horizontal arrowed lines flowing from right to left represent a server-side, socket-based response indicating that the service has been performed and that the results are available. The server-produced results may be stored in networked disk files, for example, which may then be accessed by the client. After receiving a server response, the layout editor client may perform additional processing, ready another set of files for consumption by the server process/processes, initiate another service request, await a response, and/or consume the files representing the result of the server side service/services.

In FIG. 17, the manufacturing software server 1704 begins listening for and accepting socket communications after it has initialized, obtained its license, etc. Likewise, the neural networking software server 1706 begins listening for and accepting socket communications after it has initialized, and loaded the neural network model and weights. In some embodiments, the three processes 1702, 1704 and 1706 can run on the same machine, or on separate networked machines. Ideally, the neural networking software process 1706 runs on a machine with GPU hardware support, to allow for the maximum throughput during neural network inference.

After a user uses the layout editing software and performs a layout edit and requests to see the manufacturing contours, the layout software 1702 saves a copy of the design (reflective of the latest edit), ensures the shapes have been biased up as appropriate to reflect manufacturing, and then sends a client request to the manufacturing software server 1704 to rasterize and tile the design, in order to prepare it for neural networking inference by the neural network. In other embodiments, the biasing up process is performed by the manufacturing process server 1704 rather than the layout editing software client 1702. Once the manufacturing process server indicates via a socket response that the data is ready for deep learned inference, the layout editor in some embodiments sends a socket-based client request to the neural networking software server, informing it of the location of the data tile files representing the rasterized, biased up design, and requesting that the contours be computed.

In response, the neural networking software server 1706 loads the data in the image tiles, uses the trained neural network to quickly perform an inference operation that produces output images tiles representing the silicon wafer shapes in the raster space. In some embodiments, the neural networking software server then reassembles these tiles to form a larger image of the silicon wafer shapes in the raster space, before responding to the client a message indicating that the data is available. In other embodiment, the neural networking software server 1706 does not reassemble the tiles, and responds as soon as they have been computed. The image reconstruction in some of these embodiments is performed by the manufacturing software server 1704 via a separate client request (not shown) by the layout editing software 1702.

Once the reconstructed raster image of the silicon wafer shapes is available, it needs to be converted from the raster domain to the geometry domain, i.e., it needs to be converted back to a form that is suitable to be rendered in the layout editor. In some embodiments, this operation is performed by the manufacturing software server 1704 in response to a request from the layout editor client 1702. This operation involves inspecting the values of the various pixels in the reconstructed raster domain image, and producing a geometrical database containing the contours, e.g., by using the Marching Square algorithm.

The sequence of operations described above needs to be performed for each process condition of interest (e.g., the nominal process corner, the maximum and minimum corners that correspond to the outer and inner contours respectively), and further needs to be repeated for each color mask produced via the Multiple Pattern Decomposition operation, which in some embodiments is performed by the layout editor before or in conjunction with the user edits. In some embodiments, the sequence is simply repeated serially, once for each combination of color mask and process condition of interest. For example, when there are two color masks involved as shown in FIG. 4, and there are three contours of interest to be determined (nominal, maximum/outer and minimum/inner), then the above sequence needs to be repeated six times.

As mentioned above, the design may be edited in a context-free paradigm, or in an edit-in-place paradigm in which the surrounding context is known. In the edit-in-place paradigm, the contour generation operations may expand the design to include zero, some or all of the surrounding context. In the context-free paradigm (e.g., such as context-free, standalone editing of a standard cell or memory bitcell), the contour generation process may expand the design to infer a context.

For example, in a standard cell editing scenario, the inferred context may include the placement of other copies of the standard cell, or other standard cells, in their various legal orientations, surrounding the cell being analyzed. In a memory bit cell scenario, the inferred context is likely to include the placement of other copies of the cell under edit, and/or dummy cells, which are often placed on the periphery in their various legal orientations. Corresponding operations may take place after the computed contours are etched, allowing for the final contours for the cell-under-edit to be determined. Here, the inner and outer contours for each instance of the cell-under-edit (which will vary due to the different inferred neighborhoods) will be aggregated to produce final inner/outer contours that take design neighborhood induced variations into account, in addition to the process variations. These inferred-context steps are not shown in the diagrams however to simplify the discussion.

Figure 18:
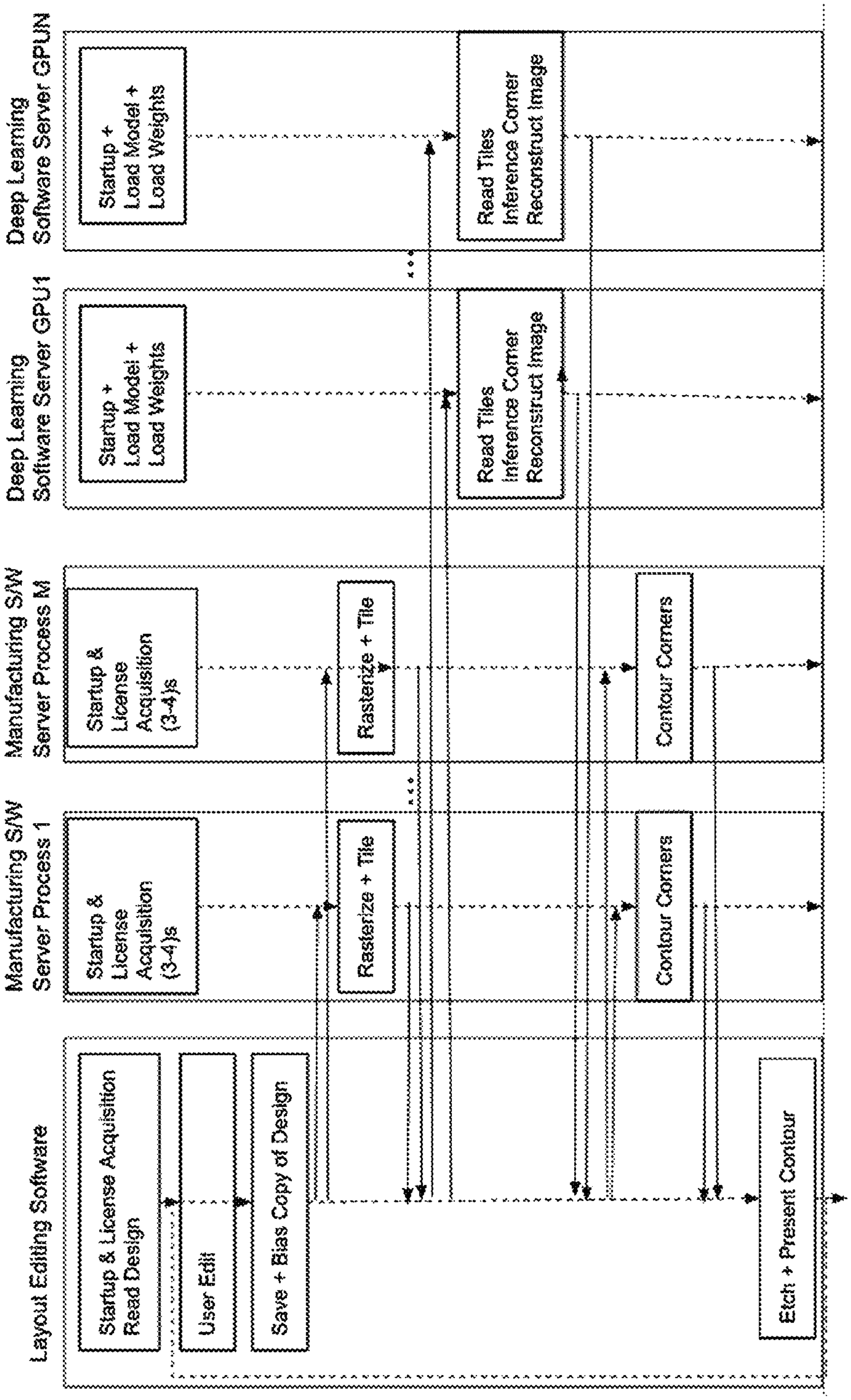
FIG. 18 illustrates one such embodiment, in which multiple software servers execute concurrently, with one dedicated to each combination of process conditions.

To further improve throughput, some embodiments use a different architecture in which multiple manufacturing software servers are deployed along with multiple neural networking software servers. This increases concurrency/parallelism and reduces the overall processing 'wall clock' time. FIG. 18 illustrates one such embodiment, in which multiple software servers execute concurrently, with one dedicated to each combination of process conditions. Under this approach, (1) a first neural networking server can be used for the inference of the wafer contours for the 'first color mask, nominal process condition' combination, (2) a second server can be used for the 'second color mask, nominal process condition' combination, (3) a third server can be used for the 'first color mask, maximum process condition' combination, and so on.

Some embodiments use as many neural networking software servers as there are unique combinations of color mask and process condition pairs to evaluate. Each neural networking software is assigned a dedicated GPU. In some embodiments, the servers again operate concurrently, and each server is responsible for computing the wafer contours for one color mask and process condition combination. In other embodiments, the number of servers is reduced to match the number of process corner conditions, so that each neural networking software server performs multiple inference cycles, one for each color mask. In still other embodiments, the number of neural networking software servers matches the number of color masks (two in this example), with each responsible for performing multiple inferences, one per process condition of interest.

In some embodiments, multiple manufacturing software servers operating concurrently perform the rasterization, tiling and contouring operations for each of the color mask and process condition combinations. For example, in some embodiments, (1) a first manufacturing software server is used for the rasterization, tiling and contouring operations for a first color mask and nominal process condition combination, (2) a second manufacturing software server is used for a second color mask, nominal process condition combination, (3) a third manufacturing software server is used for the first color mask, maximum process condition combination, and so on.

In some embodiments, there are as many manufacturing software servers as there are unique combinations of color mask and process condition pairs to evaluate. The servers in some embodiments operate concurrently, and each server is responsible for rasterization, tiling and contouring operations for one color mask and process condition combination. In other embodiments, the number of servers is reduced to match the number of process corner conditions, so that each manufacturing software server performs multiple rasterization, tiling and contouring operations, one for each color mask. In still other embodiments, the number of manufacturing software servers matches the number of color masks (e.g., two), with each responsible for performing multiple rasterization, tiling and contouring operations, one per process condition of interest.

Figure 19:
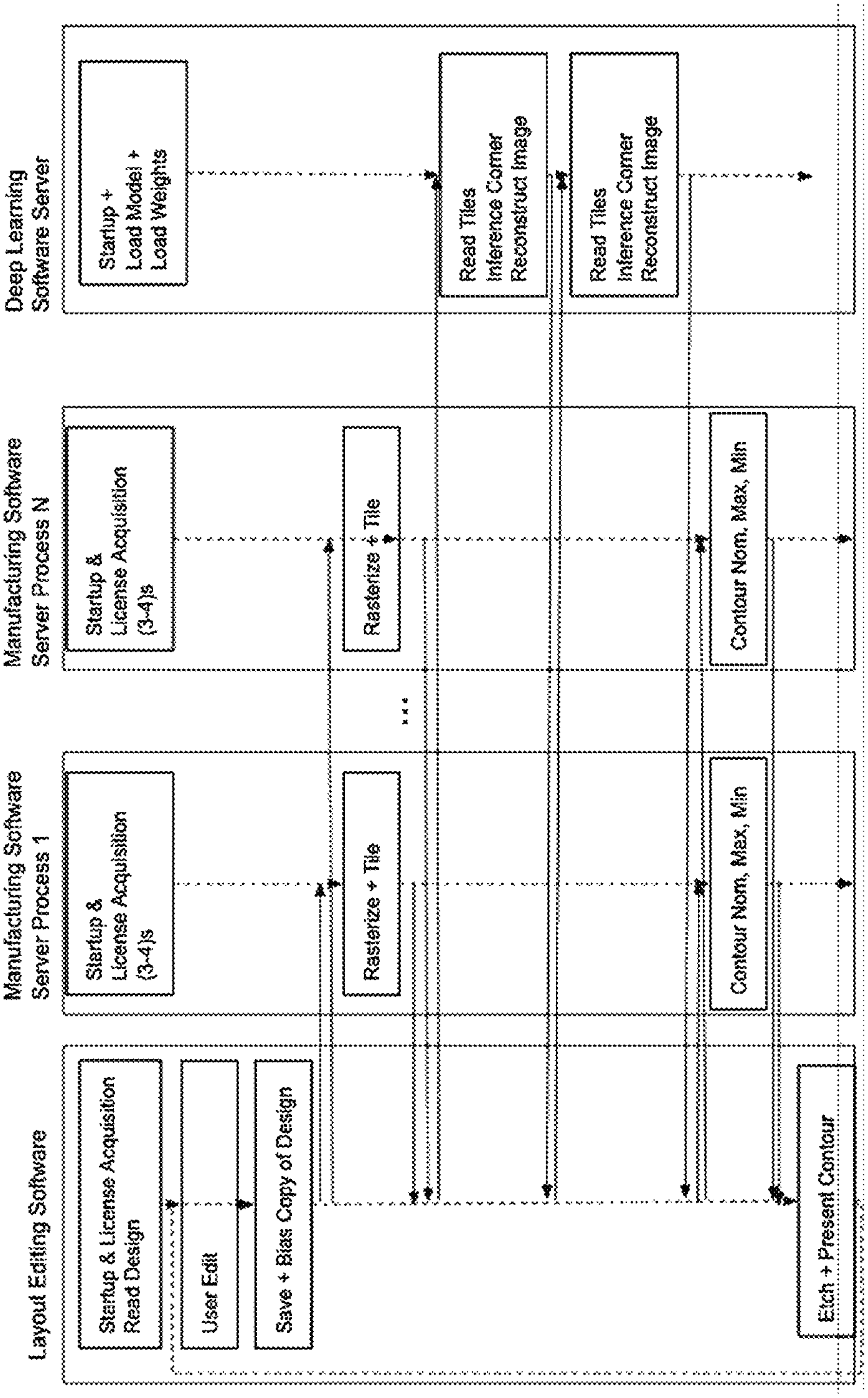
FIG. 19 illustrates an embodiment in which one layout editing server operates with multiple manufacturing software process servers and a single neural networking software server.

FIG. 19 illustrates an embodiment in which one layout editing server operates with multiple manufacturing software process servers and a single neural networking software server. The single neural networking server in this embodiment sequentially produces outputs for each color mask and process condition combination.

Figure 20:
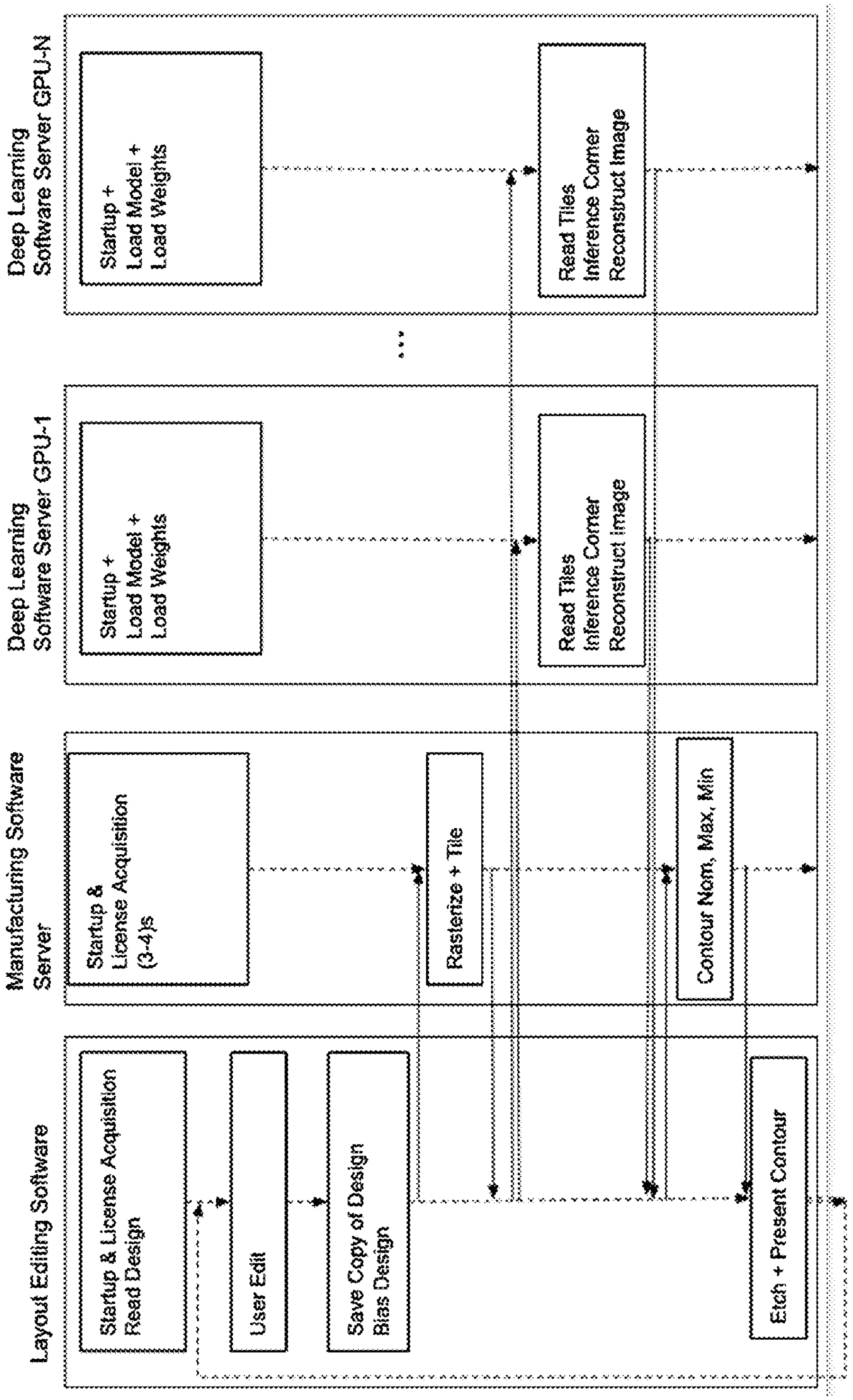
FIG. 20 illustrates another embodiment in which one layout editing server operates with one manufacturing software process server and multiple neural networking software servers.

FIG. 20 illustrates another embodiment in which one layout editing server operates with one manufacturing software process server and multiple neural networking software servers. The single manufacturing software process server serially performs the multiple rasterization, tiling and contouring operations, one per color mask and process condition combination of interest. In this example, each neural networking software process performs inference operations for one color mask and process conditions, with the different neural networking software processes performing the different inference operations for the different color mask and process conditions in parallel.

Figure 21:
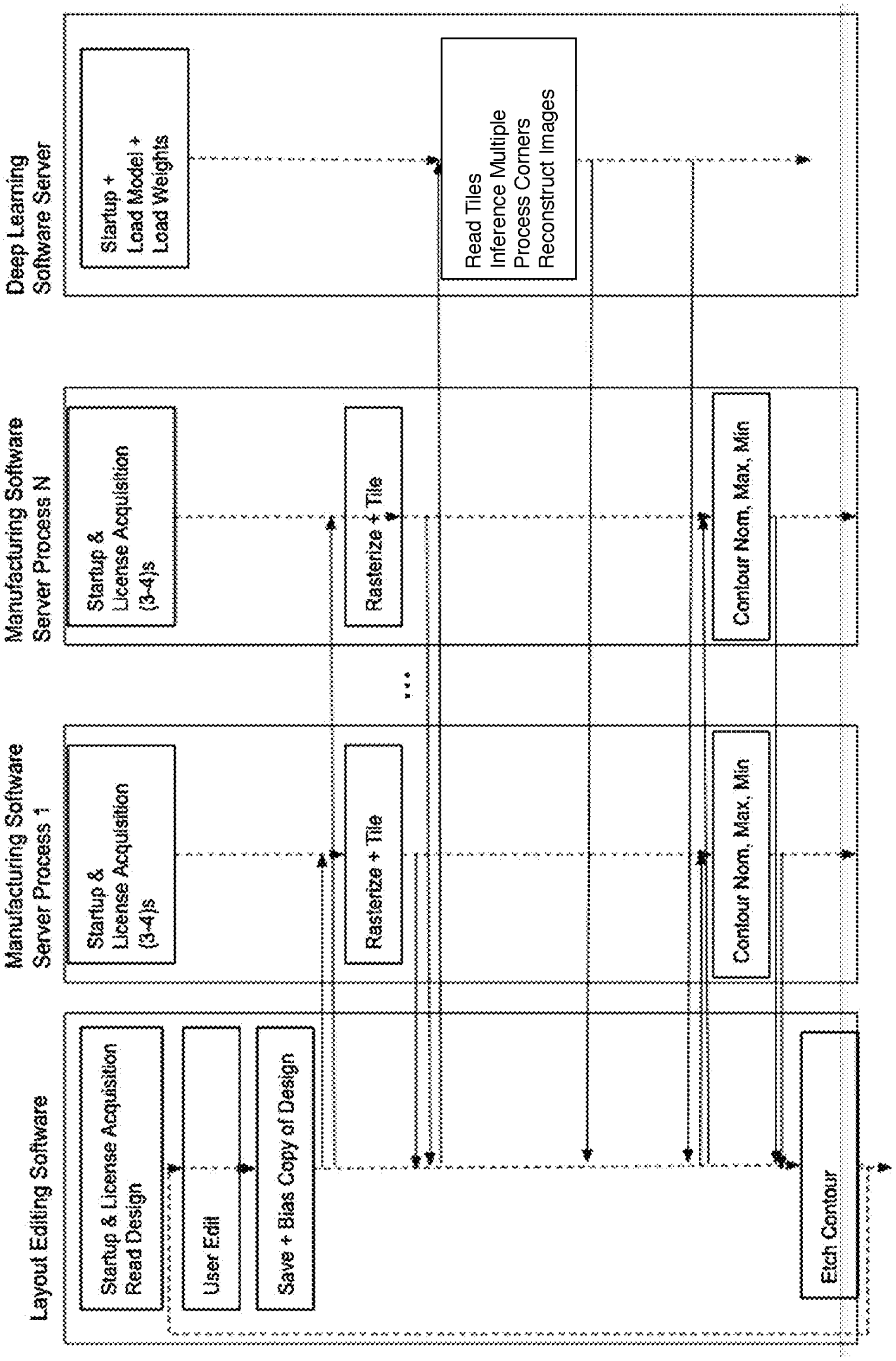
FIG. 21 illustrates another embodiment in which one layout editing server operates with multiple manufacturing software process servers and one neural networking process server, in which a neural network simultaneously produces not one, but multiple outputs, one for each of the process conditions of interest.

FIG. 21 illustrates another embodiment in which one layout editing server operates with multiple manufacturing software process servers and one neural networking process server, in which a neural network simultaneously produces not one, but multiple outputs, one for each of the process conditions of interest. This model is also used in some embodiments that use multiple neural networking process servers with each neural network simultaneously producing not one but multiple outputs, one for each of the process conditions of interest. In these embodiments and that of FIG. 21, each neural networking software is assigned a dedicated GPU, as the extreme parallelism of GPU devices can be highly leveraged to provide very fast inference time, e.g., essentially the same amount of time as for the single-output case.

Figure 22A:
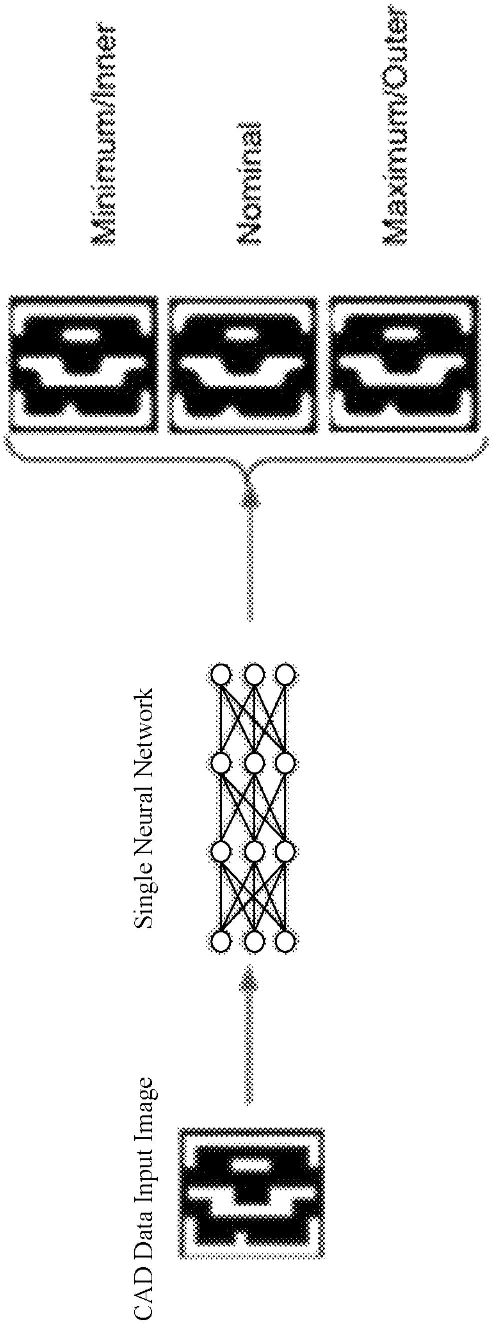
FIG. 22A illustrates a neural networking software server executing a single neural network that produces multiple outputs at once, with each output corresponding to a different process condition of interest.

FIG. 22A illustrates a neural networking software server executing a single neural network that produces multiple outputs at once, with each output corresponding to a different process condition of interest. Here, the neural network has been trained to compute the inner (minimum) contour, the nominal contour, and the outer (maximum) contour, i.e., the inner and outer contours are with respect to the overall manufacturing process extremes. These contours are produced from a three-channel output image by the neural network, given a single-channel input image representative of the rasterized layout design for a particular layer/color mask combination.

Figure 22B:
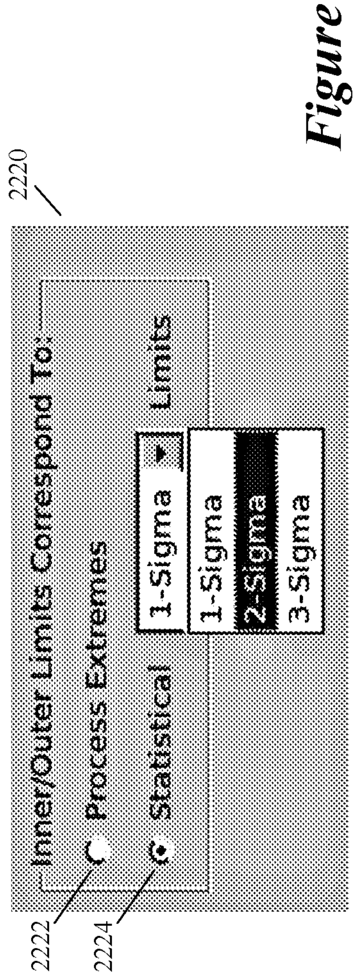
FIG. 22B illustrates a graphical user interface that allows the user to choose which model to use.

In an embodiment, as described with respect to the discussion on FIG. 11H, networks can be trained to produce images that correspond to statistical limits, such as 1-sigma, 2-sigma or 3-sigma process limits. Here, the inner/outer contours derived from the images produced by the network now correspond to corresponding values of sigma. FIG. 22B illustrates a graphical user interface 2220 that allows the user to choose which model to use. When the 'Process Extremes' radio button 2222 is selected, the minimum/maximum values will correspond to the manufacturing process extremes. When the 'Statistical Limits' radio button 2224 is chosen however, the user gets to choose from the available models, reflecting how much of the process variation (in terms of N-sigma limits) are to be reflected.

Figure 23:
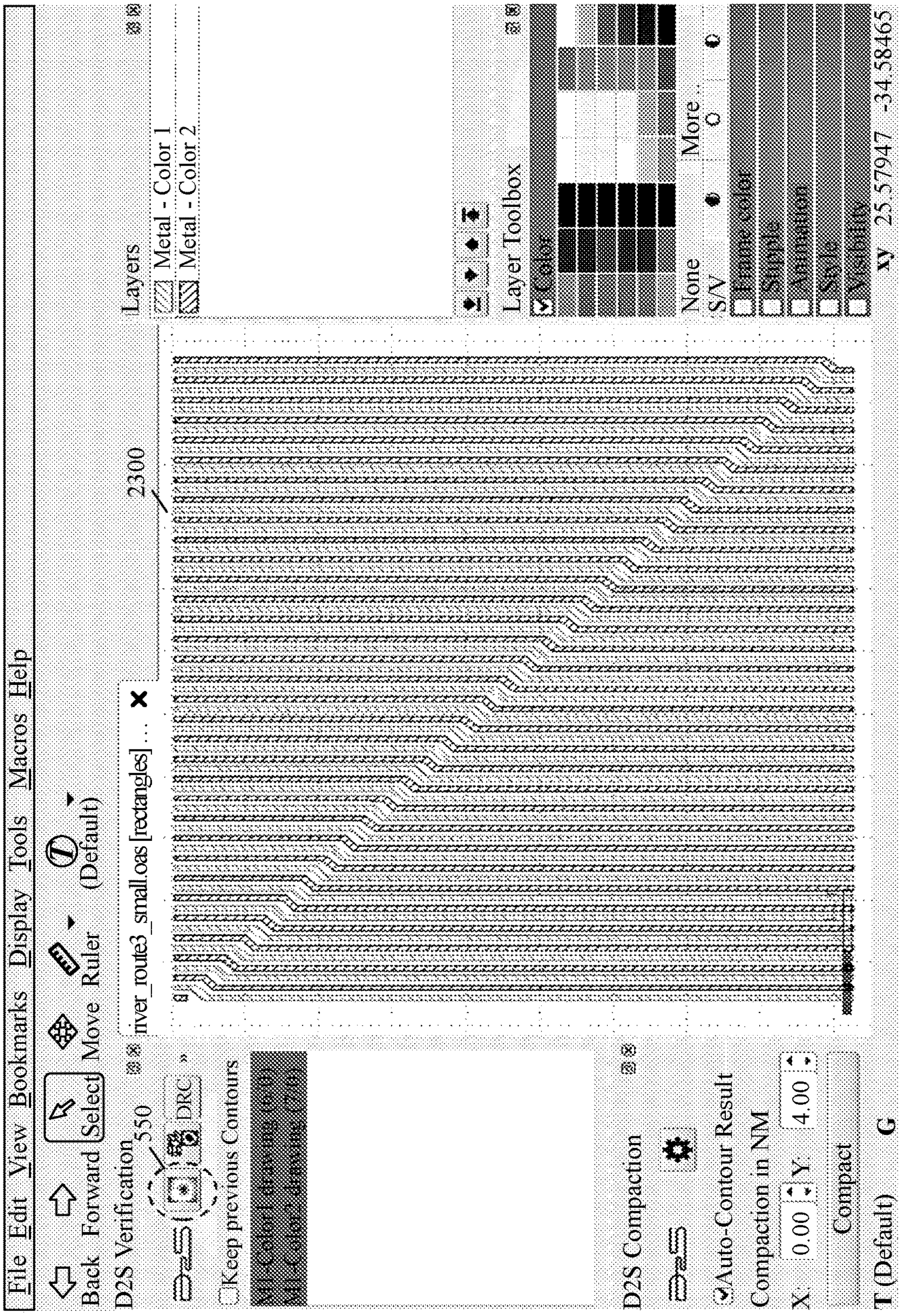
FIGS. 23-28 illustrate a more detailed example of an interactive design that is implemented according to some embodiments of the invention.
Figure 24:
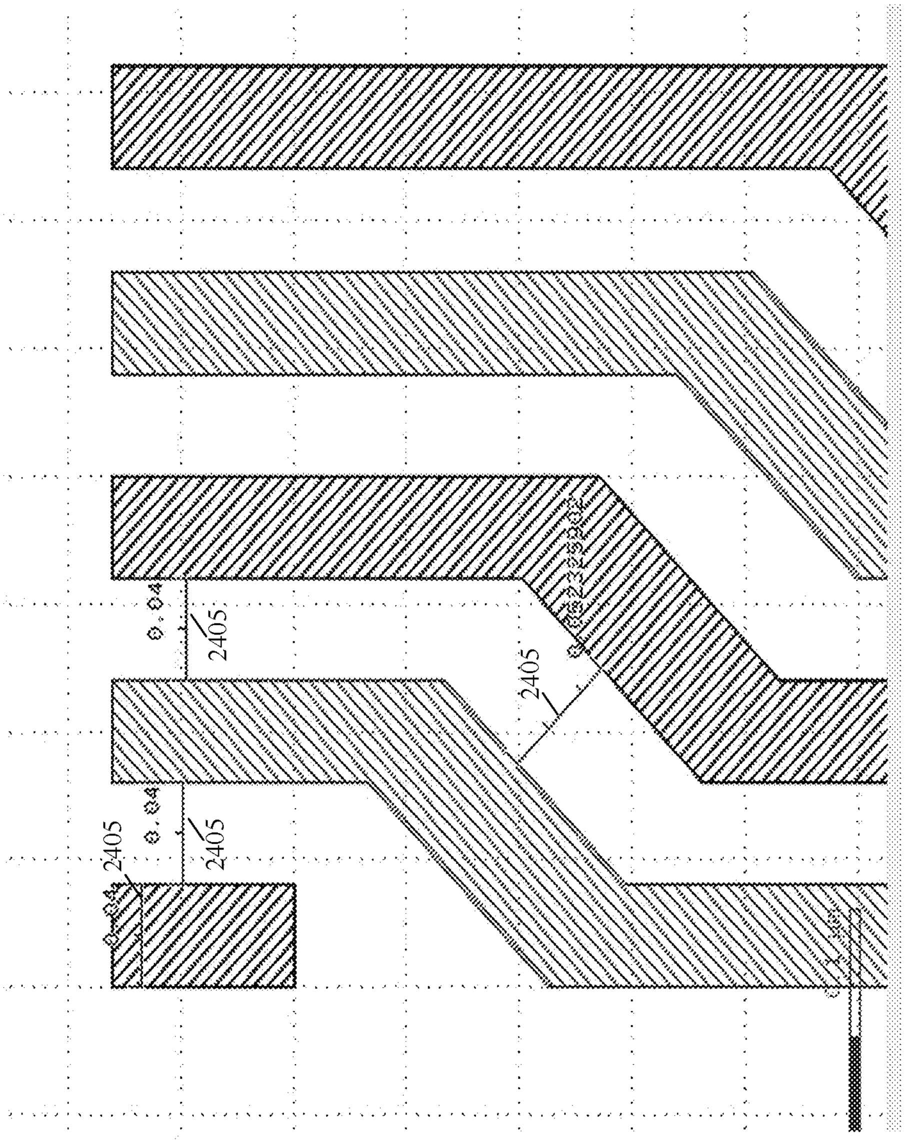

FIGS. 23-28 illustrate a more detailed example of an interactive design that is implemented according to some embodiments of the invention. The contours shown in these images will be with respect to the manufacturing process extremes, and it will be appreciated by one of ordinary skill that different contours corresponding to various N-sigma limits can be configured instead via the user interface of FIG. 22B. In this example, a 64-bit bus 2300 jogs one routing grid to the left as the bus traverses from top to bottom, as shown in the layout editor display illustrated in FIG. 23. FIG. 24 shows a closeup of the top left portion of the initial design as displayed in the layout editor. This figure also illustrates several rulers 2405 that are drawn showing the design following a 40-nm min width and min spacing rules. It also shows two color masks (e.g., purple and cyan colors) with alternate diagonal stippling directions (e.g., top-down left-to-right or top-down right-to-left directions) denoting different color masks.

Figure 25:
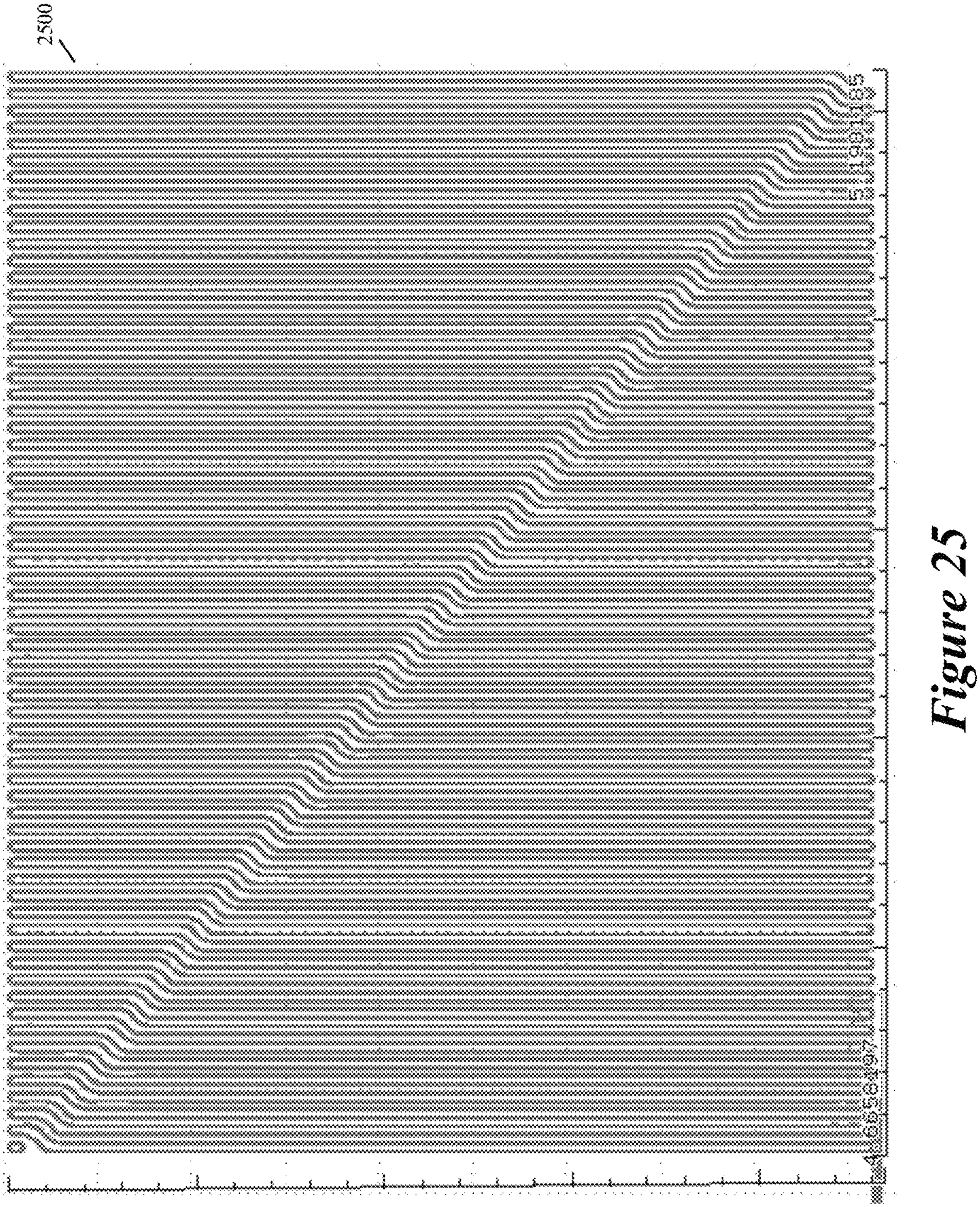
Figure 26:
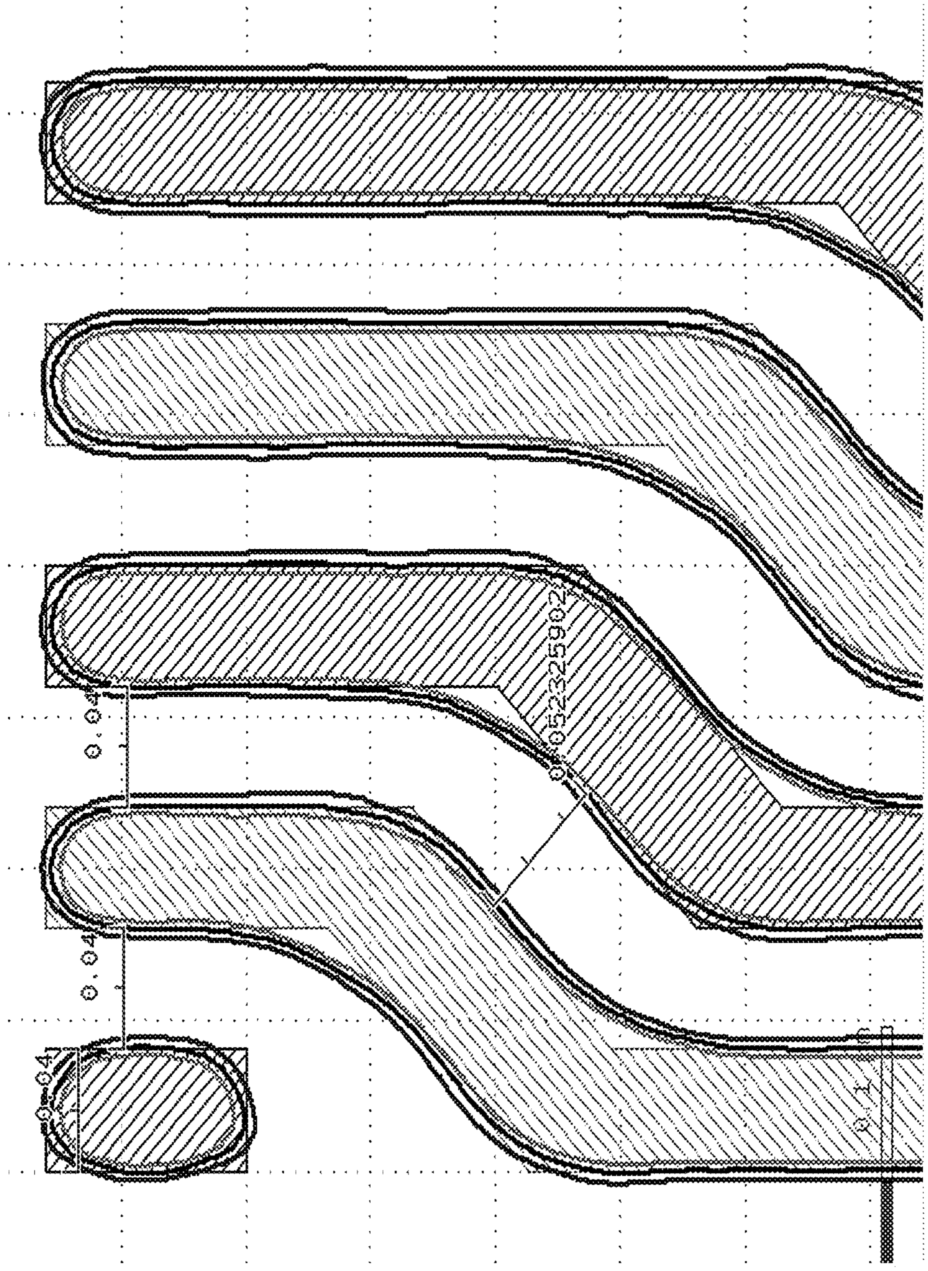

In this example, the designer wants to compact the space between the routes, while maintaining the width of the routing tracks themselves. In FIG. 23, the designer selects the dashed-line-circled contour UI button 550 to direct the layout editor to compute the manufactured wafer contours over process variations. In response, the layout editor works with one or more manufacturing software servers and one or more neural network software servers to compute these contours, and then as shown in FIG. 25, presents to the designer a high altitude (zoomed out) view of the design contours of the predicted bus 2500 as it is manufactured over process variations. FIG. 26 then shows the top left corner of the bus after the designer performs a zoom operation to see the three sets of generated contours showing the minimum, nominal and maximum contours of the predicted bus 2500.

Figure 27:
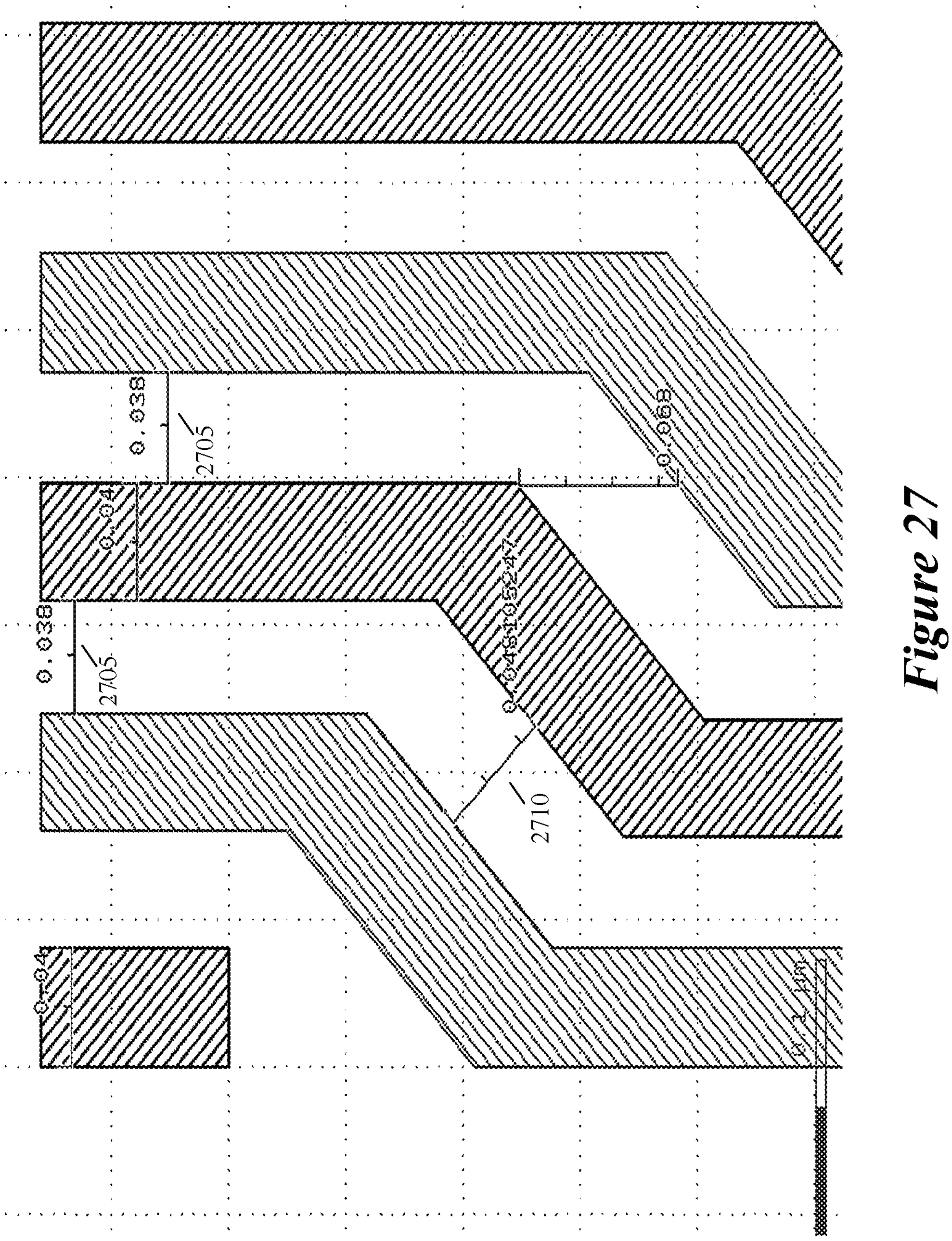

In viewing the designs of FIGS. 25 and 26, the user determines that the manufactured contours are sufficiently well represented, and that some extra reduction in the design area may be achievable by squeezing out some of the space between the route shapes, 'pushing beyond' the restricted design rules. In particular, the routes may be moved closer together in both the horizontal (X) and vertical (Y) dimensions. For example, as shown in FIG. 27, the designer may move the routes such that the horizontal spacing between the routes is reduced from 40 nm to 38 nm, and the diagonal spacing is effectively reduced from 52 nm to 48 nm. This can be achieved by moving the shapes vertically and cropping the top portions so that they are all horizontally aligned. The new dimensions are illustrated by the rulers 2705 and 2710 in this figure.

After performing a series of edits to obtain the design spacings shown in the FIG. 27, the user can quickly determine whether the manufactured silicon wafer contours for this shrunken design will be acceptable, by again selecting the dashed-line-circled contour button 550 to direct the layout editor to launch a sequence of operations (such as those described above by reference to FIGS. 12-22) to generate the different predicted, manufactured contours of the bus lines in the compacted design.

Figure 28:
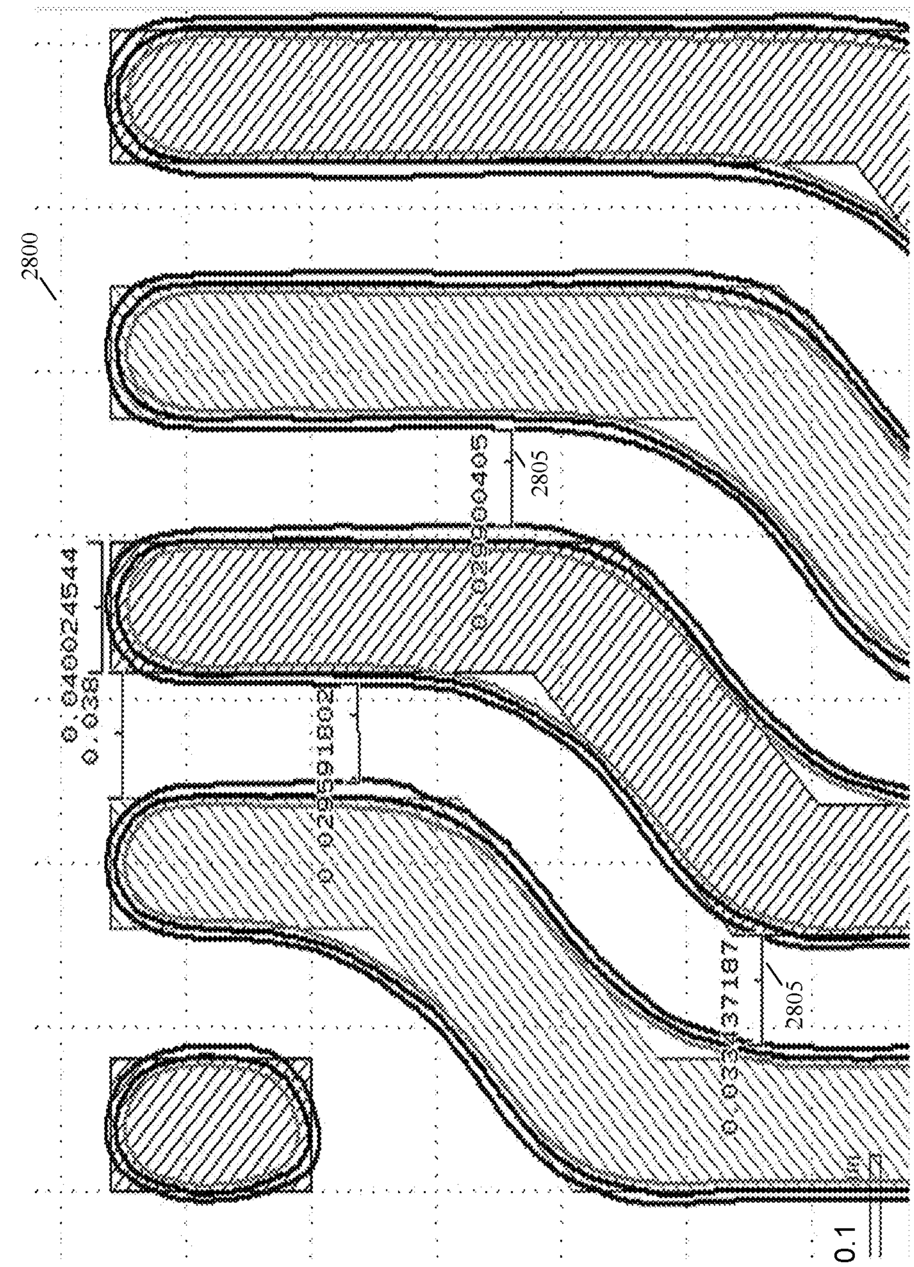

The resulting contours quickly appear. FIG. 28 illustrates these contours for the top-left corner of the compacted design 2800. The designer has zoomed to this location to examine the spacing between the outer contours at a few locations of interest. This spacing is indicated by rulers 2805, which in some embodiments are auto-displayed rulers, in other embodiments are user-selected rulers, and in still other embodiments are both auto-displayed and user-selected rulers. As shown by these rulers, the spacing ranges between 29 nm and 33 nm depending on the location.

The user may continue to compact the design, pushing the design rules, until correspondingly placed rulers indicate that the wires are as close together, yet still have sufficient space between the outer contours, to be comfortable from a yield perspective. The user for example may also terminate the editing loop when the contours are determined to be equidistant, both in the horizontal and diagonal directions. Additional tools and rulers not shown here may be deployed for the purpose of determining equidistance.

The interactive layout editor of some embodiments includes an interactive compaction tool that move routes in the X and Y directions, compressing (or expanding) the horizontal and vertical space between the routes where the user specifies the deltaX and deltaY space-reduction values, with negative values expanding the space. This tool can crop the resulting wires in the vertical direction as necessary after each compression/expansion operation to maintain the original alignment.

Figure 29:
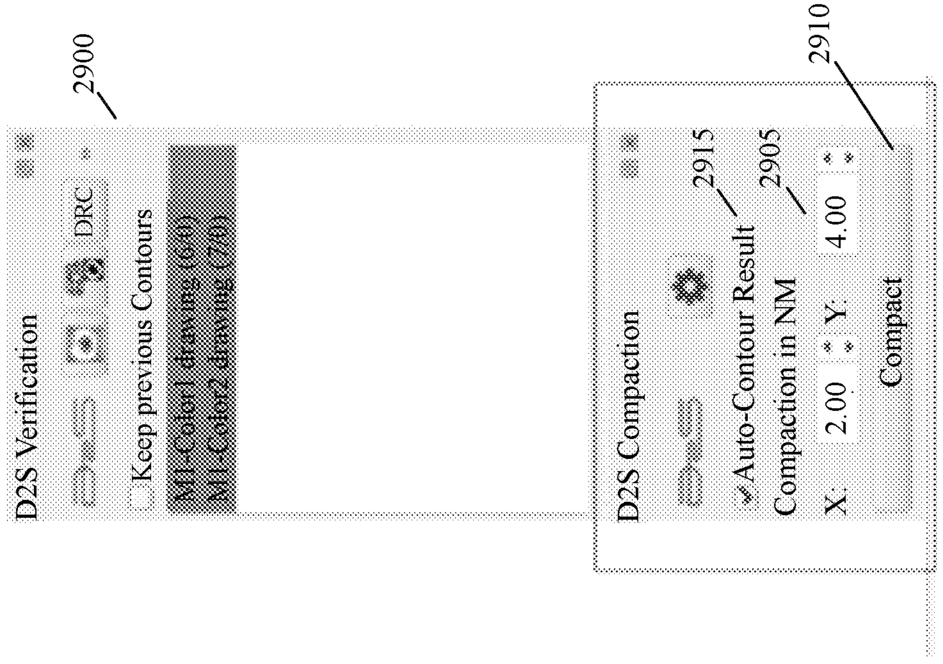
FIG. 29 illustrates a graphical user interface of the interactive compaction tool in some embodiments.

FIG. 29 illustrates a graphical user interface 2900 of this interactive compaction tool in some embodiments. As shown, the user interface has (1) a set of dimension controls 2905 that allow the user to specify the amount of space reduction in the X and Y directions (in units of nanometers), (2) a compact button 2910 that allows the user to perform the compaction operations, and (3) an auto-contour checkbox 2915 that directs the layout editor to compute the contours resulting from the interactive compaction operation and display these contours superimposed on the layout.

Through this tool, the layout editor not only moves the shapes in by the requisite amounts in the X and Y directions to compact/expand the space between them according to the user specified X and Y values, it also crops or extends the wires so that they are as short or as long as needed in the vertical direction while still accommodating the diagonal jogs. When the auto-contour checkbox is checked (as in FIG. 29), the compaction operation also quickly determines the contours resulting from the interactive compaction operation and displays them superimposed upon the layout. The quick display is now possible since the manufactured wafer contours, over process variations, can be determined and displayed in mere seconds, even for a design of the given size and complexity.

Figure 30:
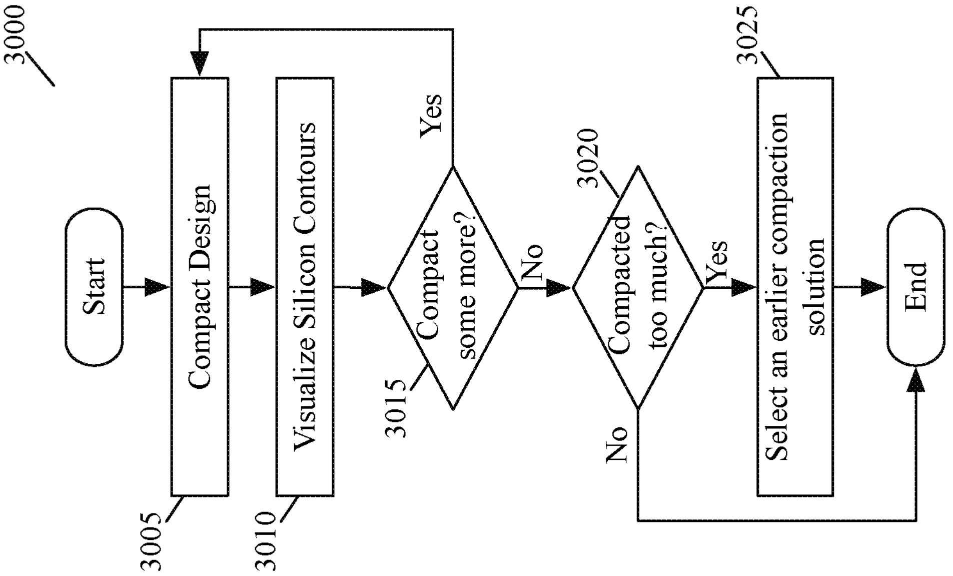
FIG. 30 illustrates a process that the layout editor performs when the user requests an interactive compaction operation through the user interface of FIG. 29.

FIG. 30 illustrates a process 3000 that the layout editor performs when the user requests an interactive compaction operation through the user interface 2900. As shown, the process 3000 performs one or more iterations of three operations, which are compacting (at 3005) a design, generating (at 3010) a visualization of the silicon contours, and then determining (at 3015) whether the design should be compacted more. When the process determines (at 3015) that the design should not be compacted more, the process determines (at 3020) whether the design has been compacted too much. If so, the process reverses one or more previous compactions and selects one of the compaction solutions that it identified in its prior iterations through 3005-3015. If not, the process selects (at 3025) its last identified compaction solution and then ends.

Figure 31:
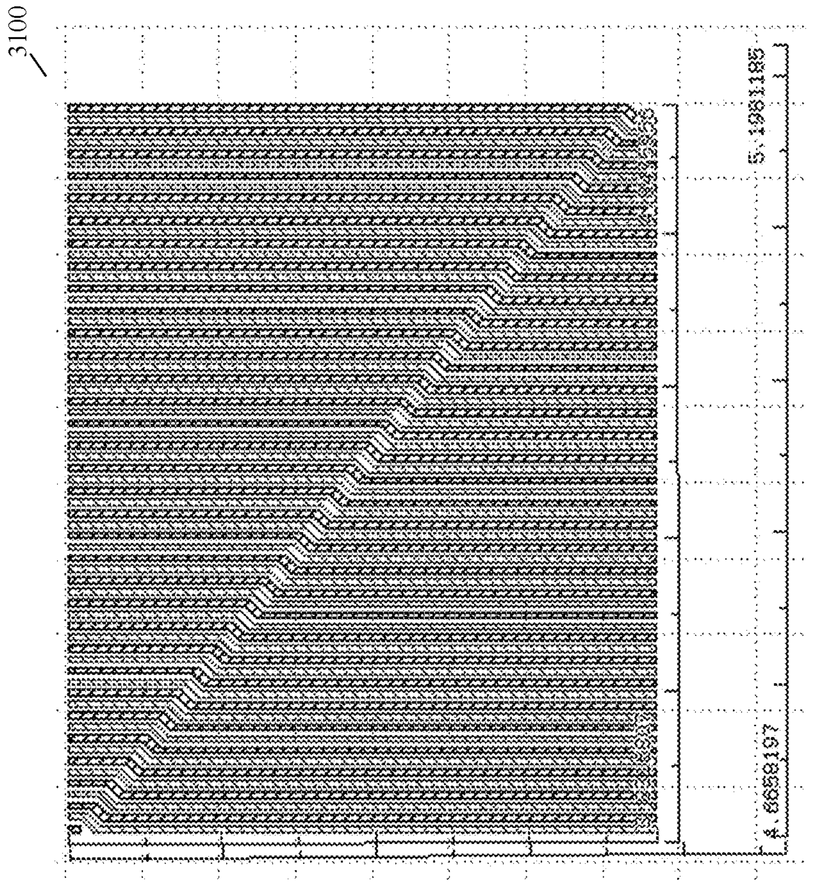
FIG. 31 illustrates the compacted bus route design that results after several uses of the interactive compaction tool of FIG. 29 followed by several inspections of the resulting contours.

FIG. 31 illustrates the compacted bus route design 3100 that results after several uses of the interactive compaction tool of FIG. 29 followed by several inspections of the resulting contours. With this design, the layout editor displays several rulers 3105 to contrast the size of the compacted design versus the original design 2300.

Figure 32:
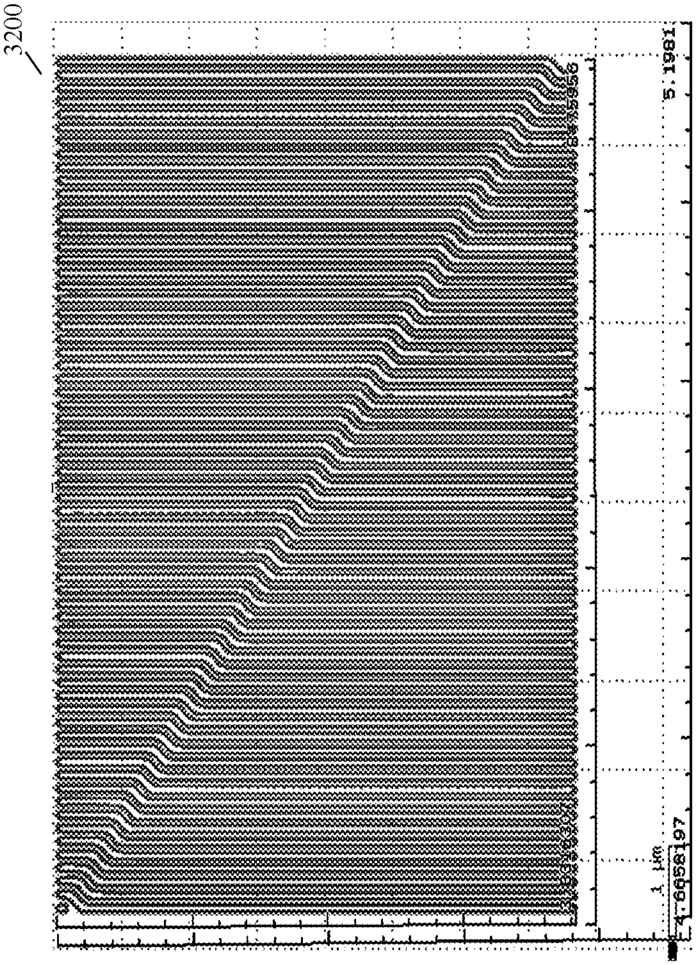
FIG. 32 illustrates a predicted manufactured design with predicted contours for the final compacted design.
Figure 33:
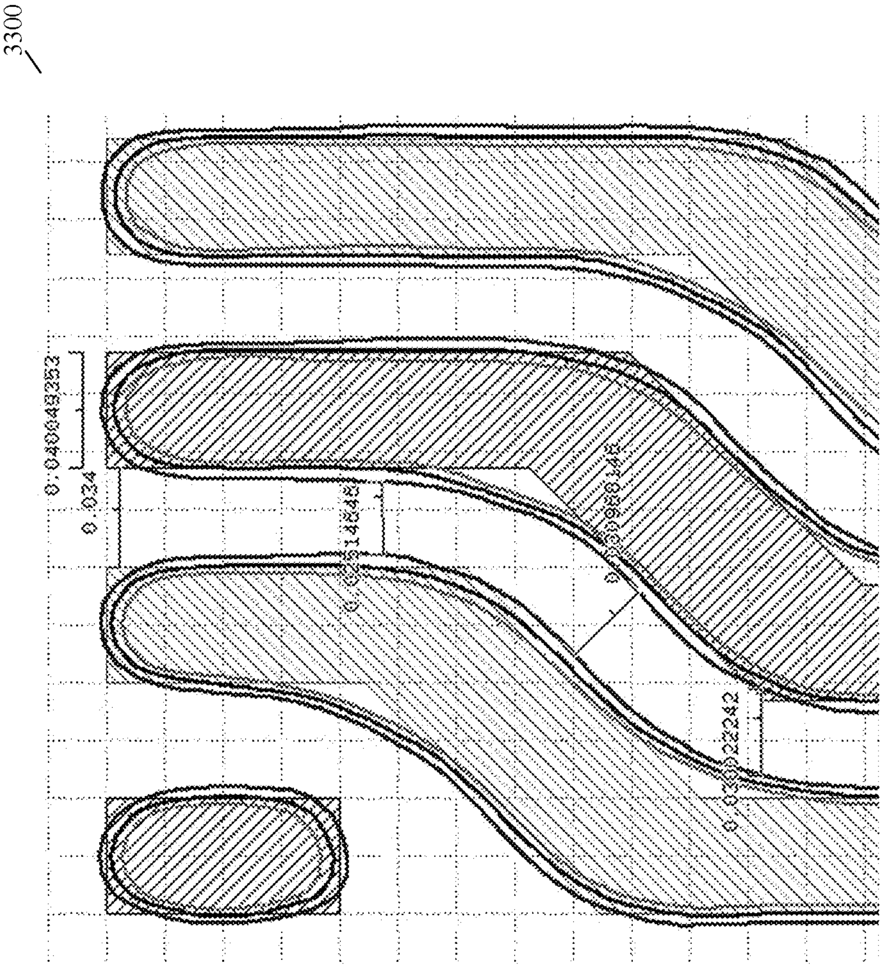
FIG. 33 illustrates a zoomed-in view of the top-left corner of the design of FIG. 32.

FIG. 32 illustrates a predicted manufactured design 3200 with predicted contours for the final compacted design. The displayed contours are defined along several process variations. As shown, the design area has been reduced by a substantial amount (approximately 23%) compared with the original uncompacted design. FIG. 33 illustrates a zoomed-in view 3300 of the top-left corner of the design 3200. As shown, some measurements show reduced space between the outer contours of the final compacted shapes. Also as shown, there is no significant bridging evident between the shapes, nor is there any obvious pinching (narrowing) of the shapes even at this level of spacing.

In some embodiments, the user may interactively compact the design and visualize the resulting contours, measure the contours, etc., and direct the interactive layout editor to repeat the process 3000 of FIG. 30 until a determination is made that the design has been compacted too much. At this point, the design can be re-expanded (e.g., by specifying negative values for the X and Y space reduction values and clicking the 'compact' button one final time.) Alternatively, an 'undo' editing operation can be used to achieve the same goal, resulting in a design that has been compacted as much as possible.

Some embodiments provide an automatic compaction tool that leverages a multi-goal optimizer to compact a design. In some of these embodiments, the goals of the optimizer include (1) minimizing the design area, and (2) minimize the DRC violations. The auto-compactor of some embodiments minimizes the design area without introducing DRC violations. Conjunctively, or alternatively, the auto-compactor of some embodiments minimizes manufacturability violations among the curvilinear manufactured silicon shapes, while optimizing or being constrained by parasitics, most notably resistances and capacitances as affecting circuit interconnect delay.

For the above-described bus route example, the auto-compactor's optimizer is configured in some embodiments to search a design space to identify the X,Y values that best compress the design without introducing curvilinear manufacturability issues. The optimizers of some embodiments try to minimize a cost function, varying the input variables (X and Y space reduction values in this example), within the available search space (that in some embodiments is defined through a set of constraints), until the cost function value is minimized. In some embodiments, the cost function is a combination of both the area of compacted design and a value related to the curvilinear manufacturability cleanliness of the compacted design.

Manufacturability cleanliness in some embodiments is expressed as DRC cleanliness, or is curvilinear DRC of simulated or emulated curvilinear contours indicating manufactured contours and their statistical variation, or is any other measure that indicates more manufacturable designs over less manufacturable designs. In some embodiments, the manufacturability cleanliness value is a function of the area of curvilinear DRC marker polygons, such that the larger area of combined curvilinear DRC errors, the higher the cost. On the other hand, the manufacturing cleanliness value in some embodiments is a function of the number of curvilinear DRC marker polygons. In other embodiments, the DRC cleanliness value is a function of both the number of, and the combined area of, the curvilinear DRC marker polygons. Rather than being a function of the edges of the layout as drawn (as is traditionally the case for DRC), the curvilinear DRC marker polygons in some embodiments are instead a function of the edges of the curvilinear polygons that correspond to the manufactured silicon shapes. DRC cleanliness in this context is a measure of how clean the curvilinear manufactured design contours are. These functions may be linear, square, or any other function. The more unclean the contours (i.e., the larger the amount of curvilinear DRC violations), the higher the penalty added to the cost function.

Figure 34:
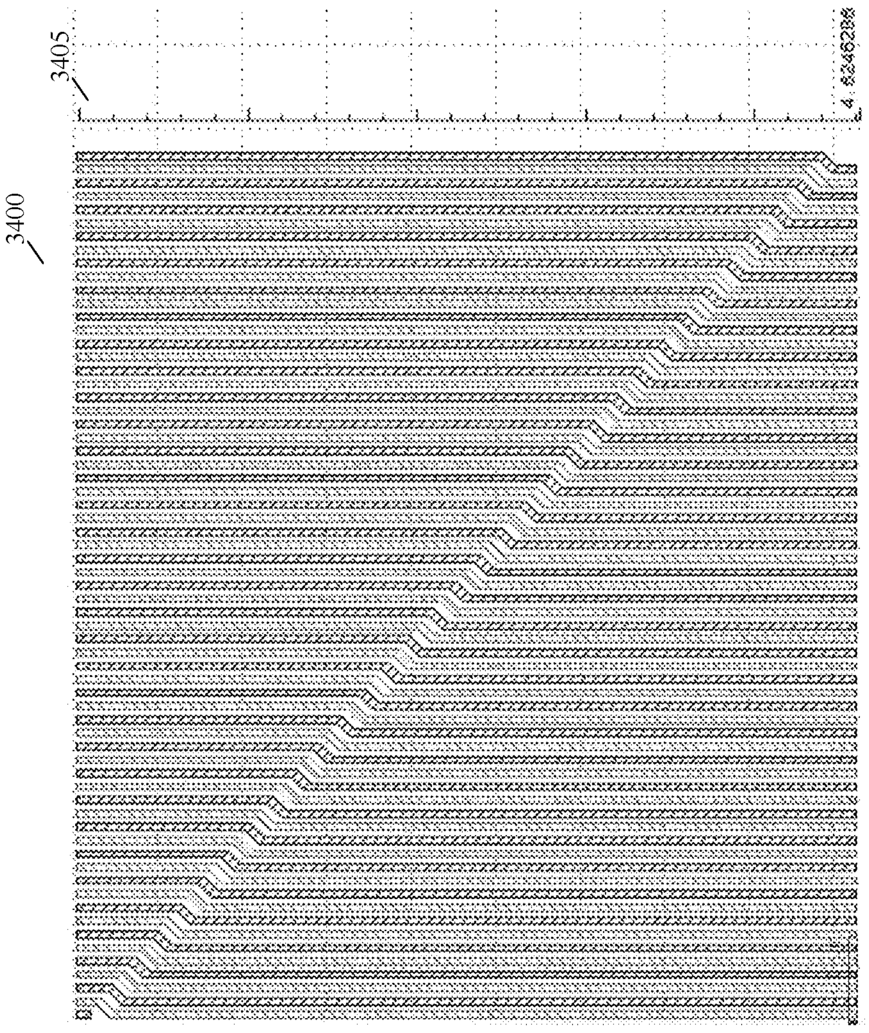
FIG. 34 illustrates a design that is to be auto-compacted by the auto-compaction tool of the layout editor of some embodiments.
Figure 35:
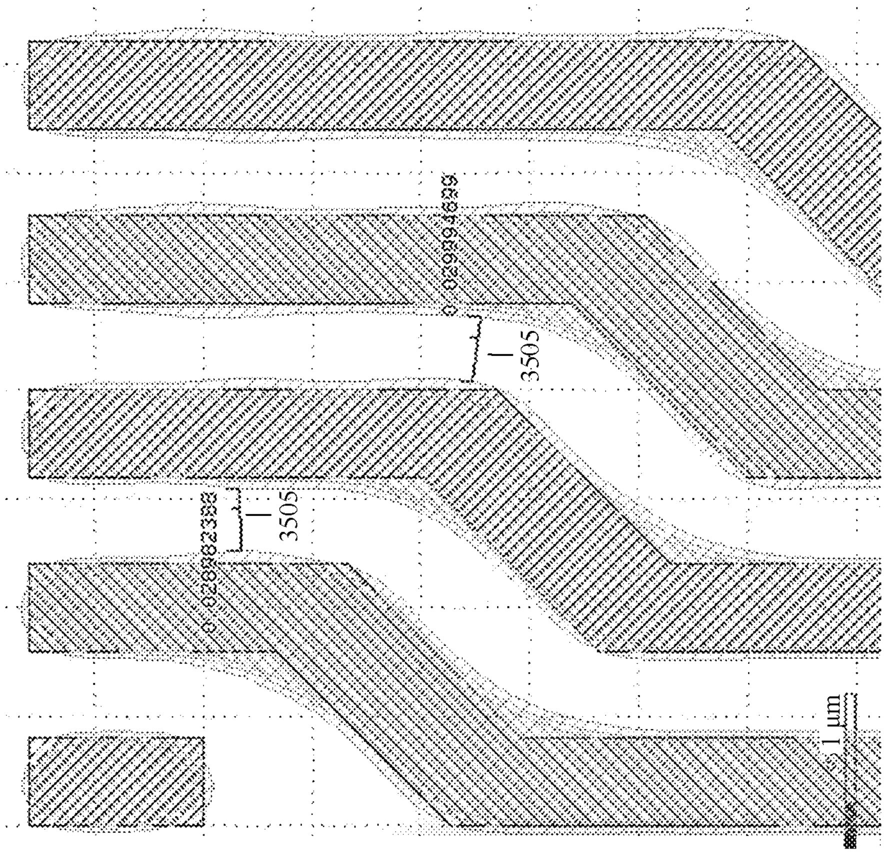
FIG. 35 illustrates the manufactured contours corresponding to the original design.

FIG. 34 illustrates a design 3400 that is to be auto-compacted by the auto-compaction tool of the layout editor of some embodiments. The ruler 3405 provides an indication of the Y-dimension of this design. In this example, a slightly different manufacturing process is used and this leads to somewhat different contours than seen before. The manufactured contours corresponding to the original design are as shown in FIG. 35. A few rulers 3505 are illustrated in this figure to provide an indication of the scale of the spacing between the outer contours at some locations of interest.

Figure 36:
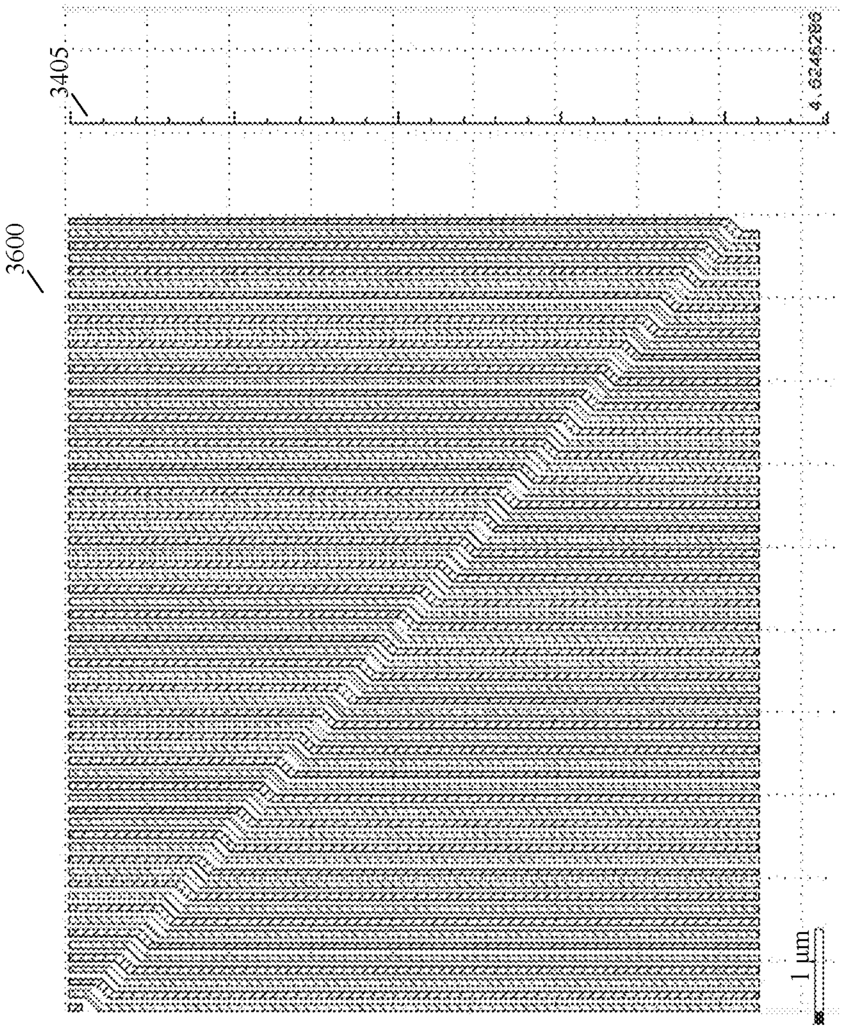
FIG. 36 illustrates a compacted design that is produced through a naive attempt to manually compact the design by removing 6 nanometers of space between the polygons in both the X and Y directions.

FIG. 36 illustrates a compacted design 3600 that is produced through a naive attempt to manually compact the design by removing 6 nanometers of space between the polygons in both the X and Y directions. As shown, the design has indeed been compacted by some amount, when comparing the location of the bottom right corner of the compacted design against the ruler 3405 that had originally been placed alongside the original, uncompacted design.

Figure 37:
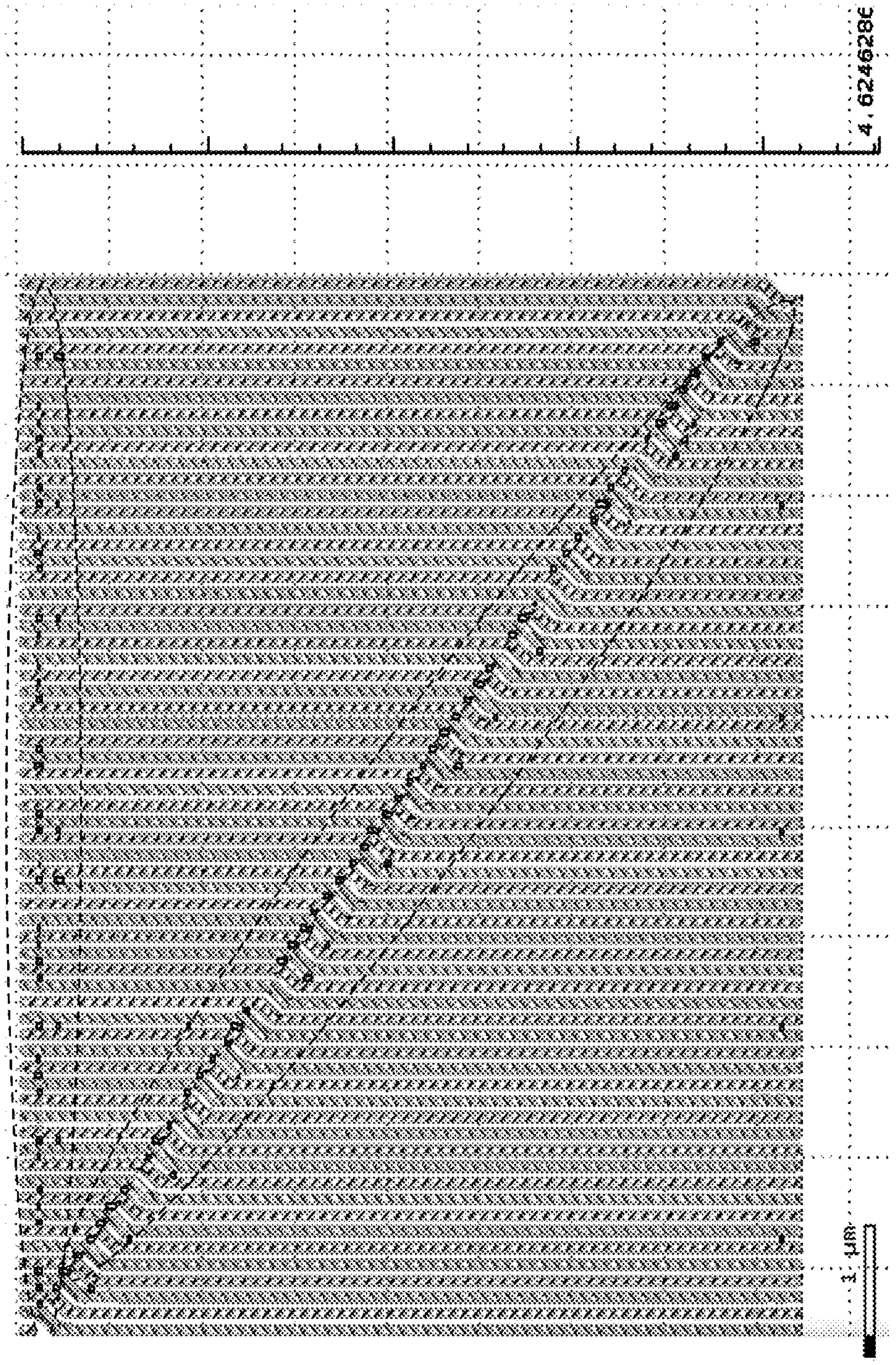
FIG. 37 illustrates a compacted design that is like the naively compacted design of FIG. 36, but illustrates the predicted manufactured silicon contours with the curvilinear DRC violations in the design of FIG. 36.

FIG. 37 illustrates a compacted design 3700 that is like the naively compacted design 3600 of FIG. 36, but illustrates the predicted manufactured silicon contours with the curvilinear DRC violations in the design 3600. The contours and violations in some embodiments are shown in different colors, e.g., red for contours and blue for violations. In FIG. 37, several colored locations (e.g., blue locations), which are circled in the black-and-white drawing, identify DRC violations. In this example, the curvilinear DRC rule checks include a curvilinear minimum-spacing check of 25 nm. Any observed spacings between manufactured silicon contours that are less than this amount are flagged as violations. A large number of curvilinear DRC violation polygons are indicated in the figure.

Figure 38:
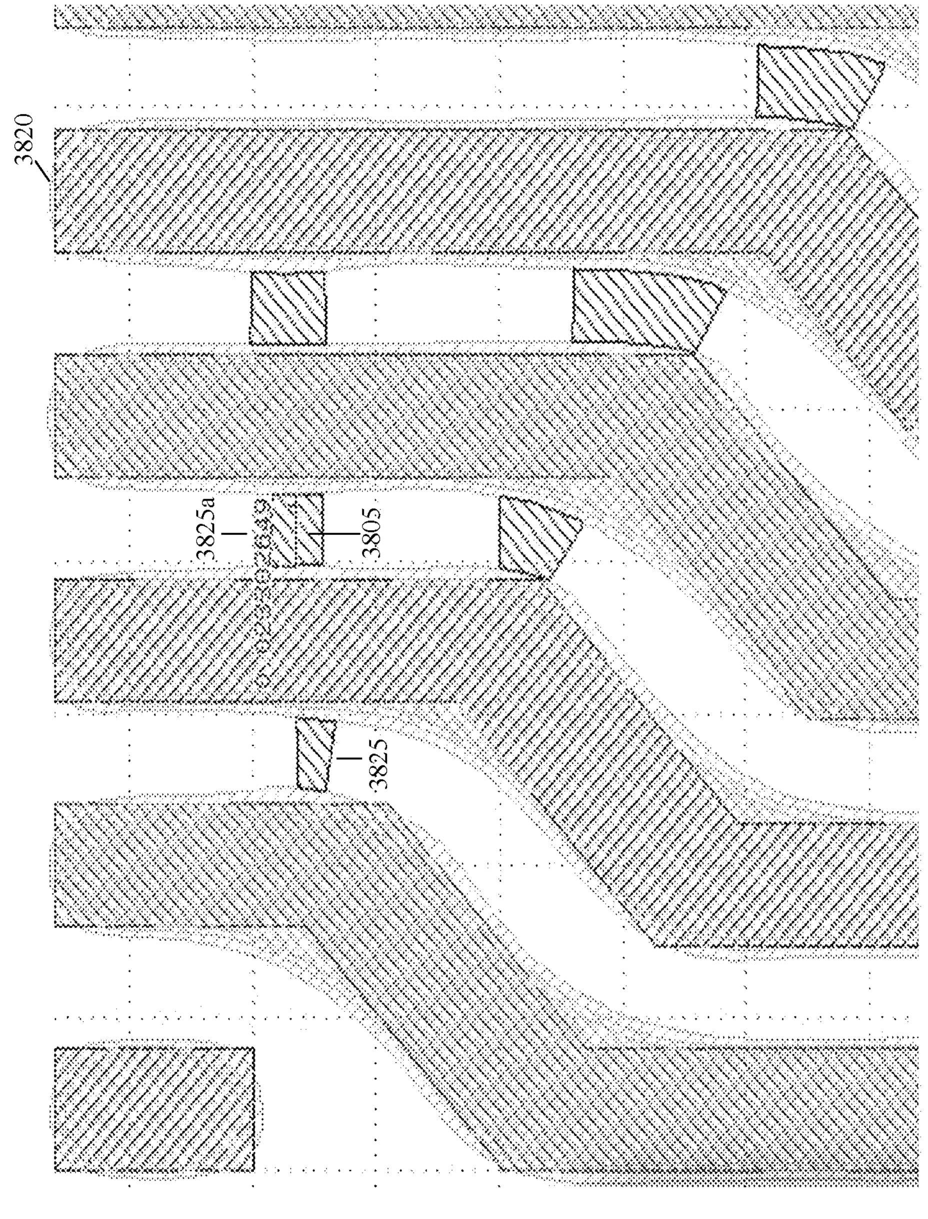
FIG. 38 illustrates a zoomed in view of the compacted design of FIG. 37.

FIG. 38 illustrates a zoomed in view of the compacted design 3700 of FIG. 37. The view in FIG. 38 shows the contours 3820 and DRC violation marker polygons 3825 corresponding to top left portion of the design 3700 of FIG. 37. A ruler 3805 is also illustrated to show the scale. The violation marker polygons show the identified violation in more detail. These polygons indicate where the outer contour edges are within 25 nm or less of each other. One of the markers **3825*a* is illustrated with a ruler showing a 23.3 nm (0.0233 um) spacing. This ruler is displayed in some embodiments in response to the designer's input to investigate marker 3825*a*** further, while in other embodiments it is displayed automatically by the tool. In still other embodiments, the tool displays some or all of the rulers automatically, while also allowing the designer to invoke the display of the rulers that specify the dimensions of the violation marker polygons.

A goal of some embodiments is to be able to automatically compact the design as much as possible, while minimizing the curvilinear DRC violations. To achieve this goal, some embodiments combine a black box optimization process with a cost function that includes both (1) the area of the compacted design and (2) the combined area of the curvilinear DRC marker violation polygons. This allows the optimizer to find a compaction solution that results in the smallest possible design area, while keeping the space between the manufactured silicon wafer contours larger than the design rule minimum value, for example.

Black box optimization processes require no more than a cost function evaluation function, and optionally in some cases bounds that delineate the search space. These processes perform multiple cost function evaluations at various trial points in the search parameter space, to try to determine the overall shape of the cost function in multidimensional space. The results are often combined with running local optimizers in the vicinity of the lowest cost points to try to achieve a global minimum.

Some embodiments use the Simplicial Homology Global Optimisation (SHGO) algorithm, which is a promising, recently published global optimization (GO) algorithm, e.g., https://stefan-endres.github.io/shgo/. The software implementation of the algorithm has been shown to be highly competitive when compared to state of the art commercial and open-source optimization software. Other embodiments use other optimization processes (e.g., differential evolution optimization process, e.g., https://en.wikipedia.org/wiki/Differential_evolution).

Figure 39:
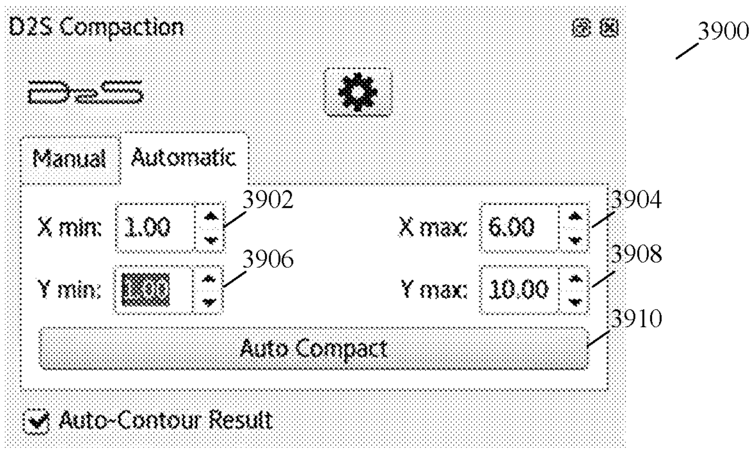
FIG. 39 illustrates a UI for an automatic compaction tool of some embodiments.

FIG. 39 illustrates a UI for an automatic compaction tool of some embodiments. Through this UI 3900, a designer can set up search space parameters for searching the solution space for auto-compact optimization. The X min, X max fields 3902 and 3904 allow the user to specify the range of possible values for the X space reduction parameter, while the Y min, Y max fields 3906 and 3908 allow the user to specify the range of possible values for the Y space reduction parameter. The auto-compact button 3910 allows the user to launch the optimizer on the current design under edit in the layout editor.

Figure 40:
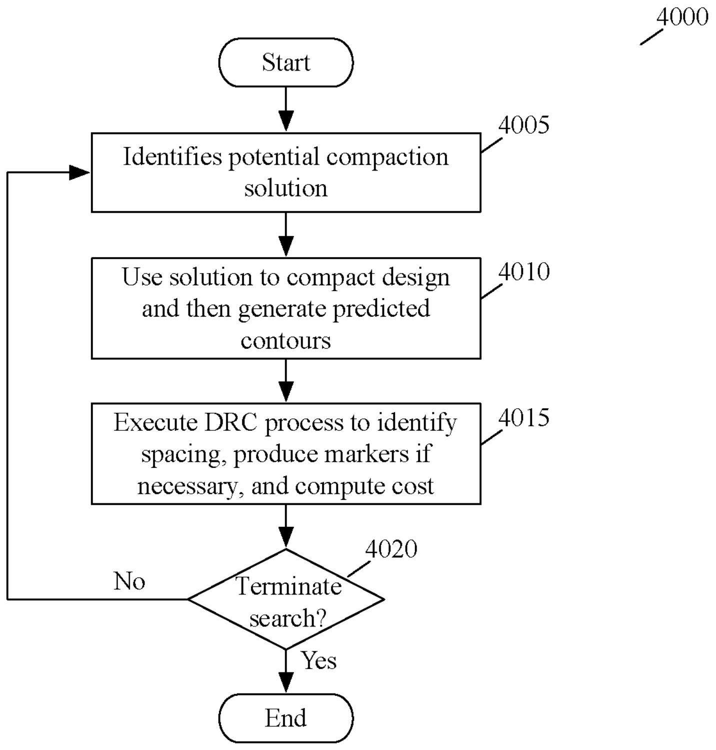
FIG. 40 illustrates a process that the auto-compactor of some embodiments performs.

FIG. 40 illustrates a process 4000 that the auto-compactor of some embodiments performs. As shown, the process 4000 identifies (at 4005) a potential compaction solution within the user-specified search space boundaries. The process 4000 (at 4010) uses the identified compaction solution to compact the design by the appropriate amount, and then uses a neural network to generate the manufactured wafer contours for the produced compacted design.

At 4015, the curvilinear DRC tool is also run on the curvilinear wafer contour shapes to determine the spacings between the manufactured shapes for example, and produce marker polygons wherever the spaces are found to violate the design rules. In some embodiments, the area of both the compacted design and any DRC marker polygons are combined in a cost function that penalizes excessive area or DRC violations, and the process runs its optimization sub-process to minimize this cost function value.

Next, at 4020, the process 4000 determines whether it should terminate as it has found a satisfactory solution for the compaction in this iteration or a prior iteration. In different embodiments, the process 4000 uses different criteria to determine when it should stop its search of the solution space. The criteria are dependent on the type of optimization sub-process that the process 4000 uses.

When the process 4000 determines (at 4020) that it should terminate as it has found a satisfactory solution, it ends. Otherwise, when the process 4000 determines (at 4020) that it should not terminate its search, the process returns to 4005 to identify another potential compaction solution, and then to repeat its operations 4010 and 4015 for this solution. For each potential solution, the process generates a compaction based on the solution, generates the wafer contours for this compaction, applies the curvilinear DRC rules and re-computes the cost-function, in order to evaluate the compaction resulting from the identified compaction solution.

After a number of such iterations, the optimizer may find a good solution to the problem, i.e., a set of input parameter values (X and Y space reduction values in this particular experiment) that correspond to a low cost function value, with little or no DRC violations. At such time, the process determines (at 4020) that it should terminate, selects its best identified solution as a satisfactory solution, and then ends. In some embodiments, the process 4000 terminates after a specified maximum number of iterations are reached, or other termination conditions are reached. The process 4000 in some embodiments performs 100-200 iterations, with each iteration only taking seconds thanks to the use of the trained neural network to produce the manufactured wafer contour values, and completes its automatic compaction of the design on an order of 10 minutes.

The automatic compaction tool of some embodiments has additional user interface controls to allow the user to further configure the optimizer, e.g., by specifying the maximum number of evaluation points, or the size of the initial search grid, etc. This UI in some embodiments also provides one or more interfaces to additional suitable optimizers, and an interface to allow the user to select from between a list of suitable optimizers.

Figure 41:
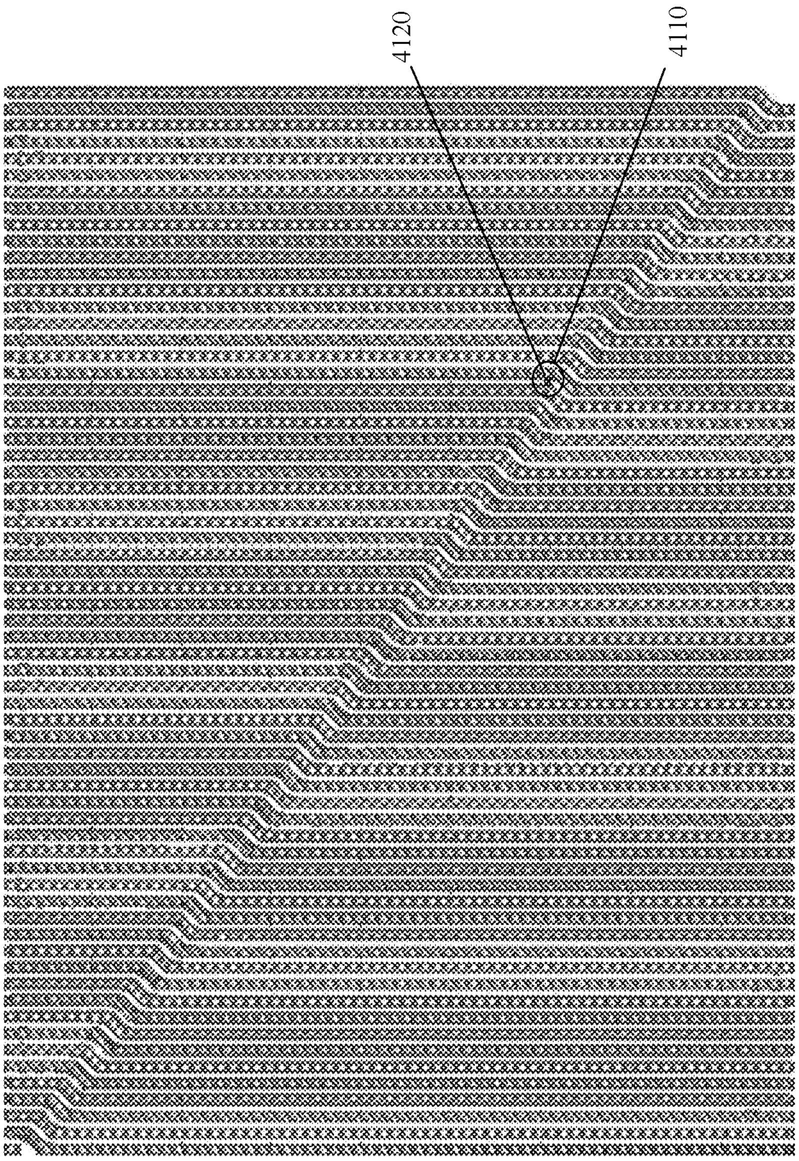
FIG. 41 illustrates the manufacture silicon contours corresponding to the auto-compaction solution produced by one run of the SHGO optimizer to auto-compact the design of FIG. 34, with a certain formulation of the cost function, and a specific initial search space.

FIG. 41 illustrates the manufacture silicon contours corresponding to the auto-compaction solution produced by one run of the SHGO optimizer to auto-compact the design of FIG. 34, with a certain formulation of the cost function, and a specific initial search space. As shown, this auto-compaction resulted in a single DRC violation that is identified by a single small DRC violation marker polygon 4120, which is identified by a different color (e.g., blue) than the colors used to show the contours (e.g., red). To account for the black-and-white illustration of FIG. 41, a circle 4110 is used to highlight the location of the DRC violation polygon marker 4120.

Figure 42:
FIG. 42 presents a zoomed-in view of the DRC violation marker polygon.

FIG. 42 presents a zoomed-in view of the DRC violation marker polygon 4120. As shown, the DRC polygon has a width of 24.169107 nm as indicated by the ruler 4205. Applying a higher weighting to the DRC area term in the optimizer's cost function would eliminate this DRC violation. Alternatively, the designer eliminates this violation through a manual adjustment operation or by providing alternative values for the auto-compaction operation.

Figure 43:
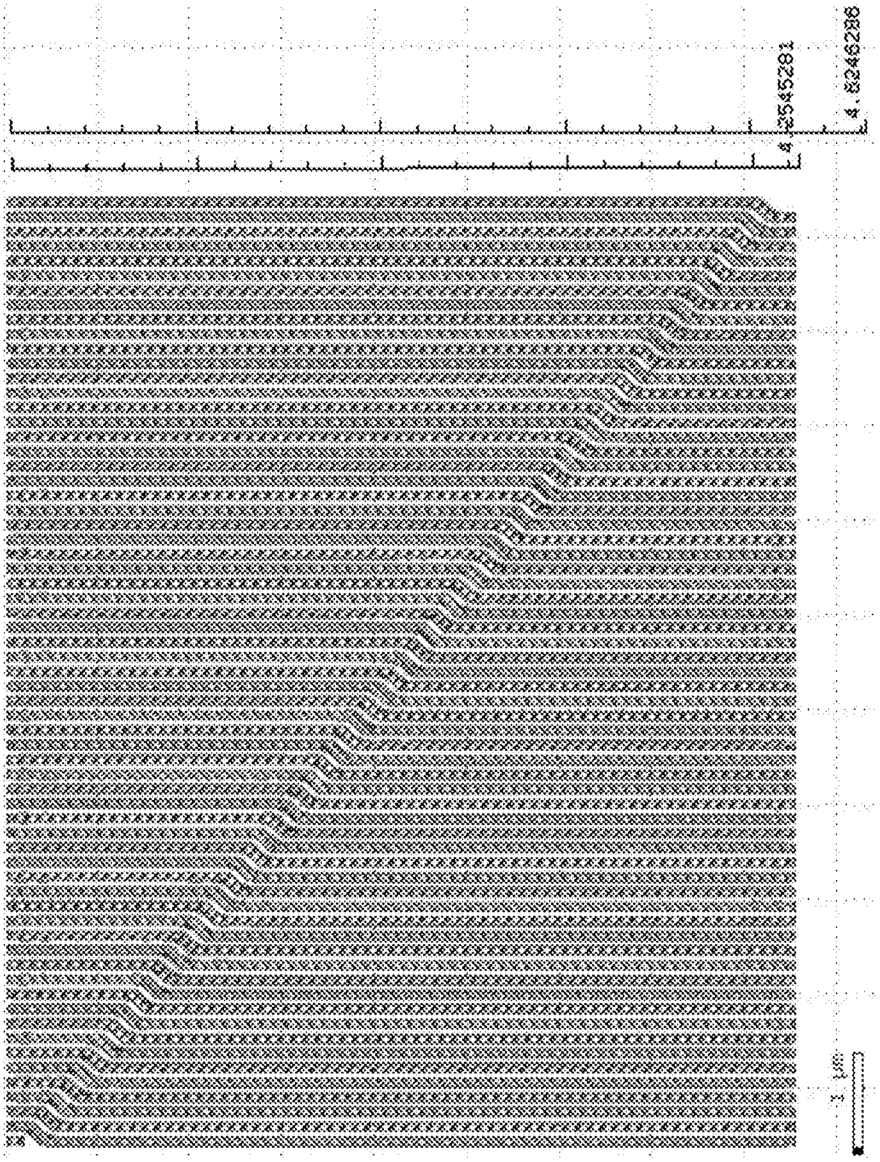
FIG. 43 illustrates the manufacture silicon contours corresponding to another auto-compaction solution produced by one run of the SHGO optimizer to auto-compact the design of FIG. 34.

FIG. 43 illustrates the manufacture silicon contours corresponding to another auto-compaction solution produced by one run of the SHGO optimizer to auto-compact the design of FIG. 34. This other solution was identified with a different initial search space (e.g., the X and Y space compaction values was X=2.64 nm and Y=5.92 nm), and has zero DRC errors. In this example, the design was successfully compacted such that the overall Y dimension was reduced from 4.62 um to 4.25 um, while the X dimension was correspondingly compacted (ruler not shown). Also, in this example, the auto compactor did not produce any DRC violation polygons to identify any 25 nm curvilinear spacing DRC error.

In some embodiments, the neural-network enabled interactive layout editing system can be used to manually fix yield limiting portions (lithography hotspots) of a design. The process begins by inspecting the contours for a known or suspected hotspot location. Thereafter, the design is iteratively modified, and resulting contours visualized and inspected. A number of potential candidate edits can be quickly evaluated in this manner, along with their resultant impacts on the manufactured design contours.

Figure 44:
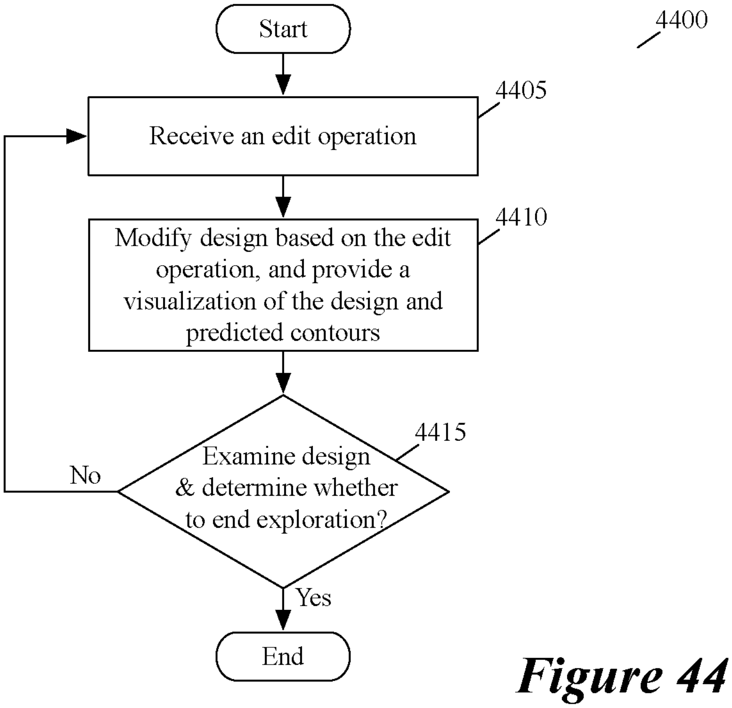
FIG. 44 illustrates an interactive editing process that is used to manually fix yield limiting portions of a design.

FIG. 44 illustrates an interactive editing process 4400 that is used to manually fix yield limiting portions of a design. As shown, the designer performs (at 4405) an edit operation, i.e., directs the tool to perform an edit operation. Examples of such operation include performing cell flipping or shifting, or by modifying (via individual polygon editing) yield-limiting portions of a design. The process 4400 (at 4410) modifies the design based on the designer's input and provides a visualization of the resulting design with the associated predicted manufactured contours of the design. The designer (at 4415) reviews the design and determines whether the design is to be edited some more. If so, the process returns to 4405 when the designer performs another design. Otherwise, the process ends.

Figure 45:
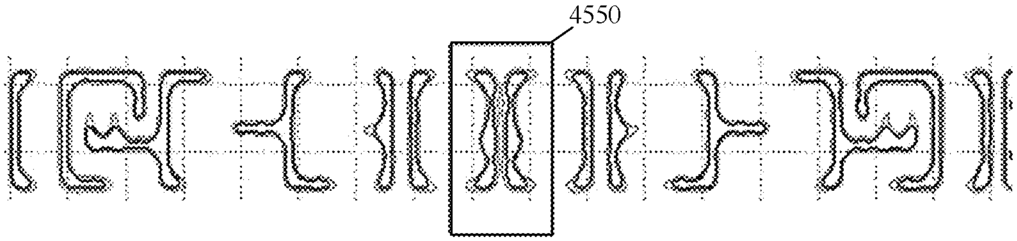
FIGS. 45-57 illustrate an example of using a neural-network enabled interactive layout editing system to manually fix yield limiting portions.

FIGS. 45-57 illustrate an example of using a neural-network enabled interactive layout editing system to manually fix yield limiting portions. FIG. 45 illustrates a portion of a custom design involving some placed standard cells for digital logic, which has been determined to be associated with yield issues. The boxed area 4550 in the center shows the contours associated with the yield limiting portion of the design (with inter-cell routing removed), as determined by the trained neural network. In this example, the inner and outer contours are only shown, the nominal contours have been omitted for clarity.

Figure 46:
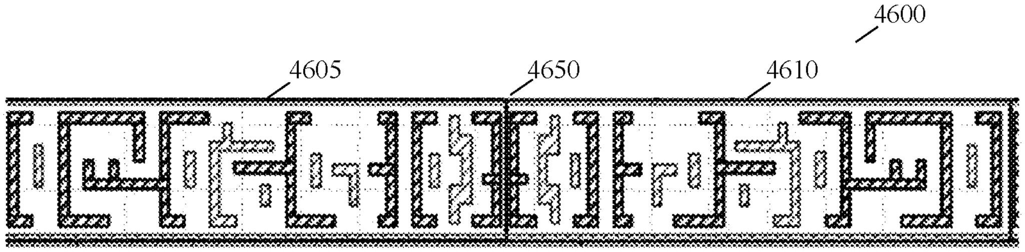
Figure 47:
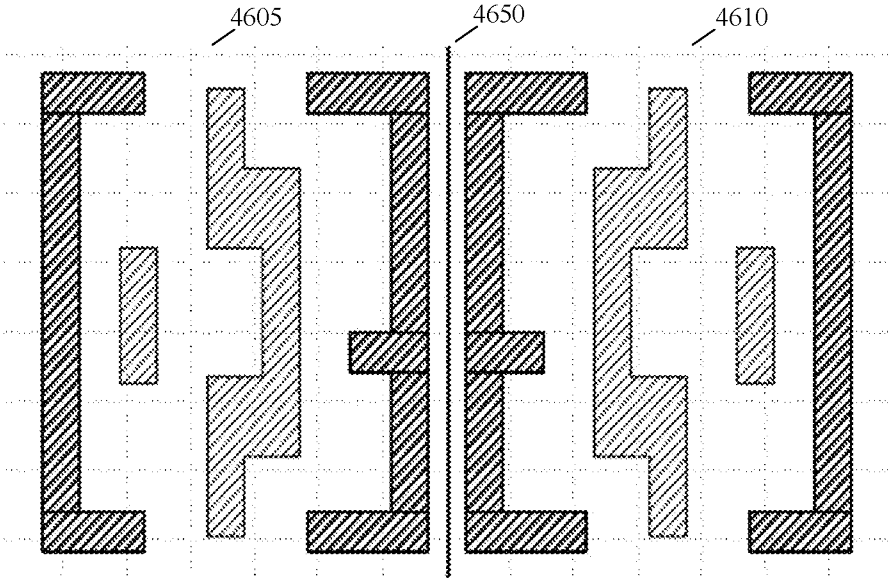

FIG. 46 illustrates the corresponding portion of the design 4600 itself. The boxed area 4550 corresponds to the area 4650 in FIG. 46. This area 4650 is at the abutment of two particular symmetrical cells 4605 and 4610, with back to back 'E' shaped polygons. FIG. 47 illustrates a zoomed-in view of the problematic area 4650 at the cell boundary, in order to show the problematic area in more detail. Here we can see that the back-to-back 'E' shaped polygons at the cell boundaries are placed too close to each other. Such placements may happen due to coloring conflicts, for example.

Figure 48:
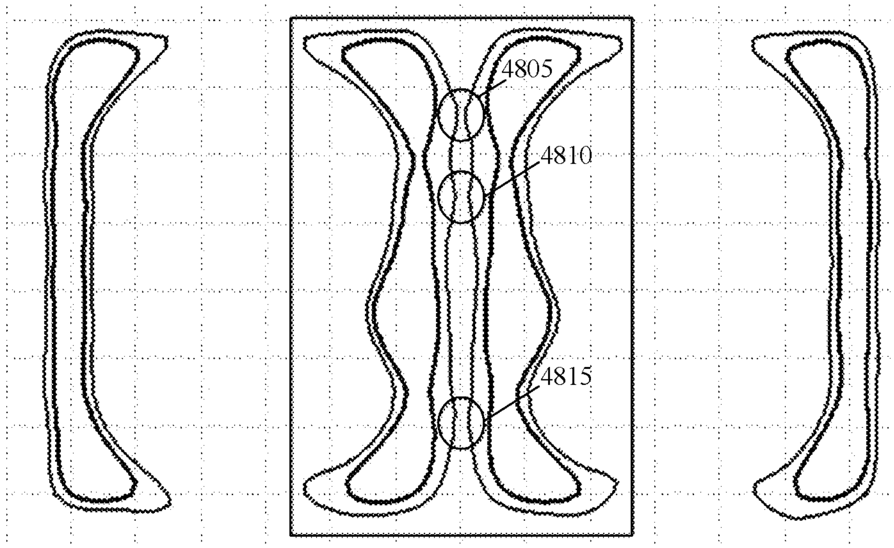

FIG. 48 illustrates the corresponding closeup of the manufactured wafer contours as determined rapidly by the trained neural network. In this figure, the three areas 4805, 4810 and 4815 have been circled, where the neural network-determined outer manufacturing contours are practically bridging.

Various approaches may be chosen to repair such hotspots, depending on the tools and methodologies used to create the original layout, and the nature of the layers and cells involved, etc. When the original layout has been created with place and route tools for example, it may be possible to instruct the tools to incrementally re-route portions of a design. This approach however can lead to sufficiently drastic changes so as to change circuit timing, and should therefore be done only as a last resort. Even re-routing for a design containing a bad placement (such as the design shown in FIG. 46) can fail to fix hotspots that are primarily placement-dependent. Re-running a placer may also be a way to fix the problem shown in FIG. 45, but will again lead to the need to re-route the newly re-placed design, and can lead to timing challenges once again.

More localized forms of hotspot repair, such as cell flipping and shifting, or surgical changes to individual polygons as performed in interactive editors, can result in a better solution, both fixing the hotspot, and making minimal changes to timing and/or parasitics. The interactive editing tool of some embodiments is designed to support such localized repair solutions. The layout designer can perform manual/interactive localized edits to repair the hotspot. For example, the performed edits can include editing instances of offending cells and/or their neighbors, such as interactively spacing offending cell instances further apart, flipping cell instances, or performing other edits (such as cell remastering combined with manual polygon editing).

Following these edits, the predicted manufacturing contours are generated by the tool by re-running the contour extraction via the trained neural network, using for example the contour button of the verification tool window described above by reference to FIGS. 5 and 6. The engineer tasked with fixing the hotspot may incrementally increase the cell spacing for example, and rapidly re-run the contour extraction, continuing in a tight edit, visualize, edit, visualize loop until the neural-network-determined contours are sufficiently far apart that bridging is no longer an issue.

Figure 49:
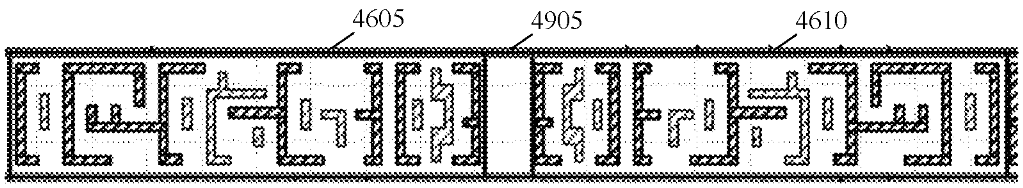

Alternatively, as shown in FIG. 49, the designer may insert a predefined spacer cell 4905 from a cell library (e.g., standard cell libraries usually include one or more spacer cells for purposes such as this, among others). Here, the spacer cell is a narrow cell containing nothing other than the well and power rail areas. This cell has been inserted by the user between the two offending cell instances, thus separating the two back-to-back 'E' shaped polygons towards the center.

Figure 50:
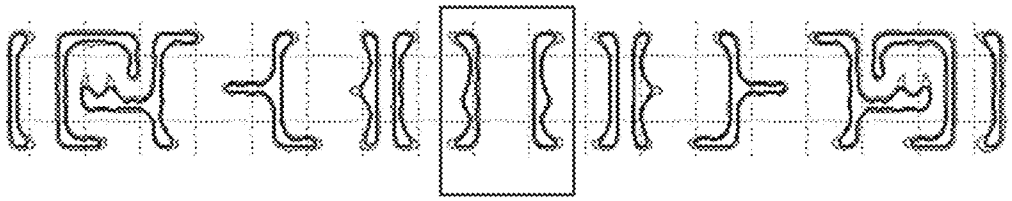
Figure 51:
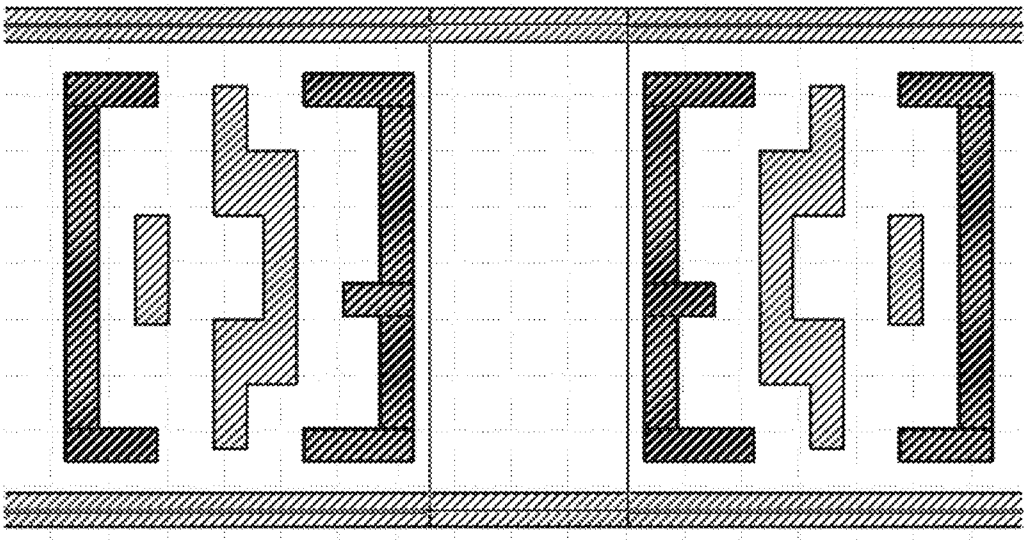
Figure 52:
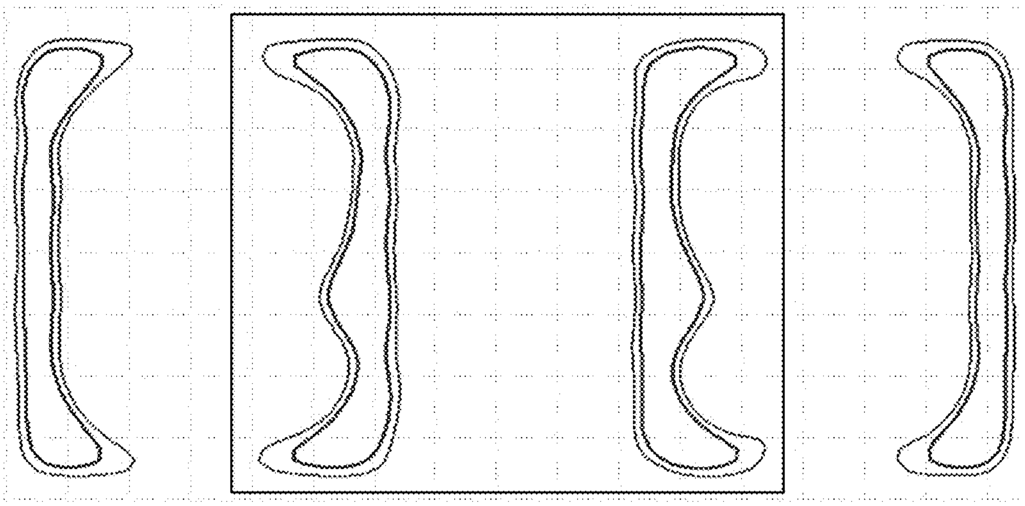

FIG. 50 illustrates a quick feedback that the editing tool provides regarding the new contours, as determined by its trained neural network. Thanks to the spacer cell, the contours for the two back-to-back 'E' shaped polygons toward the center are now more well behaved from a manufacturability standpoint. FIG. 51 illustrates a zoomed-in view of the spacer cell, while FIG. 52 illustrates a zoomed-in view of the neural-network determined manufactured wafer contours in the vicinity of the spacer cell. Clearly, there is no longer a chance of the outer contours being shorted together in this scenario, due to the large spacing between the corresponding design shapes.

The user may interactively rework the inter-cell routing connecting the cell instances, thus re-establishing the full connectivity, with the hotspot removed. The overall interactive-hotspot-fixing flow, as shown in FIG. 44, is again enabled in user-interaction timeframes (edit and visualization cycles of seconds or less) via the use of a trained neural network for contour prediction, along with the architecture as described by reference to FIGS. 17-21, one per process condition of interest and their accompanying description, allowing for maximum concurrency and amortization of startup overhead.

Figure 53:
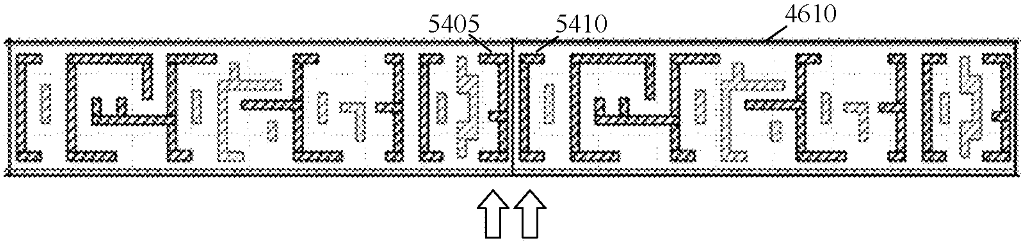

For the design of FIG. 46, the designer may wish to attempt another hotspot fix solution, simply by interactively flipping the right most of the two cell instances, as shown in FIG. 53. Here, the flipping of the rightmost cell instance means that the two former back to back 'E' shapes are now effectively replaced with an 'E' and 'C' shape respectively (the 'E' shape in the rightmost cell instance 4610 has now been moved all the way to the right of the figure).

Figure 54:
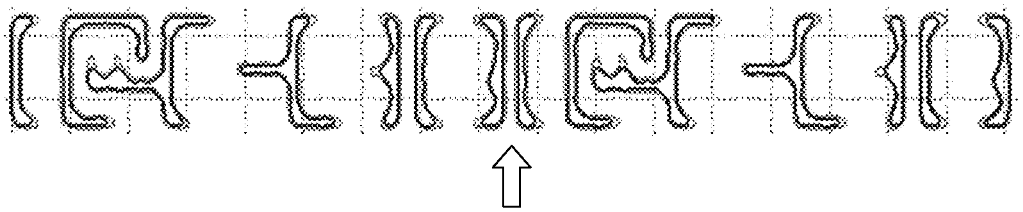

FIG. 54 illustrates the immediate feedback for the resulting contours that the editing tool provides in some embodiments. This feedback indicates that a simple cell flip of the rightmost cell instance such as this may be sufficient to resolve the issue, without introducing any extra space. The arrow in FIG. 54 identifies a larger space between the 'E' and 'C' shapes 5405 and 5410 than the space that exists between the back-to-back 'E' shapes in FIGS. 45 and 48.

Figure 55:
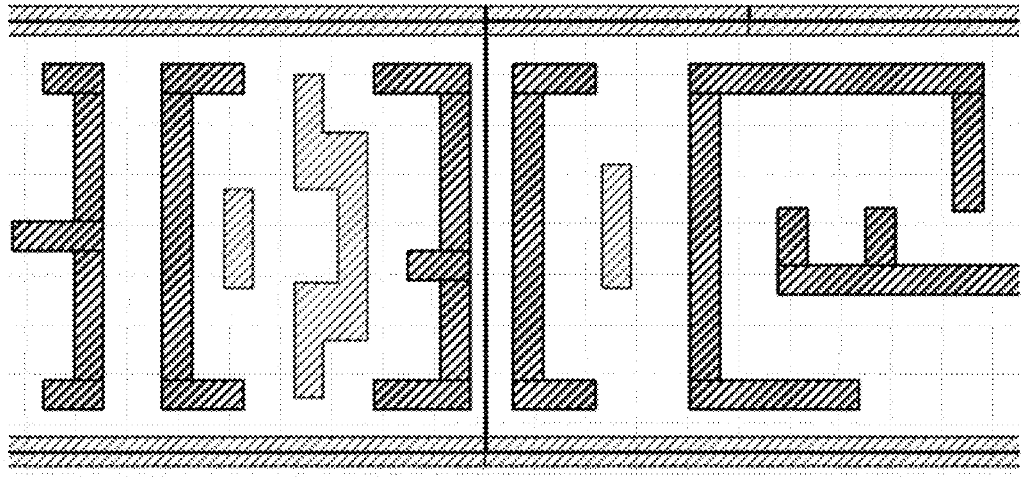
Figure 56:
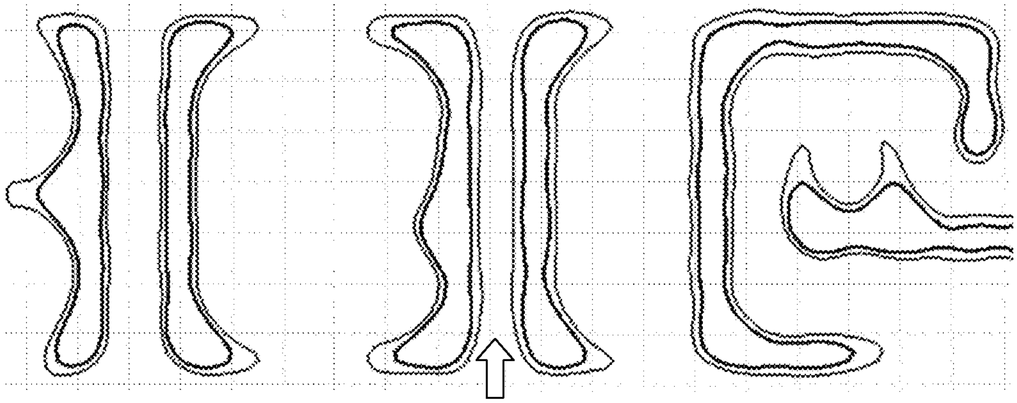
Figure 57:
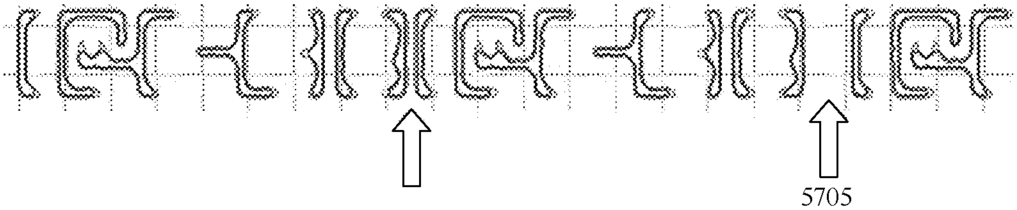

FIG. 55 illustrates a closeup of the area between the two cell instances of FIG. 53, while FIG. 56 illustrates a closeup of the corresponding contours at the area between the two cell instances. The arrow in FIG. 56 shows a clear separation of the outer contours between the backward 'E' shape on the leftmost cell, and the 'C' shape on the rightmost cell. However, since the rightmost cell has been flipped, it is conceivable that a new hotspot may have been introduced between it, and its neighbor to the right in turn. FIG. 57 shows how this can quickly be checked by zooming out the view, to see the polygons from the rightmost cell neighbor. As shown in FIG. 57, the cell boundary 5705 has no issues in this example.

As mentioned above, different embodiments use different types of machine-trained networks and train these networks differently. For instance, as mentioned above, the machine-trained networks in some embodiments are neural networks. Some embodiments train a neural network to produce a predicted physical design layout from a current physical design layout by using many input data sets with known output data sets to train the configurable parameters (e.g., the weight values) of the neural network. In some embodiments, the input/output sets are portions of IC designs for a particular IC manufacturing process (e.g., X nm designs) with the input portions being portions of physical designs produced by physical design tools, and output portions being the corresponding wafer simulation portion or circuit portion that is produced for the physical-design portion. Several examples of such an approach were described above, e.g., by reference to FIGS. 11H and 11I. Another more detailed example of such an approach will be described below by reference to FIG. 58.

Some embodiments put the machine trained neural networks through learning processes that account for (1) manufacturing variations in one or more manufacturing parameters (such as dosage and focus depth) and/or (2) neighborhood variations that account for different possible components that neighbor input component patterns that are part of the inputs used for the learning processes. To train the neural network, some embodiments feed each known input through the neural network to produce a predicted output, and then compare this predicted output to the known output of the input to identify a set of one or more error values. The error values for a group of known inputs/outputs are then used to compute a loss function, which is then back propagated through the neural network to train the configurable parameters (e.g., the weight values) of the neural network. Once trained by processing a large number of known inputs/outputs, the neural network can then be used to facilitate compaction operations, e.g., according to any of the above-discussed operations that were described by reference to the above-described embodiments.

Figure 58:
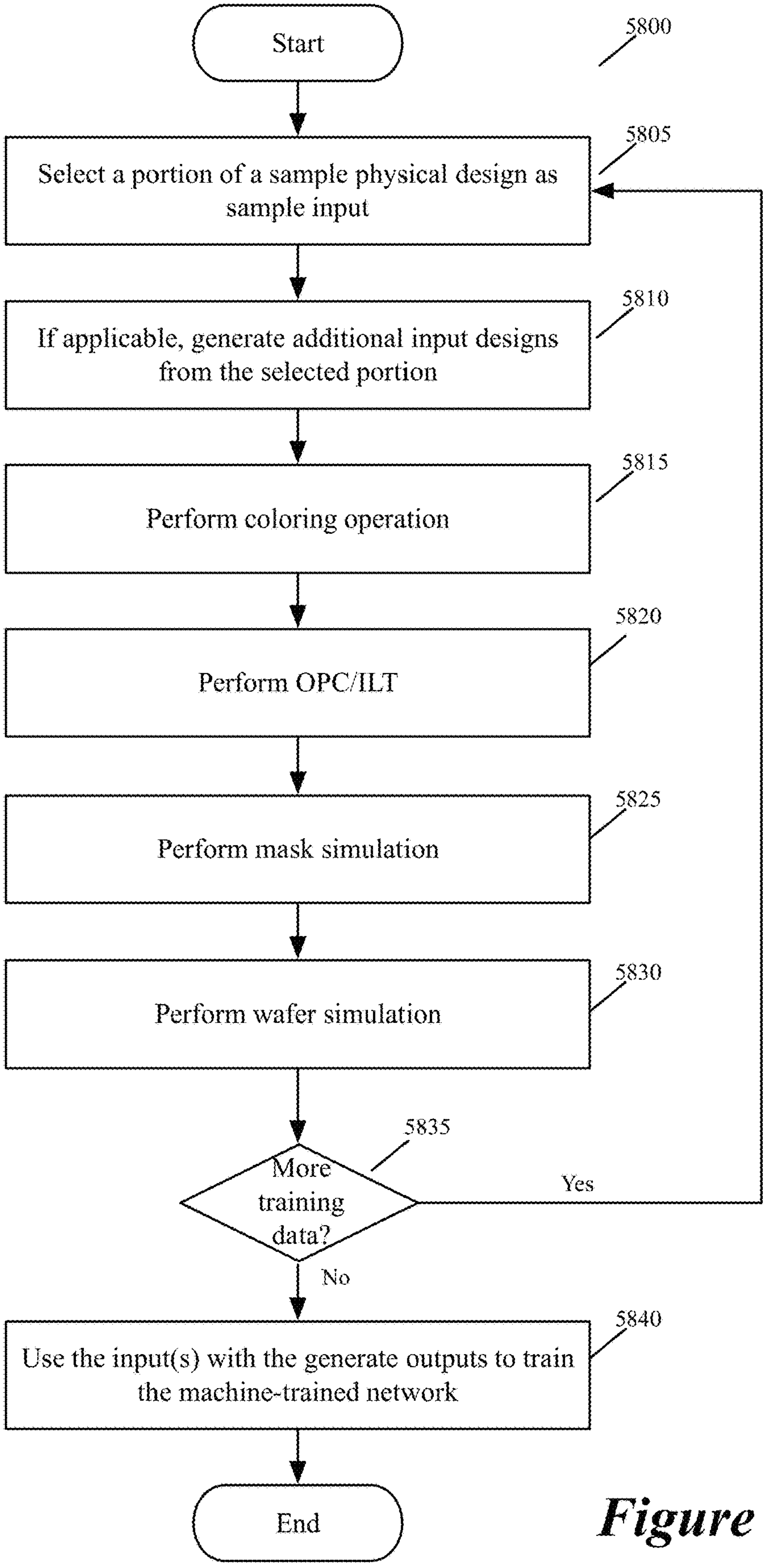
FIG. 58 illustrates a process that some embodiments use to produce training data to train one or more neural networks to produce multi-contour output shapes for input shapes of an IC design or a portion of an IC design.

FIG. 58 illustrates a process 5800 that some embodiments use to produce training data to train one or more neural networks to produce multi-contour output shapes for input shapes of an IC design or a portion of an IC design. The training data includes known input IC design portions, and simulated output IC design portions produced by the process 5800. This process is referred to as a digital twin process as it simulates the manufacturing process, and produces predicted manufactured wafer shapes that are the digital twin of the actual manufactured wafer shapes.

The process 5800 initially selects (at 5805) a portion of a sample physical design of an integrated circuit as an input pattern for which it needs to generate one or more predicted output patterns. In some embodiments, the process 5800 uses multiple different sample physical designs from which it extracts sample input patterns at 5805. The extracted input pattern is part of a previously defined physical design, which may or may not have been used to manufacture an IC on a substrate (such as a silicon wafer). This pattern can include manufacturable shapes for circuit components (such as logic gates, transistors, metal layers, and other items that are required to be found in an IC's physical design). The physical design may be rectilinear, piecewise linear, partially curvilinear, or completely curvilinear. Curvilinear patterns (each with at least one curvilinear segment) are extremely compute-intensive, and thus being able to optimize patterns by calculating the cumulative effects of variations from multiple manufacturing stages is very valuable for curvilinear patterns.

At 5810, if applicable for the selected physical design input pattern, the process 5800 generates several possible nearby patterns that neighbor the physical design input pattern selected at 5805. In some embodiments, the physical design pattern selected at 5810 might be used in one or more subsequent IC designs and end up with different neighboring patterns in these subsequent IC designs. Some embodiments synthesize the neighborhood variations by using Monte Carlo techniques that enumerate several possible solutions.

In some embodiments, the physical design pattern selected at 5810 along with each of its synthesized neighborhood variations represents a different input for which the process 5800 produces a different output for the training process (also called the learning process) of a machine-trained network. In other embodiments, the selected physical design input is just one input datum, and its neighborhood variations are just used to identify contour variations during subsequent simulation operations of the process 5800.

One example where it is useful to identify such neighborhood variations is when the input pattern is part of a standard cell design, which can be randomly placed in all the possible neighborhoods it might eventually end up in, i.e., surrounded by the various neighboring cells it is likely to be surrounded by in subsequent circuit designs. In some embodiments, the selected portion of the physical design pattern is an instance of the physical design pattern and the generated nearby patterns include possible neighborhoods of this instance. Instances of the cell of interest, in its various legal orientations, would therefore be placed alongside various orientations of various neighbor cells, with instances of those various neighbors placed above/below, to left of or to right of, and with various offsets in the placements. In some embodiments, the selected input pattern is the entire design of a standard cell design containing several standard cells, and the possible neighborhoods includes all legal orientations of the standard cells.

At 5815, the process performs a coloring operation that separates an input pattern (e.g., the pattern selected at 5805 or a pattern generated at 5810 for the selected pattern) into multiple mask layers. In the coloring operation, each feature of the input pattern on a reticle layer is colored to reflect the assignment of a feature to a particular mask layer. After the colorization operation, the process 5800 performs (at 5820) an optical proximity correction (OPC) operation to produce one or more possible sets of mask designs, with each set of mask design corresponding to the input pattern selected at 5805 or a possible neighborhood generated at 5810.

For the selected input pattern, the generated mask designs in some embodiments include a nominal mask design with variation. In some embodiments, the possible mask designs produced at 5820 may be combined to create the nominal mask design with variations. Conventionally, the nominal mask design can be determined using a nominal dose, such as 1.0 and calculating a nominal contour of a mask design at a threshold, such as 0.5. In some embodiments, the nominal contour of the mask design is calculated from several possible mask designs. The variation may be calculated for all possible neighborhoods generated at 5810.

In some embodiment, the OPC operation includes an ILT (inverse lithography technology) operation. The ILT operation in some embodiments creates ideal curvilinear ILT patterns, while in other embodiments, the ILT operation rectilinearizes the curvilinear patterns. OPC features or ILT patterns for the same physical design pattern will vary from neighborhood to neighborhood. Some embodiments calculate several possible sets of mask images from several possible mask designs in each of the many possible neighborhoods. In some embodiments, a nominal mask design is calculated from the calculated OPC features or ILT patterns in many possible neighborhoods.

The process 5800 performs (at 5825) a mask simulation operation to produce mask data preparation (MDP), which prepares the mask design for a mask writer. This operation in some embodiments includes "fracturing" the data into trapezoids, rectangles, or triangles. This operation also includes in some embodiments Mask Process Correction (MPC), which geometrically modifies the shapes and/or assigns dose to the shapes to make the resulting shapes on the mask closer to the desired shape. MDP may use as input the possible mask designs or the results of MPC. MPC may be performed as part of a fracturing or other MDP operation. Other corrections may also be performed as part of fracturing or other MDP operations, the possible corrections including: forward scattering, resist diffusion, Coulomb effect, etching, backward scattering, fogging, loading, resist charging, and EUV midrange scattering. Pixel-level dose correction (PLDC) may also be applied during the mask simulation operation. In other embodiments, a VSB (variable shaped beam) shot list or exposure information for multi-beam may be generated to produce several possible mask images from the possible mask designs. In some embodiments, a set of VSB shots is generated for a calculated mask pattern in the plurality of calculated mask patterns. In some embodiments, MPC and/or MDP may be performed on the possible mask designs.

In some embodiments, the mask simulation operation calculates several possible mask images by using charged particle beam simulation. Effects that may be simulated include forward scattering, backward scattering, resist diffusion, Coulomb effect, fogging, loading and resist charging. Mask simulation in some embodiments also includes mask process simulation where the effects of various post-exposure processes are calculated. These post-exposure processes may include resist baking, resist development and etch. When charged particle beam simulation is performed for the mask on any given layer, the simulation may be performed over a range of process variations to establish manufacturability contours for the mask itself. The contours may extend from a nominal contour, where the nominal contour may be based on a pattern produced at a particular resist threshold, for example, at a threshold of 0.5. In some embodiments, calculating a given percentage difference in exposure dose, for example, +/−10% dose variation creates a mask image with variation for displaying in a viewport. These variations include upper and lower bounds of a process variation band surrounding the nominal contour. In some embodiments, the plus and minus variations may differ from each other, for example +10% and −8%. Charged particle beam simulation and mask process simulation are performed separately from each other.

After the mask simulation, the process 5800 performs (at 5830) a wafer simulation operation that calculates possible IC patterns that would result from using the generated masks. For the input pattern selected at 5805, the generated IC pattern represents an output pattern or a range of output patterns (when the produced shapes have multiple contours to account for process variations and manufacturing parameter variations). The selected input pattern and the generated output pattern represent a known input with a known output that are used to train the machine-trained neural network in some embodiments. Once trained, the neural network can then be used during compaction to assist in the compaction operations in the manner described above.

In some embodiments, the wafer simulation operation (at 5830) includes a lithography simulation that uses the calculated mask images. The operation at 5830 calculates several possible patterns on the substrate from the plurality of mask images. Each pattern on the substrate in some embodiments corresponds to a set of manufacturing variation parameters. Calculating a pattern from a calculated mask image is described in U.S. Pat. No. 8,719,739, entitled "Method and System for Forming Patterns Using Charged Particle Beam Lithography", which is incorporated herein by reference.

The possible patterns on the IC may be combined to create a nominal IC pattern with variation. In some embodiments, sources of IC pattern variation will include some given variation in exposure (dose) in combination with some given variation in depth of focus, for example +/−10% in exposure, and +/−30 nm in depth of focus. In some embodiments, the plus and minus variations may differ from each other, for example +5%/−7% and 30 nm/−28 nm. Conventionally, statistical methods are used to create a 3-sigma variation from the nominal contour. The variation comprises a lower bound 3-sigma less than the nominal contour for a minimum, and an upper bound 3-sigma greater than the nominal contour for a maximum. Instead of calculating the 3-sigma variation extending from the nominal contour, some embodiments create a mask image with variation by combining several mask images including process variation bands with a lower bound and an upper bound.

In some embodiments, the patterns can be formed on a wafer using an optical lithographic process using the mask image with variation. The wafer simulation operation in some embodiments includes a wafer process simulation on the patterns. Wafer process simulation in some embodiments include simulation of resist baking, resist development and etch. The process 5800 in some embodiments performs the lithography simulation and wafer process simulation as separate steps, optionally with each step accounting for process variations.

In some embodiments, the process 5800 will take into account variations of different operations in a statistically cumulative manner, such that the process accounts for variation from previous operations in subsequent operations. In this manner, the patterns in the subsequent operations will have incorporated not only variations in determining possible patterns on a substrate but also variations in mask process and mask design.

After the wafer simulation, the process 5800 in some embodiments calculates a process variation band from the possible patterns generated from the wafer simulation. To make the calculations of the many possible combinations of variations more efficient, the variations may be accumulated using insights in how certain variations and pattern parameters might affect each other. For instance, rather than simply feeding the minimum and maximum 3-sigma values from one step into the next, a worst case variation that is fed into the next step could take into account the distance of one pattern from another. This is because features that are closer in proximity to each other affect each other more than features that are farther apart. Because of the impact these variations have on design performance and manufacturing reliability, it may be desirable to allow designers to visualize the effects of the different variations in the context of an actual circuit design. Visualizing the effects of the statistically cumulative variation as predicted on the substrate can be shown after calculating the variation band, or by visualizing the effects of the different variations in each step.

At 5835, the process determines whether it has generated a sufficient number of known input and output patterns. If not, the process returns to 5805 to select another input pattern from a previously defined physical design, and then repeats its operations 5810-5830 to produce the simulated output pattern for this input pattern. As mentioned above, the selected input patterns and their corresponding generated output patterns represent known inputs with known outputs that are used to train the machine-trained neural network in some embodiments.

Calculating a pattern to be manufactured on a substrate by calculating several wafer simulation patterns from several calculated mask images, which are calculated from several mask designs, can take significant time. Accordingly, some embodiments use the process 5800 of FIG. 58 to generate numerous sets of known input/output patterns, and then use these known input/output patterns (at 5840) to train a neural network so that this neural network can later be used to quickly produce predicted output patterns from input patterns that are examined during compaction operations.

To train the neural network, some embodiments feed each known input through the neural network to produce a predicted output, and then compare this predicted output to the known output of the input to identify a set of one or more error values. The error values for a group of known inputs/outputs are then used to compute a loss function, which is then back propagated through the neural network to train the configurable parameters (e.g., the weight values) of the neural network. Once trained by processing a large number of known inputs/outputs, the neural network can then be used to facilitate compaction operations.

In some embodiment, the compaction tools perform some or all of their operations and define their designs in the pixel domain rather than contour domain. This is because pixel-based designs are ideal for analysis by machine trained networks, because these networks are often optimized to process pixel-based data sets rather than contour-based descriptions. Pixel-based designs also make the representation and processing of curvilinear shapes in the design easier. Hence, by expressing the results of a compaction operation in the pixel domain instead of the contour domain, some embodiments make it much easier for the compaction tools to use machine trained networks and to quickly process curvilinear shapes in the design.

Similarly, to facilitate the creation of their masks, some embodiments use the pixel domain for performing the processing needed to generate their masks, because curvilinear masks manipulated in the pixel domain take the same amount of time as any Manhattan design. Also, this processing is often performed on GPUs in the pixel domain. The vast power of GPU processing power for this type of pixel manipulations is ideal because GPUs are single-instruction multiple-data (SIMD) machines that excel in the pixel domain, as a single instruction stream can be applied to a large number of pixels uniformly. The SIMD architecture can be relied upon to produce a much higher computing throughput for processing physical designs and masks with curvilinear shapes.

Contours (also called geometries) are usually expressed as piecewise linear polygons, but sometimes expressed with infinite-resolution curvilinear formats like splines. Manipulating contours is a mathematical dual of manipulating pixel based data, given a resolution limit. A mathematical dual means that, functionally, anything that can be done in one can be done in the other. However, when runtime performance or efficiency is taken into account, given a particular accuracy of result as the target, the computational behavior of one can be quite different from the other.

In general, manipulating shapes that are mostly large rectangles would be fast in contour domain (i.e., geometry domain), while manipulating shapes that are largely polygonal or curvilinear with higher vertex density would be faster in the pixel domain. In the pixel domain, pixel size is defined naturally from the resolution limit. Once pixel size is defined, it does not matter whether the shapes being processed are curvilinear or rectilinear. The computation either way is constant time. In contour based manipulation, this is not the case as computation time depends on number of edge count of the piecewise linear that is used to represent the contours. Also, given that much of the data processing these data is performed by high powered GPUs, pixel-based analysis is preferable to contour-based analysis as GPUs are SIMD machines that excel in the pixel domain.

Many of the above-described features and applications are implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In this specification, the term “software” is meant to include firmware residing in read-only memory or applications stored in magnetic storage, which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 59:
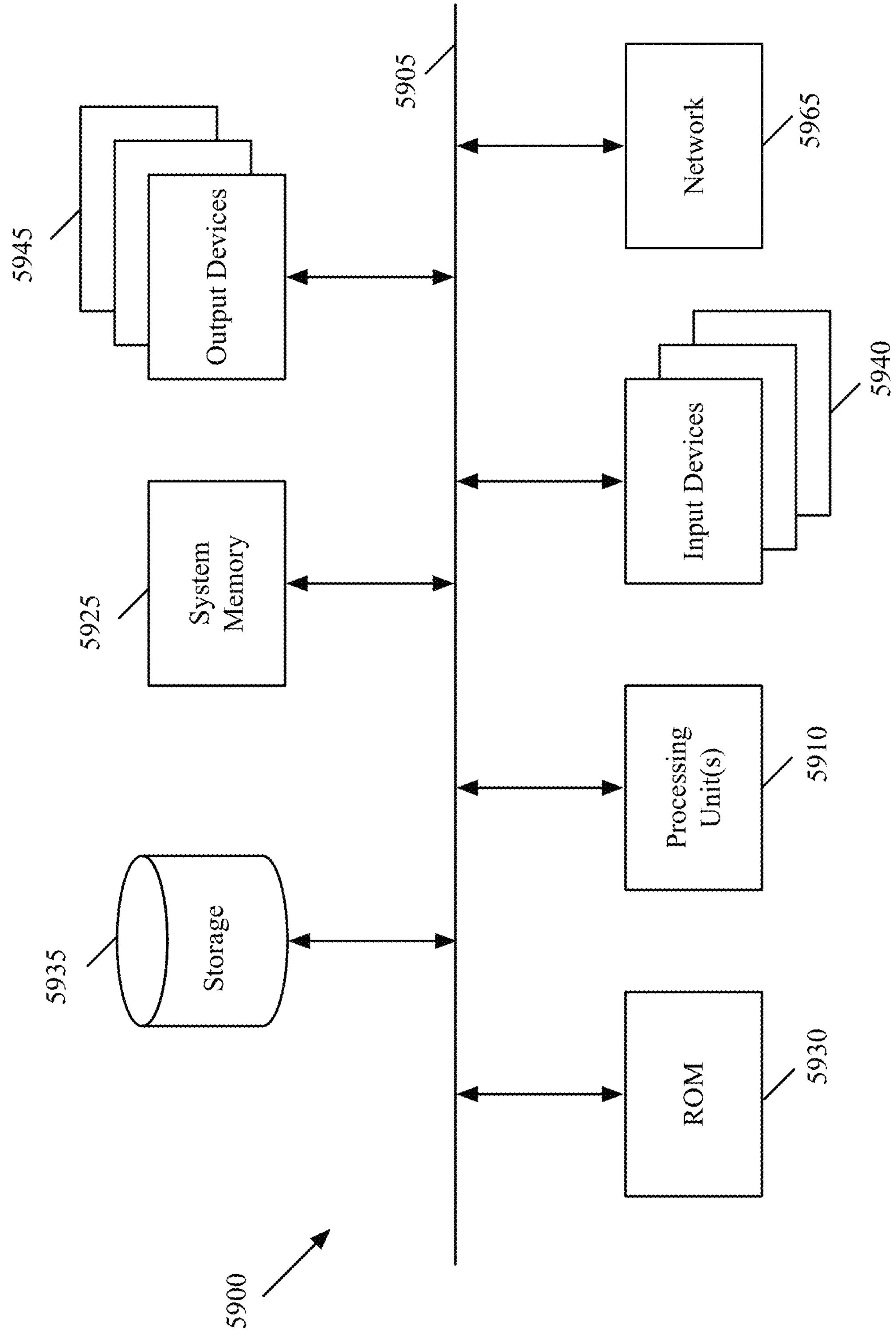
FIG. 59 conceptually illustrates a computer system with which some embodiments of the invention are implemented.

FIG. 59 conceptually illustrates an electronic system 5900 with which some embodiments of the invention are implemented. The electronic system 5900 may be a computer (e.g., a desktop computer, personal computer, tablet computer, server computer, mainframe, a blade computer etc.), phone, PDA, or any other sort of electronic device. As shown, the electronic system includes various types of computer readable media and interfaces for various other types of computer readable media. Specifically, the electronic system 5900 includes a bus 5905, processing unit(s) 5910, a system memory 5925, a read-only memory 5930, a permanent storage device 5935, input devices 5940, and output devices 5945.

The bus 5905 collectively represents all system, peripheral, and chipset buses that communicatively connect the numerous internal devices of the electronic system 5900. For instance, the bus 5905 communicatively connects the processing unit(s) 5910 with the read-only memory (ROM) 5930, the system memory 5925, and the permanent storage device 5935. From these various memory units, the processing unit(s) 5910 retrieve instructions to execute and data to process in order to execute the processes of the invention. The processing unit(s) may be a single processor or a multi-core processor in different embodiments.

The ROM 5930 stores static data and instructions that are needed by the processing unit(s) 5910 and other modules of the electronic system. The permanent storage device 5935, on the other hand, is a read-and-write memory device. This device is a non-volatile memory unit that stores instructions and data even when the electronic system 5900 is off. Some embodiments of the invention use a mass-storage device (such as a magnetic or optical disk and its corresponding disk drive) as the permanent storage device 5935.

Other embodiments use a removable storage device (such as a floppy disk, flash drive, etc.) as the permanent storage device. Like the permanent storage device 5935, the system memory 5925 is a read-and-write memory device. However, unlike storage device 5935, the system memory is a volatile read-and-write memory, such a random access memory. The system memory stores some of the instructions and data that the processor needs at runtime. In some embodiments, the invention's processes are stored in the system memory 5925, the permanent storage device 5935, and/or the read-only memory 5930. From these various memory units, the processing unit(s) 5910 retrieve instructions to execute and data to process in order to execute the processes of some embodiments.

The bus 5905 also connects to the input and output devices 5940 and 5945. The input devices enable the user to communicate information and select commands to the electronic system. The input devices 5940 include alphanumeric keyboards and pointing devices (also called "cursor control devices"). The output devices 5945 display images generated by the electronic system. The output devices include printers and display devices, such as cathode ray tubes (CRT) or liquid crystal displays (LCD). Some embodiments include devices such as a touchscreen that function as both input and output devices.

Finally, as shown in FIG. 59, bus 5905 also couples electronic system 5900 to a network 5965 through a network adapter (not shown). In this manner, the computer can be a part of a network of computers (such as a local area network ("LAN"), a wide area network ("WAN"), or an Intranet, or a network of networks, such as the Internet. Any or all components of electronic system 5900 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself.

As used in this specification, the terms "computer", "server", "processor", and "memory" all refer to electronic or other technological devices. These terms exclude people or groups of people. For the purposes of the specification, the terms display or displaying means displaying on an electronic device. As used in this specification, the terms "computer readable medium," "computer readable media," and "machine readable medium" are entirely restricted to tangible, physical objects that store information in a form that is readable by a computer. These terms exclude any wireless signals, wired download signals, and any other ephemeral or transitory signals.

While the invention has been described with reference to numerous specific details, one of ordinary skill in the art will recognize that the invention can be embodied in other specific forms without departing from the spirit of the invention. For instance, a number of the figures conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Therefore, one of ordinary skill in the art would understand that the invention is not to be limited by the foregoing illustrative details, but rather is to be defined by the appended claims.

The invention claimed is:

1. A method of compacting an integrated circuit (IC) design layout, the method comprising:
- in a graphical user interface (GUI) that is used by a circuit designer to perform compaction operations used to compact the IC design layout that defines a design of the IC:
  - presenting a first display area for displaying at least a portion of the IC design layout;
  - presenting a contour control that when selected produces, in the first display area, a multi-contour display for each of a plurality of components of the IC design layout, wherein each multi-contour display for each component represents a range of predicted manufactured shapes for the component and has a plurality of contours corresponding to a plurality of variations of a parameter associated with a manufacturing process that is used to produce an IC from the IC design layout; and
  - presenting a set of compaction-parameter controls to specify an amount of compaction that should be applied to the IC design layout during a compaction operation in order to reduce an area of the design layout, wherein when the contour control is selected during the compaction operation the first display area displays either the multi-contour display for each of the plurality of components prior to the compaction operation or the multi-contour display for each of the plurality of components after the compaction operation, in order to visualize the predicted manufactured shapes resulting from the compaction operation.

2. The method of claim 1 further comprising presenting multi-contour displays in the first display area and providing a set of tools to allow the circuit designer to perform rule checks after the compaction operation with respect to one or more multi-contour displays of one or more components in order to determine whether the IC design layout violates a set of design rules.

3. The method of claim 2, wherein presenting the multi-contour displays comprises superimposing the multi-contour display of each component over a display of the component that (i) is produced by an IC design tool and (ii) does not account for variations in the parameter associated with the manufacturing process.

4. The method of claim 3 further comprising performing the compaction operation on the IC design layout in response to a modified compaction parameter received through the set of compaction-parameter controls.

5. The method of claim 1, wherein the components comprise routes in the IC design layout and a plurality of the multi-contour displays comprise a plurality of ranges of predicted manufactured shapes of wires produced on the IC based on the routes.

6. The method of claim 1 further comprising using a machine-trained network to produce the multi-contour displays, the plurality of contours for a particular component comprising a first set of contours corresponding to a first variation of the manufacturing process parameter and a second set of contours corresponding to a second variation of the manufacturing process parameter.

7. The method of claim 6, wherein using the machine-trained network comprises using the machine-trained network to produce a plurality of pixel-based images representing the design layout after the manufacturing process has been performed in order to manufacture a semiconductor die based on the design layout, the method further comprising generating, from each pixel-based image, the plurality of contours for each component.

8. The method of claim 6, wherein the machine-trained network is a neural network.

9. The method of claim 1, wherein the manufacturing process is a mask making process and the parameter relates to dosage used during mask making process.

10. The method of claim 1, wherein the manufacturing process is a wafer production process and the parameter relates to one of depth of focus and strength of exposure used during the wafer production process.

11. The method of claim 1, wherein the plurality of contours comprises a first set of contours relating to a maximum variation of the manufacturing process parameter and a second set of contours relating to a minimum variation of the manufacturing process parameter.

12. The method of claim 11, wherein the plurality of contours further comprises a third set of contours relating to a nominal variation of the manufacturing process parameter.

13. The method of claim 1, wherein the plurality of contours comprises a first set of contours relating to a maximum variation of the manufacturing process parameter and a second set of contours relating to a nominal variation of the manufacturing process parameter.

14. A non-transitory machine readable medium storing a program that when executed by one or more processing units of a computer compacts an integrated circuit (IC) design layout, the program comprising sets of instructions for:

presenting the IC design layout in a graphical user interface (GUI) that is used by a circuit designer to perform compaction operations used to compact the IC design layout that defines a design of the IC;

providing a contour control that when selected produces a multi-contour display for each of a plurality of components of the IC design layout, wherein each multi-contour display for each component represents a range of predicted manufactured shapes for the component and has a plurality of contours corresponding to a plurality of variations of a parameter associated with a manufacturing process that is used to produce an IC from the IC design layout; and providing a set of compaction-parameter controls in the GUI to specify an amount of compaction that should be applied to the IC design layout in order to reduce a size of the design layout, wherein when the contour control is selected during the compaction operation the GUI displays either the multi-contour display for each of the plurality of components prior to the compaction operation or the multi-contour display for each of the plurality of components after the compaction operation, in order to visualize the predicted manufactured shapes resulting from the compaction operation.

15. The non-transitory machine readable medium of claim 14, wherein the program further comprises sets of instructions for:

presenting multi-contour displays in the first display area; and providing a set of tools to allow the circuit designer to perform rule checks after the compaction operation with respect to one or more multi-contour displays of one or more components in order to determine whether the IC design layout violates a set of design rules.

16. The non-transitory machine readable medium of claim 15, wherein the set of instructions for presenting the multi-contour displays comprises a set of instructions for superimposing the multi-contour display of each component over a display of the component that (i) is produced by an IC design tool and (ii) does not account for variations in the parameter associated with the manufacturing process.

17. The non-transitory machine readable medium of claim 16, wherein the program further comprises a set of instructions for performing the compaction operation on the IC design layout in response to a modified compaction parameter received through the set of compaction-parameter controls.

18. The non-transitory machine readable medium of claim 14, wherein the components comprise routes in the IC design layout and a plurality of the multi-contour displays comprise a plurality of ranges of predicted manufactured shapes of wires produced on the IC based on the routes.

19. The non-transitory machine readable medium of claim 14, wherein the program further comprises a set of instructions for using a machine-trained network to produce the multi-contour displays, the plurality of contours for a particular component comprising a first set of contours corresponding to a first variation of the manufacturing process parameter and a second set of contours corresponding to a second variation of the manufacturing process parameter.

20. The non-transitory machine readable medium of claim 19, wherein the set of instructions for using the machine-trained network comprises a set of instructions for using the machine-trained network to produce a plurality of pixel-based images representing the design layout after the manufacturing process has been performed in order to manufacture a semiconductor die based on the design layout, the program further comprising a set of instructions for generating, from each pixel-based image, the plurality of contours for each component.

* * * * *